United States Patent
Kim et al.

(10) Patent No.: US 10,217,746 B1
(45) Date of Patent: *Feb. 26, 2019

(54) THREE-DIMENSIONAL MEMORY DEVICE HAVING L-SHAPED WORD LINES AND A SUPPORT STRUCTURE AND METHODS OF MAKING THE SAME

(71) Applicant: SANDISK TECHNOLOGIES LLC, Plano, TX (US)

(72) Inventors: Tae-Kyung Kim, San Jose, CA (US); Raghuveer S. Makala, Campbell, CA (US); Yanli Zhang, San Jose, CA (US); Hiroyuki Kinoshita, San Jose, CA (US); Daxin Mao, Cupertino, CA (US); Jixin Yu, San Jose, CA (US); Yiyang Gong, San Jose, CA (US); Kazuto Watanabe, Yokkaichi (JP); Michiaki Sano, Yokkaichi (JP); Haruki Urata, Yokkaichi (JP); Akira Takahashi, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/867,881

(22) Filed: Jan. 11, 2018

Related U.S. Application Data

(63) Continuation-in-part of application No. 15/826,796, filed on Nov. 30, 2017.

(51) Int. Cl.
*H01L 27/105* (2006.01)
*H01L 21/768* (2006.01)
(Continued)

(52) U.S. Cl.
CPC .... *H01L 27/1052* (2013.01); *H01L 21/76895* (2013.01); *H01L 23/535* (2013.01);
(Continued)

(58) Field of Classification Search
CPC ............... H01L 27/281; H01L 27/1052; H01L 27/11524; H01L 27/11578;
(Continued)

(56) References Cited

U.S. PATENT DOCUMENTS

| | | |
|---|---|---|
| 5,915,167 A | 6/1999 | Leedy |
| 7,936,004 B2 | 5/2011 | Kito et al. |

(Continued)

FOREIGN PATENT DOCUMENTS

| | | |
|---|---|---|
| JP | 2011049561 A | 3/2011 |
| KR | 20100109745 A | 10/2010 |
| KR | 20110021444 A | 3/2011 |

OTHER PUBLICATIONS

Office Communication, Non-final Office Action for U.S. Appl. No. 15/451,773, dated Mar. 7, 2017, 23 pages.
(Continued)

*Primary Examiner* — Mohsen Ahmadi
(74) *Attorney, Agent, or Firm* — The Marbury Law Group PLLC

(57) ABSTRACT

A three-dimensional memory device includes a first alternating stack of first insulating layers and first electrically conductive layers located over a top surface of a substrate, such that each of the first insulating layers and the first electrically conductive layers includes a respective horizontally-extending portion and a respective non-horizontally-extending portion, memory stack structures extending through a memory array region of the first alternating stack that includes the horizontally-extending portions of the first electrically conductive layers, such that each of the memory
(Continued)

stack structures comprises a memory film and a vertical semiconductor channel, a mesa structure located over the substrate, such that each respective non-horizontally-extending portion of the first insulating layers and the first electrically conductive layers is located over a sidewall of the mesa structure, and contact structures that contact a respective one of the non-horizontally-extending portions of the first electrically conductive layers.

12 Claims, 58 Drawing Sheets

(51) Int. Cl.
  *H01L 27/24* (2006.01)
  *H01L 23/535* (2006.01)
  *H01L 45/00* (2006.01)
(52) U.S. Cl.
  CPC ........ *H01L 27/249* (2013.01); *H01L 27/2409* (2013.01); *H01L 27/2427* (2013.01); *H01L 27/2454* (2013.01); *H01L 45/1675* (2013.01)
(58) Field of Classification Search
  CPC ........... H01L 27/11529; H01L 27/1157; H01L 27/11514; H01L 27/11551; H01L 27/11568; H01L 27/11597; H01L 27/2454; H01L 27/2409; H01L 27/2427; H01L 45/1675
  See application file for complete search history.

(56) References Cited

U.S. PATENT DOCUMENTS

| | | | |
|---|---|---|---|
| 7,952,136 B2 | 5/2011 | Kito et al. | |
| 8,187,932 B2 | 5/2012 | Nquyen et al. | |
| 8,363,481 B2 | 1/2013 | Kidoh et al. | |
| 8,394,716 B2 | 3/2013 | Hwang et al. | |
| 8,520,425 B2 | 8/2013 | Xiao et al. | |
| 8,587,052 B2 | 11/2013 | Yun et al. | |
| 8,592,912 B2 | 11/2013 | Hwang et al. | |
| 8,884,357 B2 | 11/2014 | Wang et al. | |
| 8,946,023 B2 | 2/2015 | Makala et al. | |
| 8,981,567 B2 | 3/2015 | Hu et al. | |
| 9,165,774 B2 | 10/2015 | Oh et al. | |
| 9,196,628 B1 | 11/2015 | Chen | |
| 9,230,987 B2 | 1/2016 | Pachamuthu et al. | |
| 9,356,034 B1 | 5/2016 | Yada et al. | |
| 9,443,907 B2 * | 9/2016 | Rabkin | H01L 21/02403 |
| 9,478,558 B2 * | 10/2016 | Koka | H01L 27/11582 |
| 9,502,332 B2 | 11/2016 | Lim et al. | |
| 9,559,110 B2 * | 1/2017 | Lee | G11C 16/3427 |
| 9,716,062 B2 | 7/2017 | Yada et al. | |
| 9,806,093 B2 | 10/2017 | Toyama et al. | |
| 9,818,693 B2 | 11/2017 | Toyama et al. | |
| 9,818,759 B2 | 11/2017 | Kai et al. | |
| 9,984,963 B2 * | 5/2018 | Peri | H01L 23/5226 |
| 2008/0099819 A1 | 5/2008 | Kito et al. | |
| 2008/0149913 A1 | 6/2008 | Tanaka et al. | |
| 2008/0265238 A1 * | 10/2008 | Chen | H01L 45/06 257/3 |
| 2009/0230449 A1 | 9/2009 | Sakaguchi et al. | |
| 2010/0090188 A1 | 4/2010 | Futatsuyama | |
| 2010/0254191 A1 | 10/2010 | Son et al. | |
| 2010/0270529 A1 * | 10/2010 | Lung | G11C 13/0004 257/4 |
| 2011/0037045 A1 * | 2/2011 | Fukumizu | H01L 27/101 257/3 |
| 2011/0204420 A1 | 8/2011 | Kim et al. | |
| 2011/0316072 A1 | 12/2011 | Lee | |
| 2012/0112264 A1 | 5/2012 | Lee et al. | |
| 2012/0193705 A1 | 8/2012 | Lim et al. | |
| 2012/0195128 A1 * | 8/2012 | Fujiwara | G11C 11/5628 365/185.24 |
| 2012/0256247 A1 | 10/2012 | Alsmeier | |
| 2012/0322252 A1 | 12/2012 | Son et al. | |
| 2013/0221309 A1 * | 8/2013 | Lee | H01L 45/085 257/2 |
| 2013/0270714 A1 * | 10/2013 | Lee | H01L 21/76802 257/774 |
| 2014/0021632 A1 | 1/2014 | Lee et al. | |
| 2014/0061776 A1 | 3/2014 | Kwon et al. | |
| 2014/0183756 A1 | 7/2014 | Hwang et al. | |
| 2015/0069616 A1 | 3/2015 | Oh et al. | |
| 2015/0179577 A1 | 6/2015 | Tobitsuka et al. | |
| 2015/0179659 A1 | 6/2015 | Takaki et al. | |
| 2015/0340366 A1 | 11/2015 | Lim et al. | |
| 2016/0204117 A1 | 7/2016 | Liu et al. | |
| 2016/0358855 A1 | 12/2016 | Oh | |
| 2017/0077139 A1 | 3/2017 | Iguchi | |
| 2017/0179153 A1 | 6/2017 | Ogawa et al. | |
| 2017/0179154 A1 | 6/2017 | Furihata et al. | |

OTHER PUBLICATIONS

Endoh et al., "Novel Ultra High Density Memory with a Stacked-Surrounding Gate Transistor (S-SGT) Structured Cell," IEDM Proc. (2001) 33-36.
Invitation to Pay Additional Fees and Search Report from the European Patent Office received in connection with International Application No. PCT/US2014/071397; dated Mar. 26, 2015.
International Search Report for PCT/US2014/071397, dated Mar. 18, 2015 (5 pages).
Written Opinion of the International Searching Authority for PCT/US2014/071397, dated Mar. 18, 2015 (11 pages).
International Preliminary Report on Patentability for International Application No. PCT/US2014/071397, 12 pages, dated Jun. 21, 2016.
Non-Final Office Action for corresponding U.S. Appl. No. 14/643,211, filed Mar. 10, 2015, dated Apr. 4, 2016, containing 22 pages.
U.S. Appl. No. 15/251,374, filed Aug. 30, 2016, SanDisk Technologies LLC.
U.S. Appl. No. 15/367,791, filed Dec. 2, 2016, SanDisk Technologies LLC.
U.S. Appl. No. 15/451,773, filed Mar. 7, 2017, SanDisk Technologies LLC.
U.S. Appl. No. 15/805,599, filed Nov. 7, 2017, SanDisk Technologies LLC.
U.S. Appl. No. 15/826,796, filed Nov. 30, 2017, SanDisk Technologies LLC.
U.S. Appl. No. 15/826,796, Notice of Allowance, dated Sep. 10, 2018, 30pgs.
U.S. Appl. No. 15/895,102, Notice of Allowance dated Oct. 5, 2018, 19pgs.

\* cited by examiner

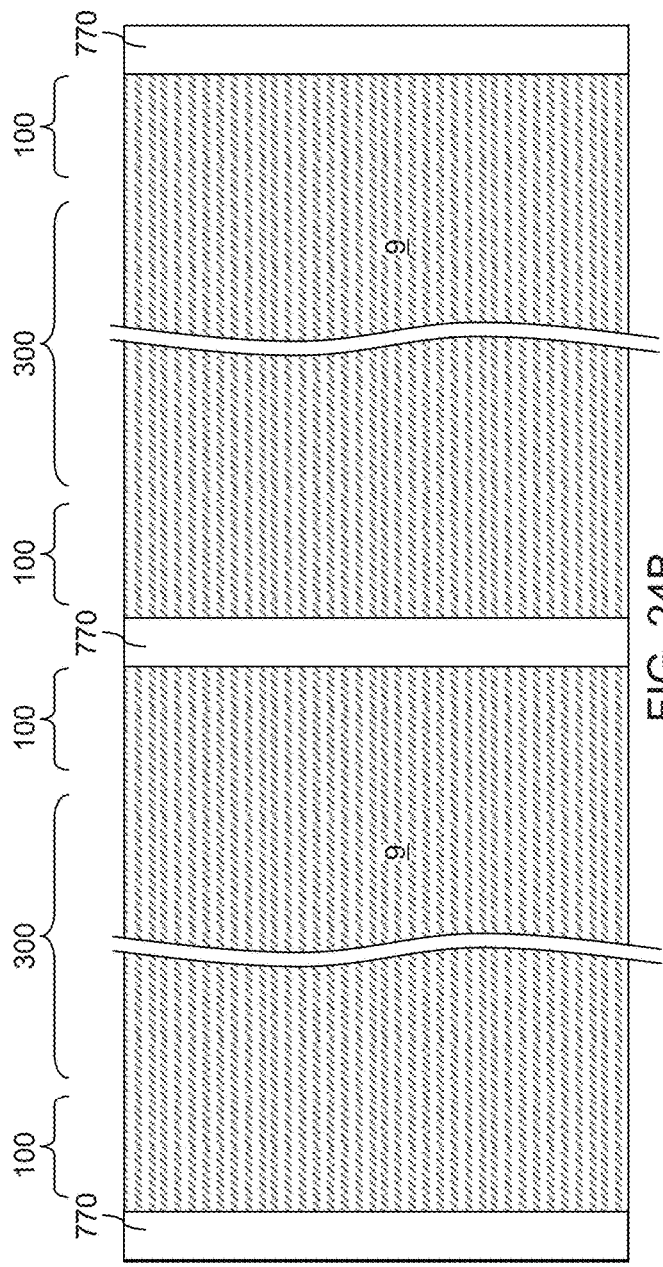
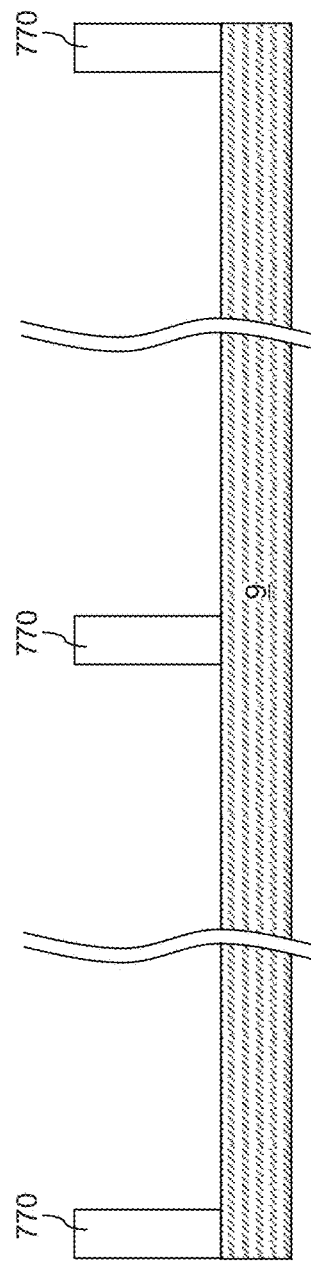
FIG. 24B
FIG. 24A

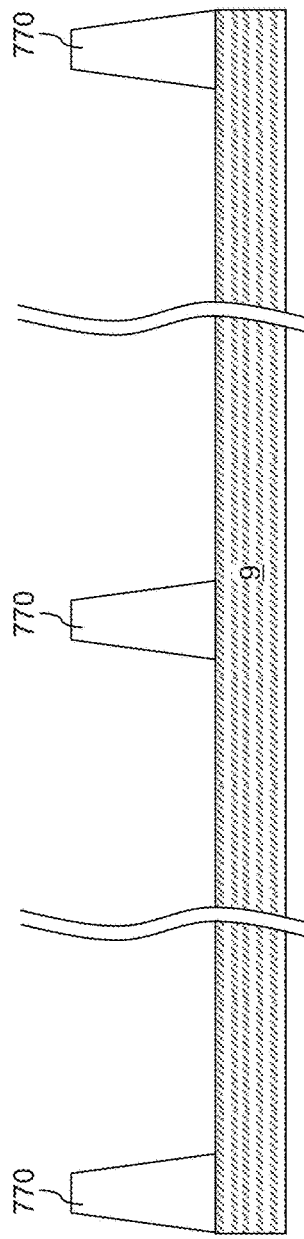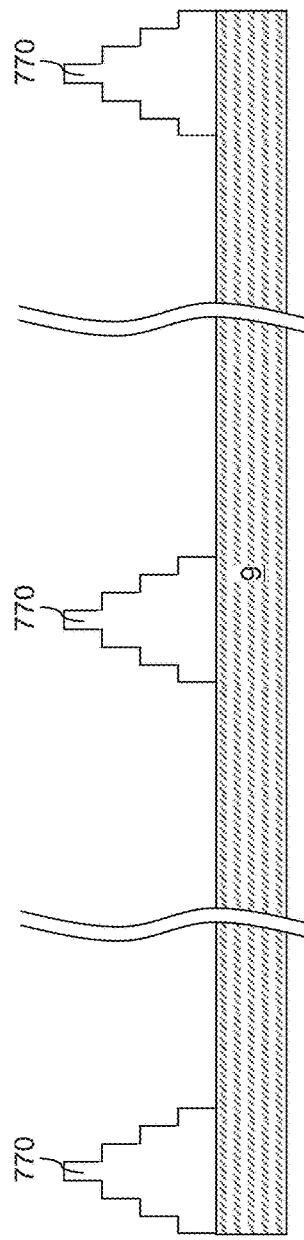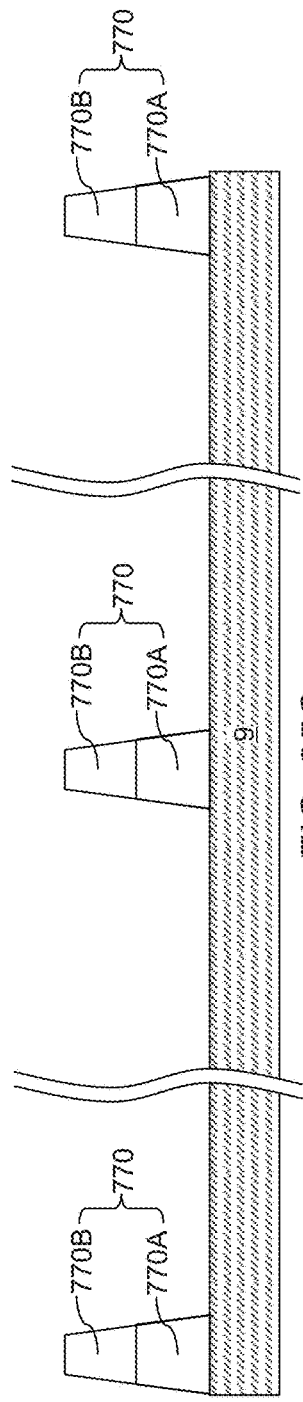

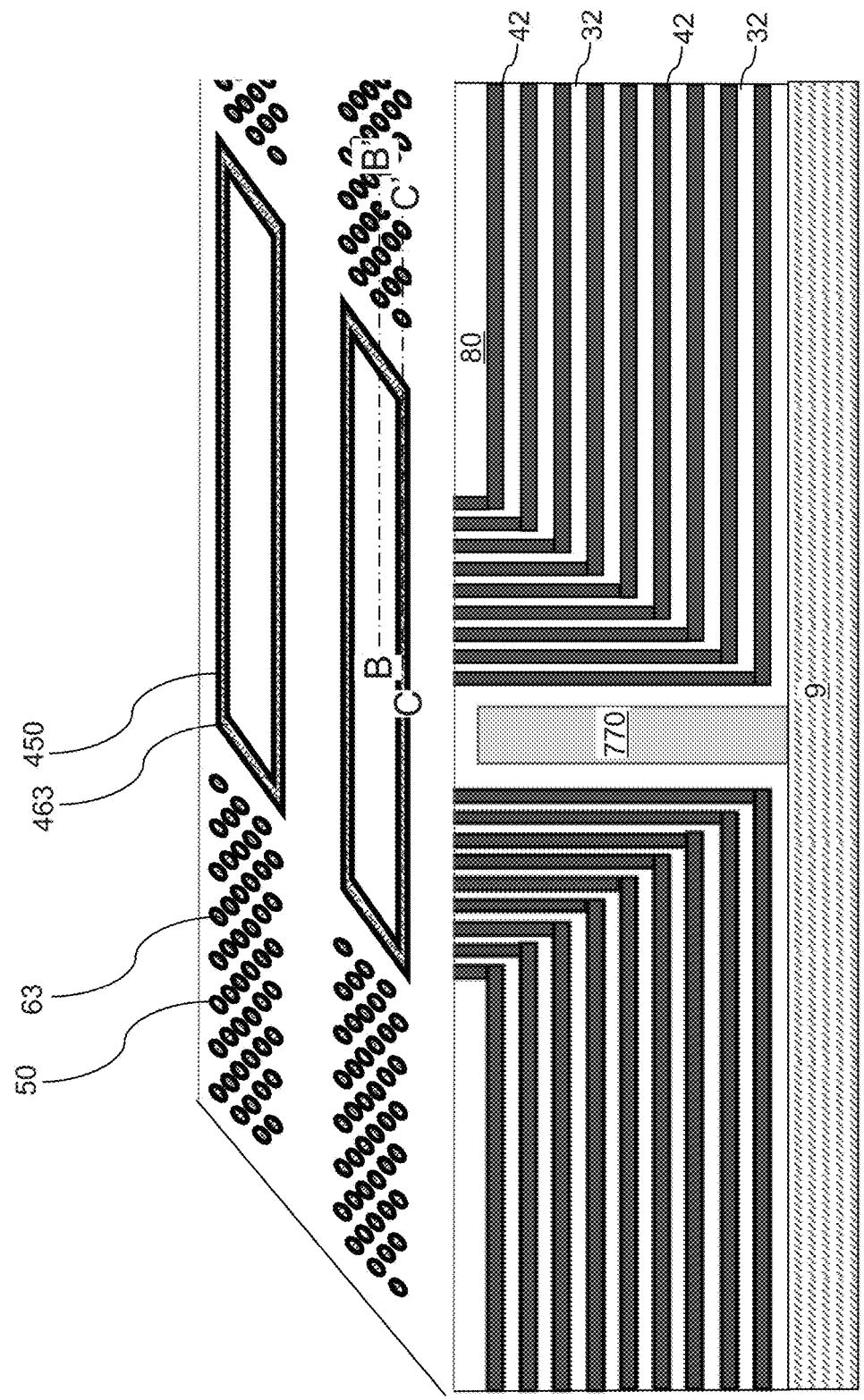

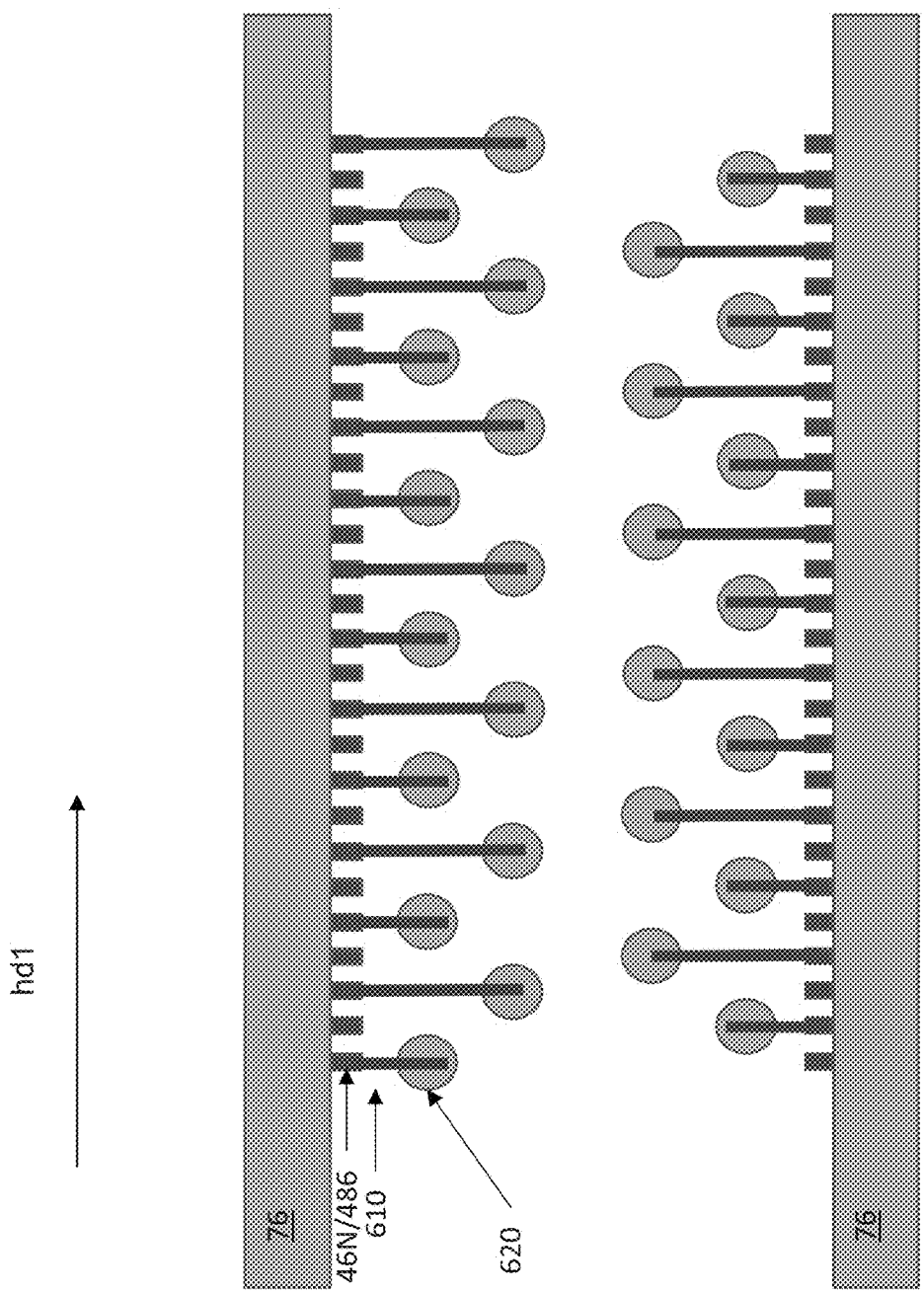

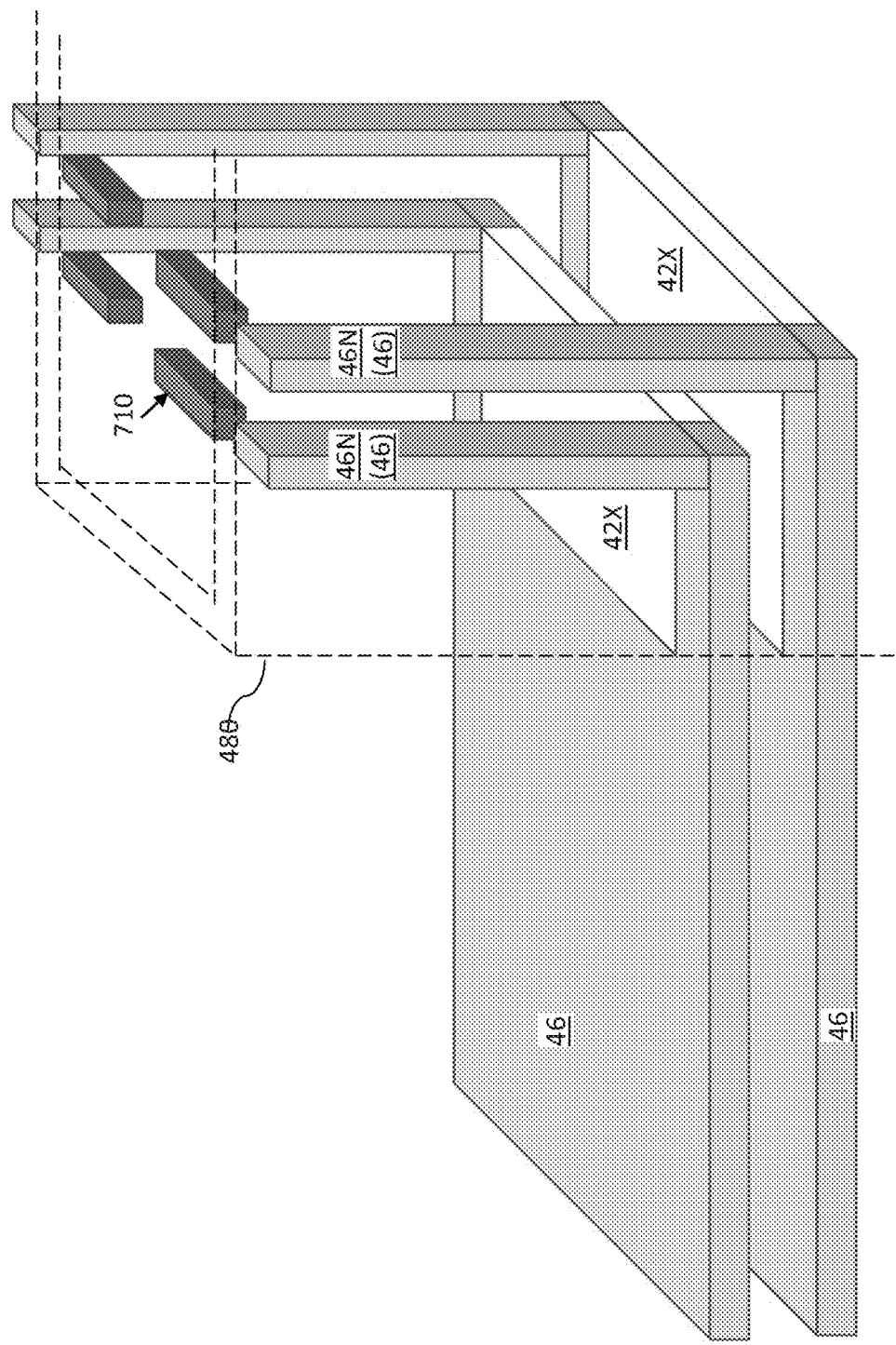

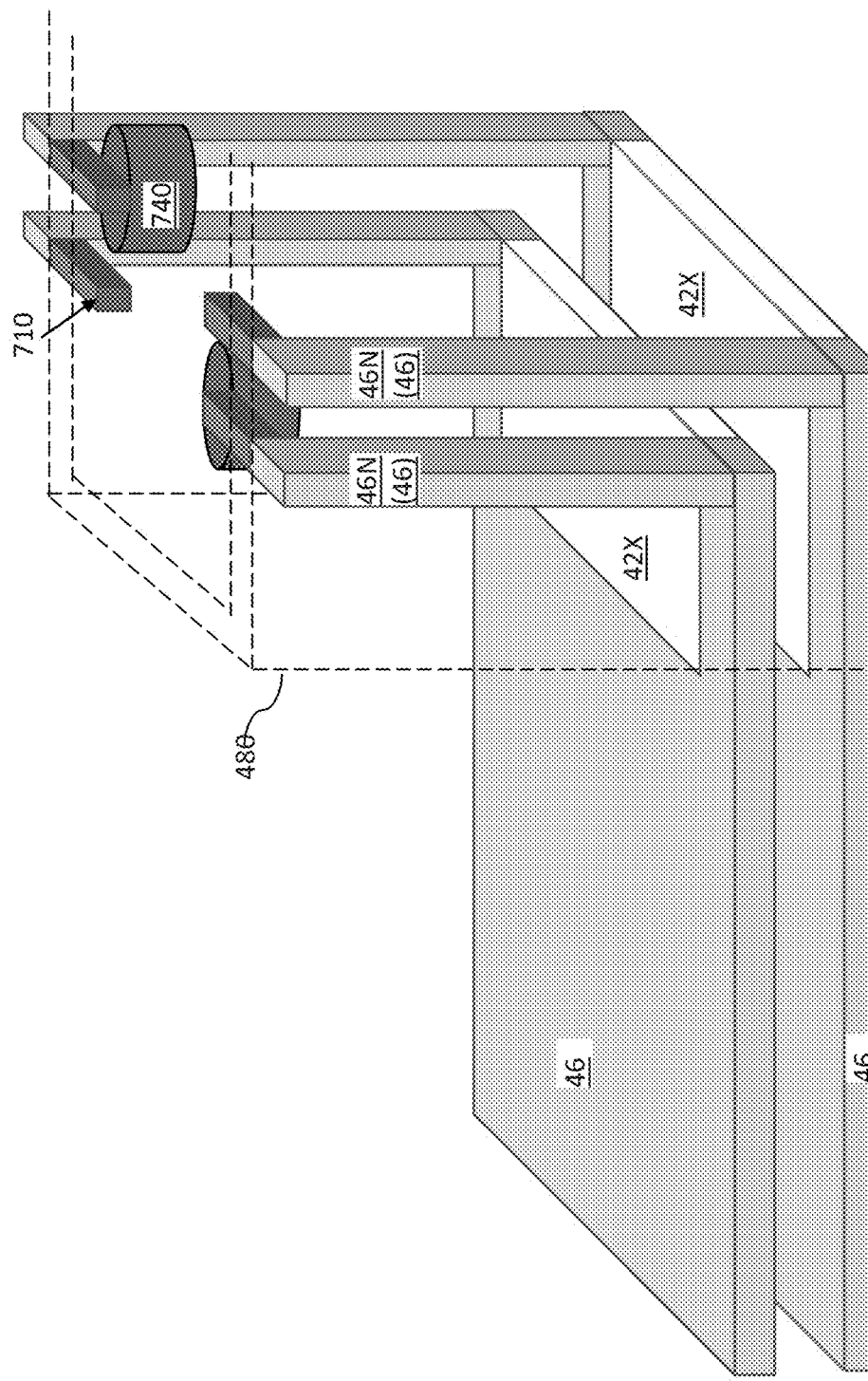

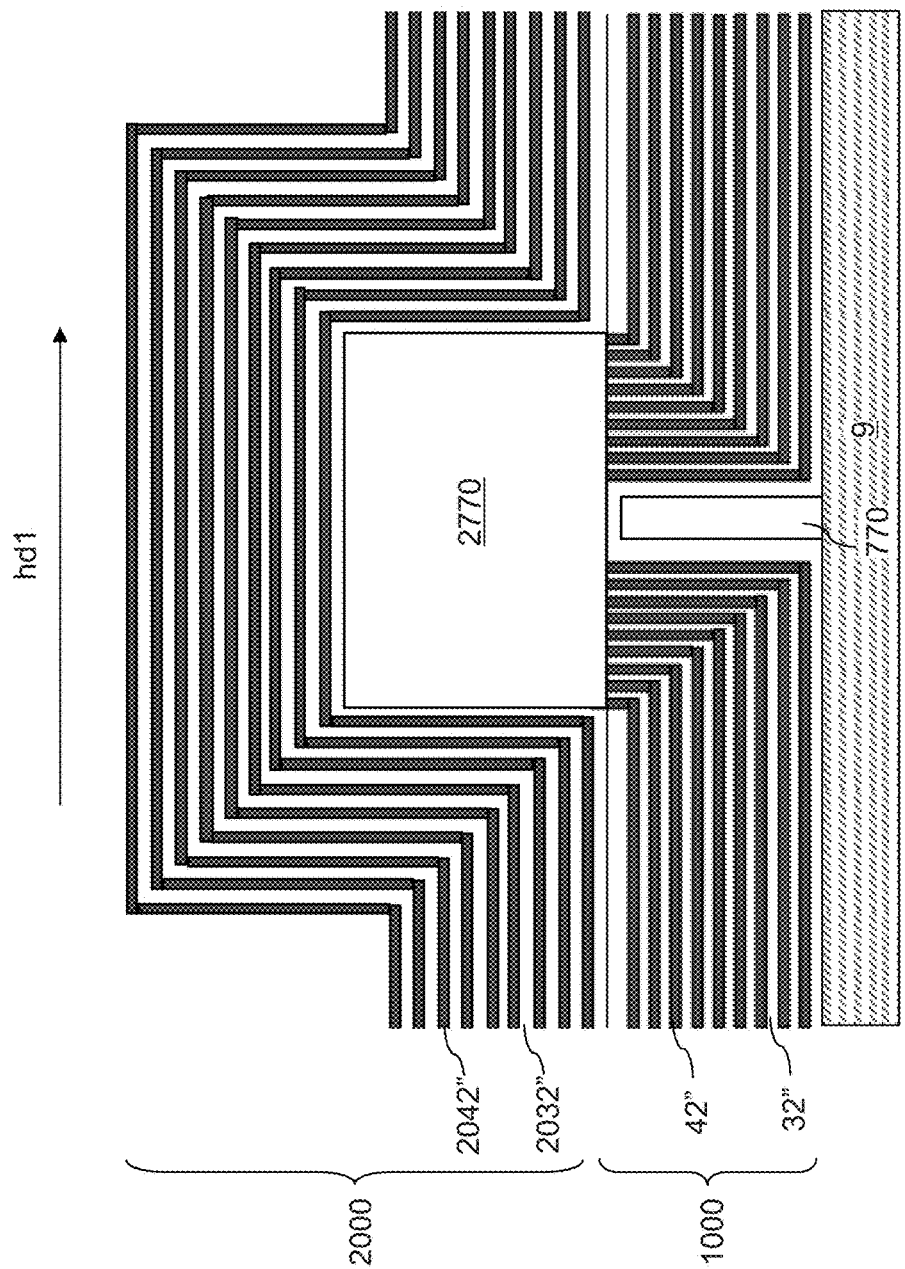

THREE-DIMENSIONAL MEMORY DEVICE HAVING L-SHAPED WORD LINES AND A SUPPORT STRUCTURE AND METHODS OF MAKING THE SAME

RELATED APPLICATIONS

This application is a continuation-in-part application of U.S. application Ser. No. 15/826,796 filed on Nov. 30, 2017, the entire contents of which are incorporated herein by reference.

FIELD

The present disclosure relates generally to the field of semiconductor devices, and particular to a three-dimensional memory device employing L-shaped word lines and a support structure and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes a first alternating stack of first insulating layers and first electrically conductive layers located over a top surface of a substrate, such that each of the first insulating layers and the first electrically conductive layers includes a respective horizontally-extending portion and a respective non-horizontally-extending portion, memory stack structures extending through a memory array region of the first alternating stack that includes the horizontally-extending portions of the first electrically conductive layers, such that each of the memory stack structures comprises a memory film and a vertical semiconductor channel, a mesa structure located over the substrate, such that each respective non-horizontally-extending portion of the first insulating layers and the first electrically conductive layers is located over a sidewall of the mesa structure, and contact structures that contact a respective one of the non-horizontally-extending portions of the first electrically conductive layers.

According to another aspect of the present disclosure, a method of forming a three-dimensional memory device is provided, which comprises: forming a mesa structure over a substrate; forming a first alternating stack of first insulating layers and first sacrificial material layers over a top surface of a substrate and over the mesa structure employing a series of conformal deposition processes; removing portions of the first insulating layers and the first sacrificial material layers from above a horizontal plane located at, or above, a top surface of the mesa structure by a planarization process, wherein each remaining portion of the first insulating layers and the first sacrificial material layers includes a respective horizontally-extending portion and a respective non-horizontally-extending portion; forming memory stack structures through a memory array region of the first alternating stack that includes the horizontally-extending portions of the first sacrificial material layers, wherein each of the memory stack structures comprises a memory film and a vertical semiconductor channel; forming a support panel structure through the mesa structure and through the first alternating stack, wherein the support panel structure includes a first sidewall that contacts a remaining portion of the mesa structure, first remaining portions of the first insulating layers, and first remaining portions of the first sacrificial material layers that are located outside the support panel structure; and replacing the first remaining portions of the first sacrificial material layers with first electrically conductive layers, wherein the first electrically conductive layers comprise word lines for the memory stack structures.

According to an aspect of the present disclosure, a three-dimensional memory device includes an alternating stack of L-shaped insulating layers and L-shaped electrically conductive layers located over a top surface of a substrate, such that each of the L-shaped insulating layers and the L-shaped electrically conductive layers includes a respective horizontally-extending portion and a respective non-horizontally-extending portion, memory stack structures extending through a memory array region of the alternating stack that includes the horizontally-extending portions of the L-shaped electrically conductive layers, such that each of the memory stack structures includes a memory film and a vertical semiconductor channel, dielectric spacers non-horizontally-extending between neighboring pairs of a non-horizontally-extending portion of an L-shaped insulating layer and a non-horizontally-extending portion of an L-shaped electrically conductive layer, and contact via structures that contact a respective one of the non-horizontally-extending portions of the L-shaped electrically conductive layers.

According to another aspect of the present disclosure, a method of forming a three-dimensional memory device is provided, which comprises: forming a mesa structure over a substrate; performing multiple times a set of processing steps comprising an insulating layer deposition step in which an insulating layer is conformally deposited, a dielectric spacer formation step in which a dielectric spacer is formed, and a sacrificial material layer deposition step in which a sacrificial material layer is conformally deposited; removing portions of the insulating layers, the dielectric spacers, and the sacrificial material layers from above a horizontal plane located at, or above, a top surface of the mesa structure by a planarization process, wherein an alternating stack of L-shaped insulating layers and L-shaped sacrificial material layers is formed over the substrate and on a sidewall of the mesa structure; forming memory stack structures through a memory array region of the alternating stack that includes the horizontally-extending portions of the L-shaped electrically conductive layers, wherein each of the memory stack structures comprises a memory film and a vertical semiconductor channel; replacing the L-shaped sacrificial material layers with L-shaped electrically conductive layers; and forming contact via structures on a respective one of vertically-extending portions of the L-shaped electrically conductive layers.

BRIEF DESCRIPTION OF THE DRAWINGS

FIG. 24A is a vertical cross-sectional view of a second exemplary structure after formation of first mesa structures according to a second embodiment of the present disclosure.

FIG. 24B is a top-down view of the second exemplary structure of FIG. 24A.

FIG. 25A is a vertical cross-sectional view of a first alternative configuration for the first exemplary structure of FIGS. 24A and 24B.

FIG. 25B is a vertical cross-sectional view of a second alternative configuration for the first exemplary structure of FIGS. 24A and 24B.

FIG. 25C is a vertical cross-sectional view of a third alternative configuration for the first exemplary structure of FIGS. 24A and 24B.

FIG. 29A is a perspective view of a cut portion of the second exemplary structure after formation of memory stack structures and support panel structures according to the second embodiment of the present disclosure.

FIG. 36B is top view of a second exemplary layout of contact pad structures, metal lines, and top surfaces of non-horizontally-extending portions of the first electrically conductive layers for the second exemplary structure according to the second embodiment of the present disclosure.

FIG. 38A is a perspective view of a first interconnect configuration the second exemplary structure according to the second embodiment of the present disclosure.

FIG. 38B is a perspective view of a second interconnect configuration of the second exemplary structure according to the second embodiment of the present disclosure.

FIG. 39 is a vertical cross-sectional view of a configuration of the second exemplary structure after formation of a second mesa structure and an alternating sequence of second conformal insulating layers and second conformal sacrificial material layers according to the second embodiment of the present disclosure.

DETAILED DESCRIPTION

Figure 1:
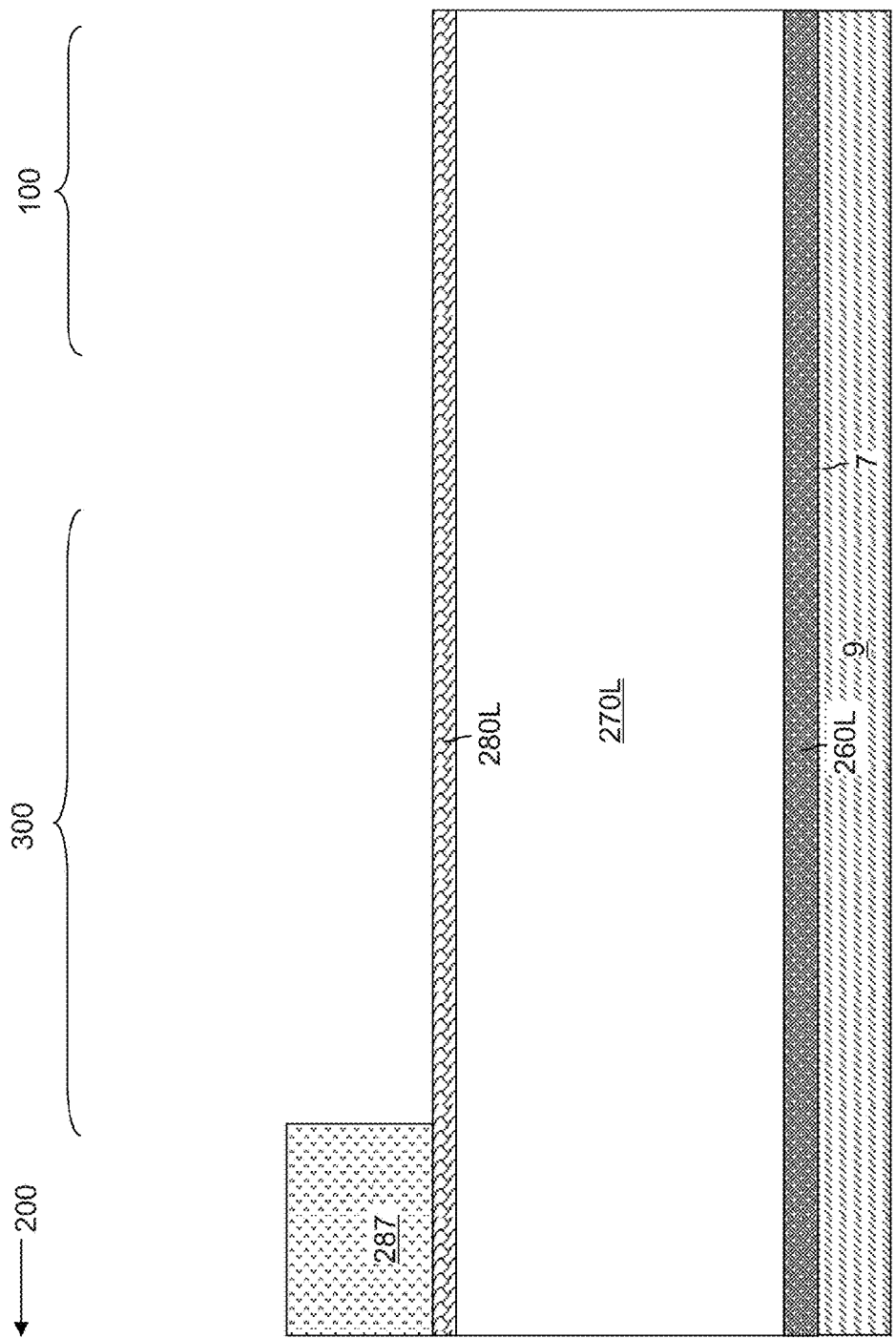
FIG. 1 is a schematic vertical cross-sectional view of a first exemplary structure after formation of a lower template layer, an upper template layer, a planarization stopping layer, and a patterned photoresist layer according to a first embodiment of the present disclosure.

As discussed above, the present disclosure is directed to a three-dimensional memory device employing L-shaped word lines and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate, which can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a top surface 7, which can be, for example, a topmost surface of the substrate semiconductor layer 9. The top surface 7 can be a semiconductor surface. In one embodiment, the top surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant. As used herein, an "electrical dopant" refers to a p-type dopant that adds a hole to a valance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device (not shown) for a peripheral circuitry can be formed on a portion of the substrate semiconductor layer 9. The at least one semiconductor device can include, for example, field effect transistors. The least one semiconductor device for the peripheral circuitry can contain a driver circuit for memory devices to be subsequently formed, which can include at least one NAND device. The region (i.e., area) of the at least one semiconductor device is herein referred to as a peripheral device region 200, which is located outside of the illustrated region of the first exemplary structure in FIG. 1. The region in which a memory array is subsequently formed is herein referred to as a memory array region 100. A contact region 300 for subsequently forming stepped terraces of electrically conductive layers can be provided between the memory array region 100 and the peripheral device region 200.

At least one template layer (260L, 270L) can be deposited on the top surface 7 of the substrate layer 9. In one embodiment, the at least one template layer (260L, 270L) can include a lower template layer 260L and an upper template layer 270L. The lower template layer 260L can include a first dielectric material that can be etched with a taper during a subsequent anisotropic etch. The upper template layer 270L can include a second dielectric material that can be etched with vertical sidewalls during the subsequent anisotropic etch. For example, the lower template layer 260L can include silicon nitride or aluminum oxide, and the upper template layer 270L can include silicon oxide. The total thickness of the at least one template layer (260L, 270L) can be greater than the thickness of an alternating stack of insulating layers and sacrificial material layers to be subsequently formed. For example, the lower template layer 260L can have a thickness in a range from 100 nm to 2,000 nm, and the upper template layer 270L can have a thickness in a range from 1,000 nm to 20,000 nm, although lesser and greater thicknesses can also be employed. In an alternative embodiment, the lower template layer 260L may be omitted, and the at least one template layer (260L, 270L) may consist of a single template layer such as the upper template layer 270L.

An optional planarization stopping layer 280L can be formed over the at least one template layer (260L, 270L). The planarization stopping layer 280L includes a material that can be employed as a stopping layer for a chemical mechanical planarization process to be subsequently performed. For example, the planarization stopping layer 280L can include polysilicon or a dielectric metal oxide. The thickness of the planarization stopping layer 280L can be in a range from 10 nm to 200 nm, such as from 10 nm to 100 nm, although lesser and greater thicknesses can also be employed. A photoresist layer 287 can be applied over the planarization stopping layer 280L, can be lithographically patterned to cover to a region adjacent to the contact region 300.

Figure 2:
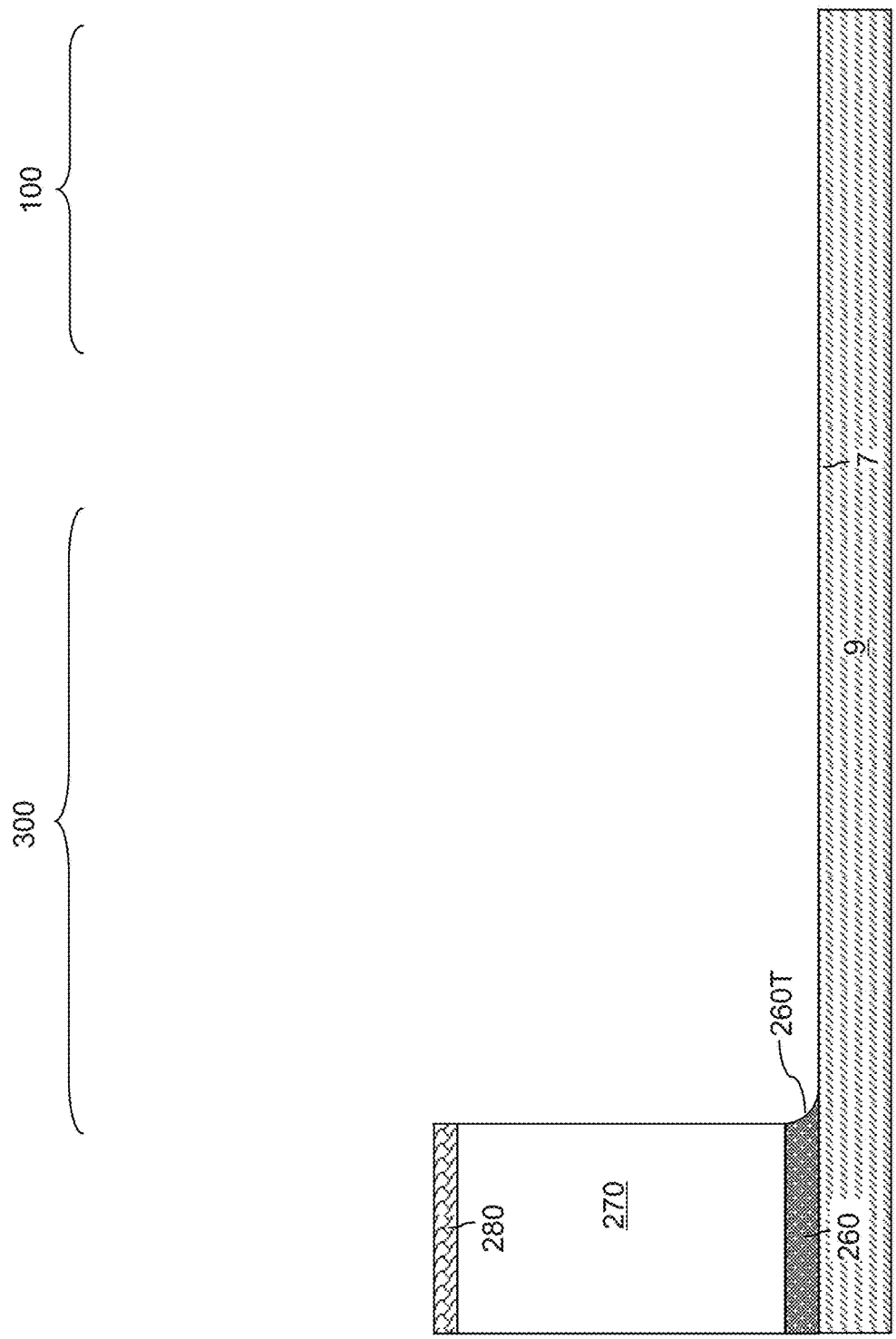
FIG. 2 is a schematic vertical cross-sectional view of the first exemplary structure after patterning the planarization stopping layer, the upper template layer, and the lower template layer to form a mesa structure according to the first embodiment of the present disclosure.

Referring to FIG. 2, an anisotropic etch is performed to transfer the pattern of the photoresist layer 287 through the planarization stopping layer 280L and the at least one template layer (260L, 270L). The isotropic etch can include multiple etch steps for sequentially etching the materials of the planarization stopping layer 280L and the at least one template layer (260L, 270L). For example, if the upper template layer 270L includes silicon oxide, a reactive ion etch employing a combination of $C_4F_6$, Ar, and $O_2$ or a combination of $C_4F_8$, Ar, and $O_2$ can be employed to pattern the upper template layer 270L with vertical sidewalls. If the lower template layer 260L includes silicon nitride, the top surface of the lower template layer 260L can be cleaned using $O_2$ or $O_2$/Ar chemistry. Subsequently, the lower template layer 260L including silicon nitride can be etched with a tapered sidewall employing a combination of $CHF_3$, Ar, and $O_2$ or $CH_2F_2$, Ar, and $O_2$. Low electrostatic chuck (ESC) temperature in a range from −10 degrees Celsius to 20 degrees Celsius can facilitate accumulation of residual material from the etch process (which may be from the combination of materials from the upper template layer 270L, the photoresist layer 287, and the etch gas) on the sidewalls of remaining portions of the lower template layer 260L and induce formation of tapered sidewalls 260T on the remaining portion of the lower template layer 260L. The top surface 7 of the substrate semiconductor layer 9 can be physically exposed after the anisotropic etch process.

The remaining portion of the planarization stopping layer 280L is herein referred to as a planarization stopping structure 280, the remaining portion of the upper template layer 270L is herein referred to as an upper template structure 270, and the remaining portion of the lower template layer 270L is herein referred to as a lower template structure 260. The upper template structure 270 can have non-horizontal sidewalls having an angle of 60 to 90 degrees with respect to a horizontal direction (e.g., with respect to the top surface 7 of the substrate), including vertical sidewalls (i.e., having an angle of 90 degrees with respect to the horizontal direction). The lower template structure 260 can have tapered sidewalls. The photoresist layer 287 can be subsequently removed, for example, by ashing. The combination of the lower template structure 260 and the upper template structure 270 constitutes a mesa structure (260, 270) that protrudes above the top surface 7 of the substrate semiconductor layer 9. In one embodiment the mesa structure can have a planar top surface (which is the top surface of the upper template structure 270). In another embodiment, the mesa structure can have a non-planar top surface.

Figure 3:
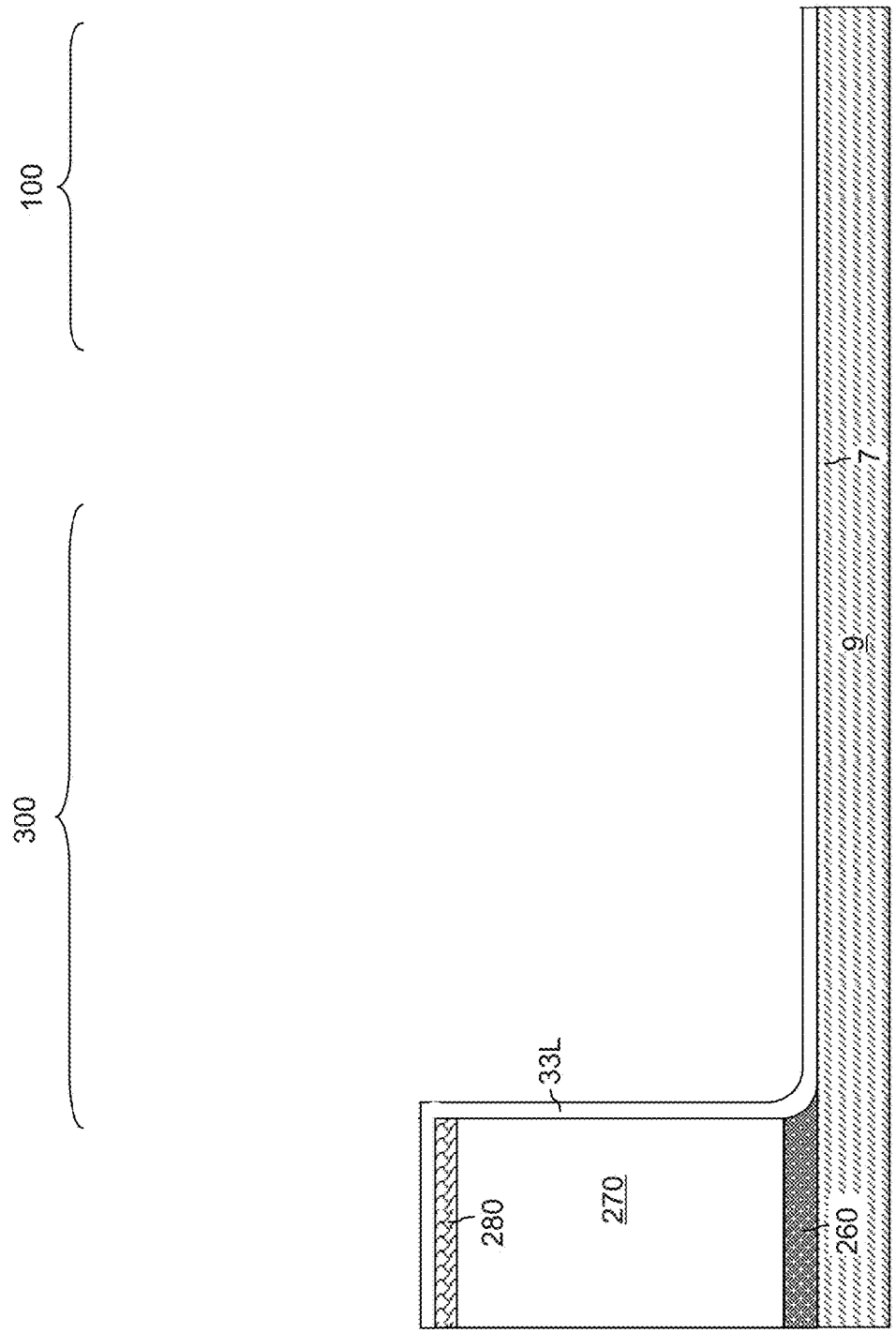
FIG. 3 is a schematic vertical cross-sectional view of the first exemplary structure after formation of a Z-shaped dielectric spacer material layer according to the first embodiment of the present disclosure.

Referring to FIG. 3, an optional Z-shaped dielectric spacer material layer 33L can be formed on the top surface 7 of the substrate semiconductor layer 9, on the sidewalls of the mesa structure (260, 270), and on the top surface of the mesa structure (260, 270). As used herein, a "Z-shaped" element refers to an element that includes a pair of horizontally-extending portions that are adjoined by a connecting portion that extends along a non-horizontal direction (e.g., having an angle of 60 to 90 degrees with respect to a horizontal direction), such as a vertical direction. Specifically, the Z-shaped dielectric spacer material layer 33L includes a first horizontal portion that contacts the top surface 7 of the substrate semiconductor layer 9, a second horizontal portion that overlies the mesa structure (260, 270), and a non-horizontal portion, such as a vertical portion, that connects the first horizontal portion and the second horizontal portion. The Z-shaped dielectric spacer material layer 33L is a continuous dielectric material layer including a dielectric material that is subsequently incorporated into a dielectric spacer. For example, the Z-shaped dielectric spacer material layer 33L can include silicon oxide, which may, or may not, be doped with dopants such as B, P, F, or As. The Z-shaped dielectric spacer material layer 33L can be formed by a conformal deposition process such as low pressure chemical vapor deposition. The thickness of the Z-shaped dielectric spacer material layer 33L can be in a range from 15 nm to 200 nm, although lesser and greater thicknesses can also be employed. In another embodiment, the Z-shaped dielectric spacer material layer 33L may be omitted.

Figure 4:
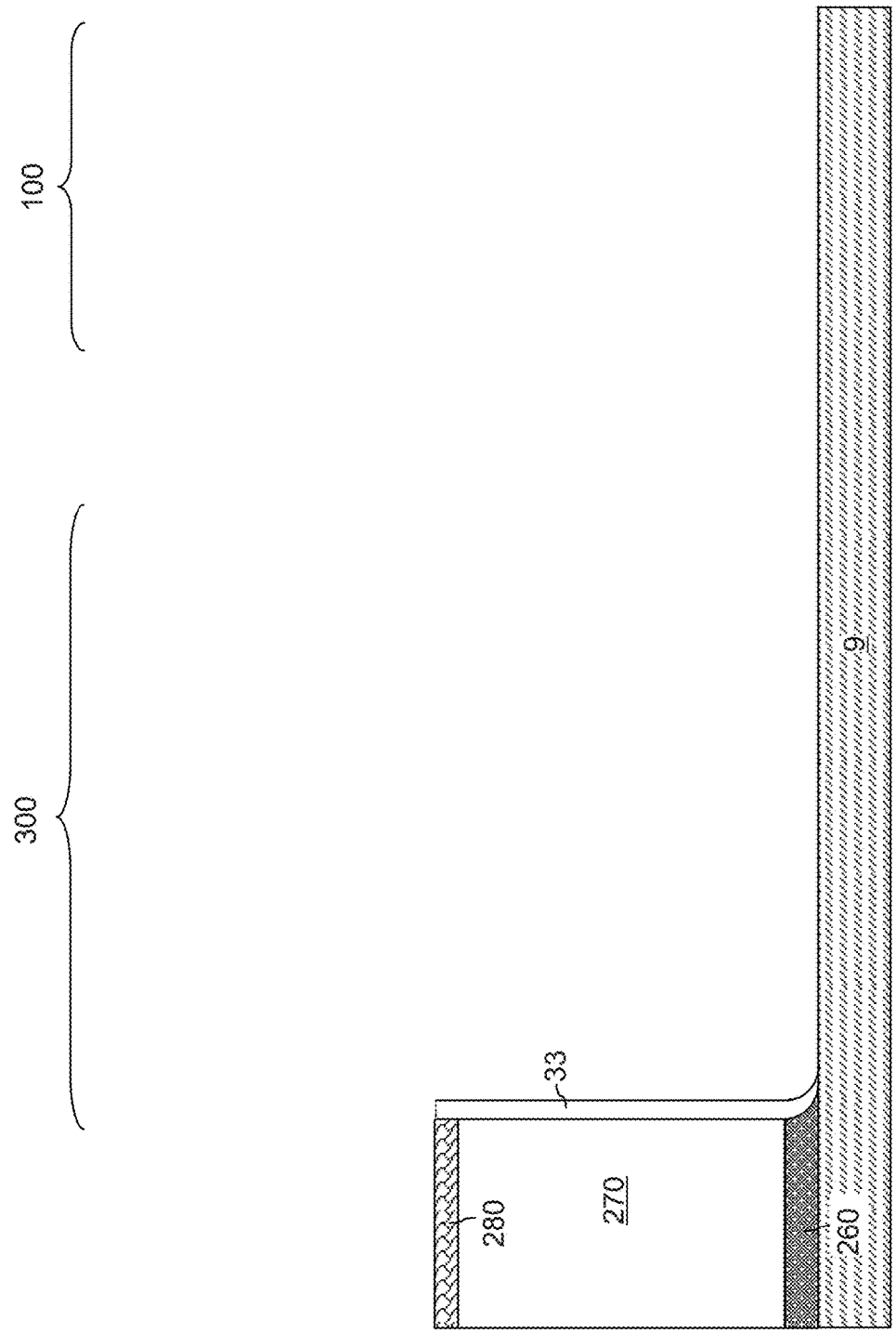
FIG. 4 is a schematic vertical cross-sectional view of the first exemplary structure after formation of a dielectric spacer according to the first embodiment of the present disclosure.

Referring to FIG. 4, an anisotropic etch process is performed to remove horizontal portions of the Z-shaped dielectric spacer material layer 33L from above the top surface of the substrate semiconductor layer 9 and from above the top surface of the mesa structure (260, 270). For example, etch chemistry employing $C_4F_8$ and/or $C_4F_6$, Ar, and $O_2$ can be employed to anisotropically etch the Z-shaped dielectric spacer material layer 33L. Remaining vertical portions of the Z-shaped dielectric spacer material layer 33L can have a spacer shape, such as a rectangular or cylindrical spacer shape, and is herein referred to as a dielectric spacer 33. The dielectric spacer 33 includes a vertical portion located at an edge of the contact region 300. In one embodiment, the vertical portion of the dielectric spacer 33 can laterally extend along a horizontal direction that is perpendicular to the direction connecting the memory array region 100 and the contact region 300, which is the direction perpendicular to the view illustrated in FIG. 4 (i.e., perpendicular to the plane of view in FIG. 4). The dielectric spacer 33 is optional and can be omitted in an alternative embodiment.

Figure 5:
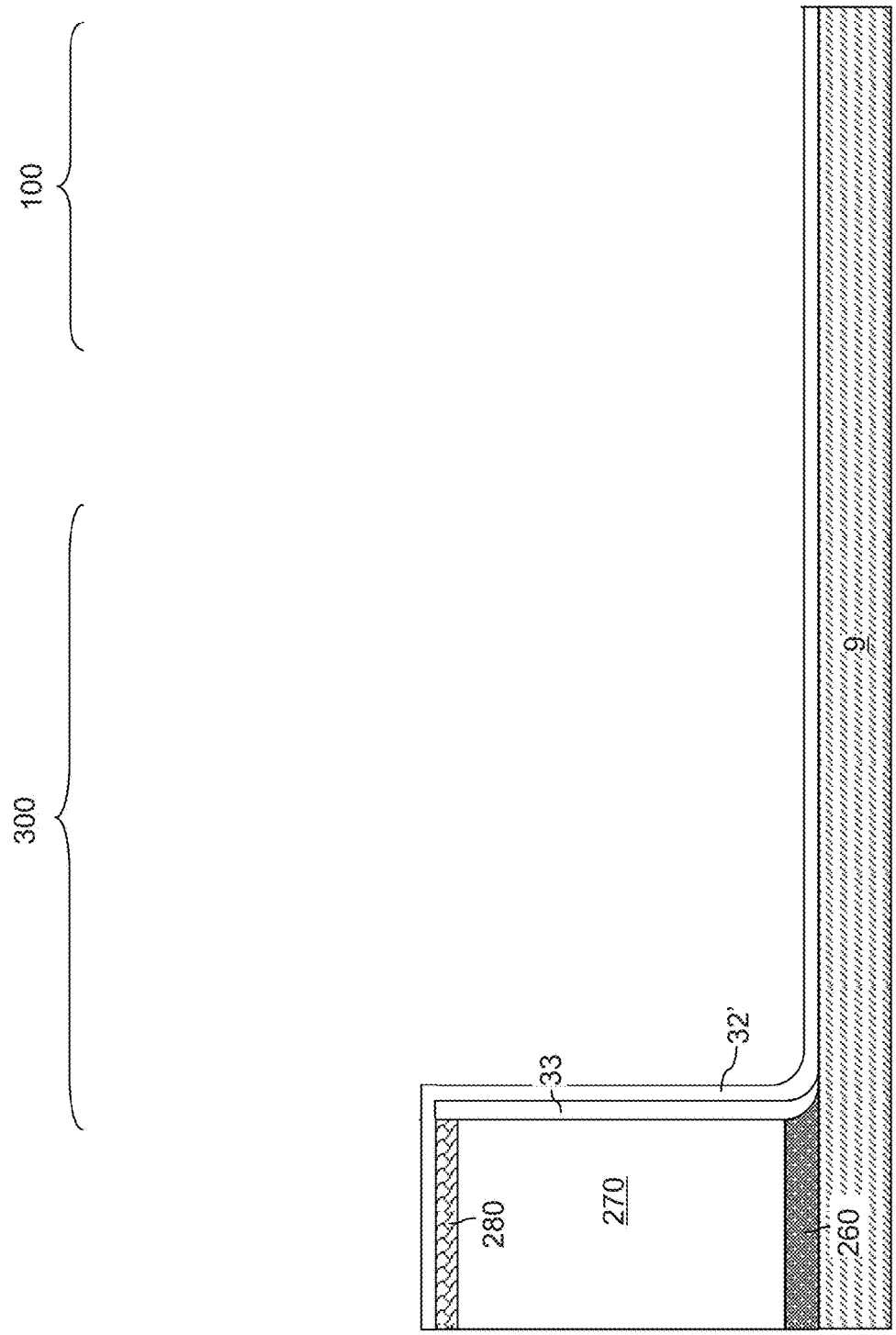
FIG. 5 is a schematic vertical cross-sectional view of the first exemplary structure after formation of a Z-shaped insulating layer according to the first embodiment of the present disclosure.

Referring to FIG. 5, a Z-shaped insulating layer 32' can be deposited on the top surface 7 of the substrate semiconductor layer 9, on the sidewalls of the dielectric spacer 33, and on the top surface of the mesa structure (260, 270). The Z-shaped insulating layer 32' is a continuous insulating material layer including a dielectric material that is subsequently combined with the dielectric spacer 33. The Z-shaped insulating layer 32' includes a first horizontal portion that contacts the top surface of the substrate semiconductor layer 9, a second horizontal portion that contacts the top surface of the mesa structure (260, 270), and a non-horizontally-extending portion having an angle of 60 to 90 degrees with respect to a horizontal direction, such as a vertically-extending portion that connects the first horizontal portion and the second horizontal portion and contacting the dielectric spacer 33. As used herein, an element is "non-horizontally-extending" if the element extends along a non-horizontal direction, which may be a vertical direction, or any non-vertical and non-horizontal direction. The insulating material of the Z-shaped insulating layer 32' may be the same as, or may be different from, the dielectric material of the dielectric spacer 33. In one embodiment, the Z-shaped insulating layer 32' can include silicon oxide, which may, or may not, be doped with dopants such as B, P, F, or As. In one embodiment, the Z-shaped insulating layer 32' may consist essentially of $SiO_2$ with a trace level of hydrogen atoms and/or carbon atoms. The Z-shaped insulating layer 32' can be formed by a conformal deposition process such as low pressure chemical vapor deposition. The thickness of the Z-shaped insulating layer 32' can be in a range from 25 nm to 60 nm, although lesser and greater thicknesses can also be employed.

Figure 6:
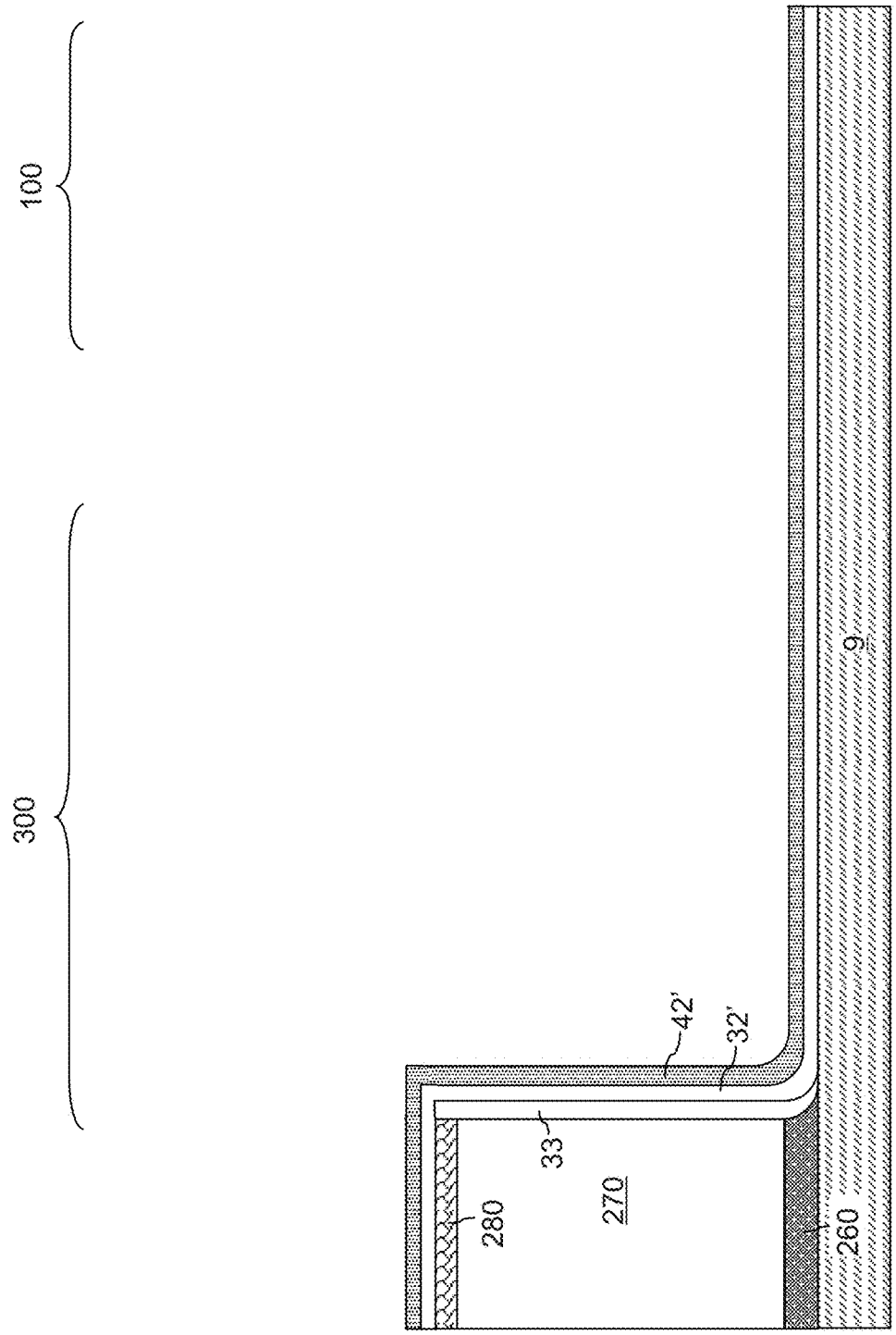
FIG. 6 is a schematic vertical cross-sectional view of the first exemplary structure after formation of a Z-shaped sacrificial material layer according to the first embodiment of the present disclosure.

Referring to FIG. 6, a Z-shaped sacrificial material layer 42' can be deposited on the Z-shaped insulating layer 32'. The Z-shaped sacrificial material layer 42' is a continuous sacrificial material layer including a sacrificial material that spatially separates the Z-shaped insulating layer 32' from another Z-shaped insulating layer to be subsequently formed. The Z-shaped sacrificial material layer 42' includes a first horizontal portion located in the memory array region 100 and the contact region 300, a second horizontal portion overlying the mesa structure (260, 270), and a non-horizontally-extending portion having an angle of 60 to 90 degrees with respect to a horizontal direction, such as a vertically-extending portion that connects the first horizontal portion and the second horizontal portion. In one embodiment, the spacer material can be a sacrificial material that is subsequently replaced with an electrically conductive material. For example, the sacrificial material of the Z-shaped sacrificial material layer 42' can be silicon nitride. The Z-shaped sacrificial material layer 42' can be formed by a conformal deposition process such as low pressure chemical vapor deposition. The thickness of the Z-shaped sacrificial material layer 42' can be in a range from 25 nm to 60 nm, although lesser and greater thicknesses can also be employed.

Figure 7:
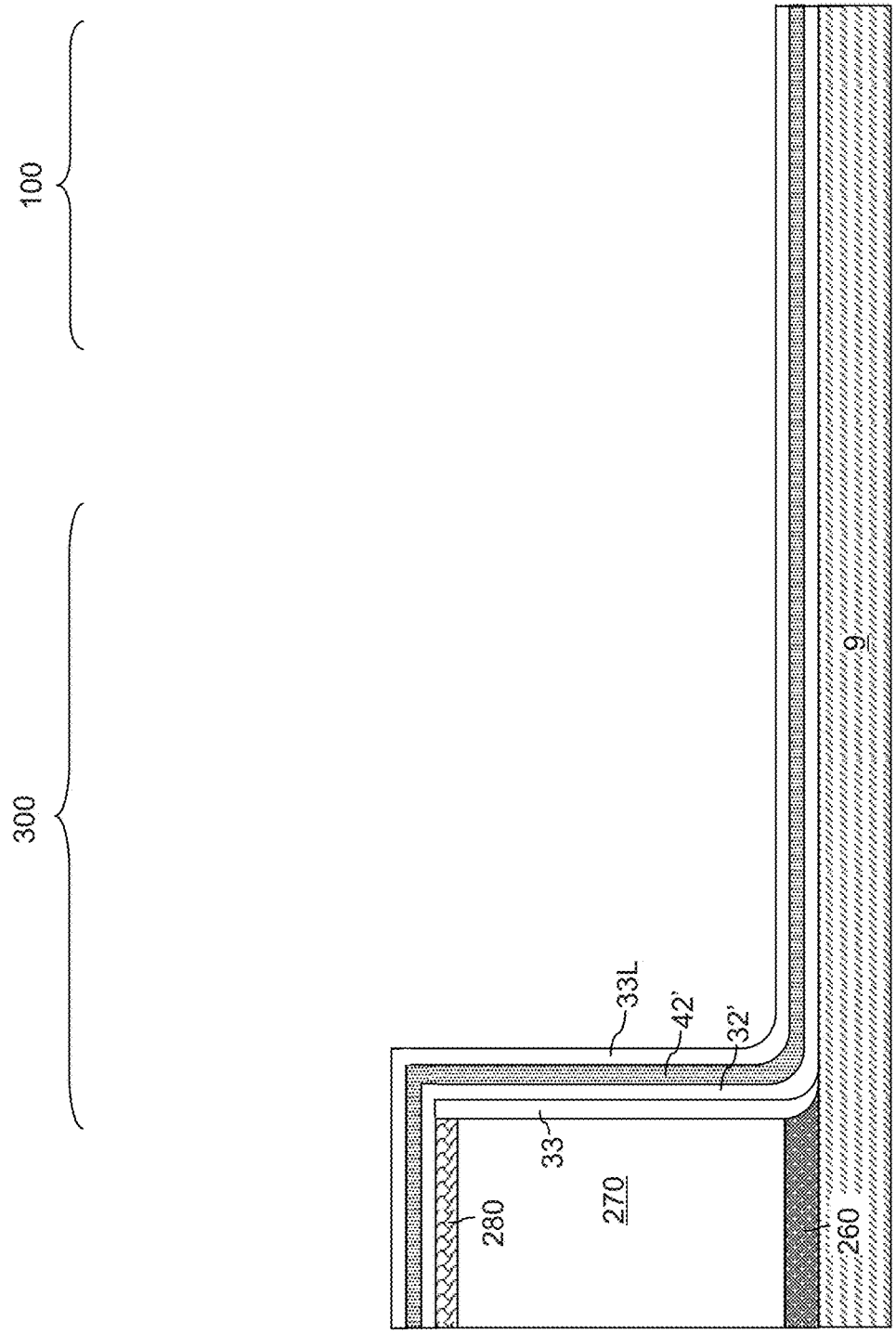
FIG. 7 is a schematic vertical cross-sectional view of the first exemplary structure after formation of a Z-shaped dielectric spacer material layer according to the first embodiment of the present disclosure.

Referring to FIG. 7, the processing steps of FIG. 3 can be performed to form another Z-shaped dielectric spacer material layer 33L, which is herein referred to as a second Z-shaped dielectric spacer material layer 33L. The second Z-shaped dielectric spacer material layer 33L can have the same composition and the same thickness as the Z-shaped dielectric spacer material layer 33L formed at the processing steps of FIG. 3.

Figure 8:
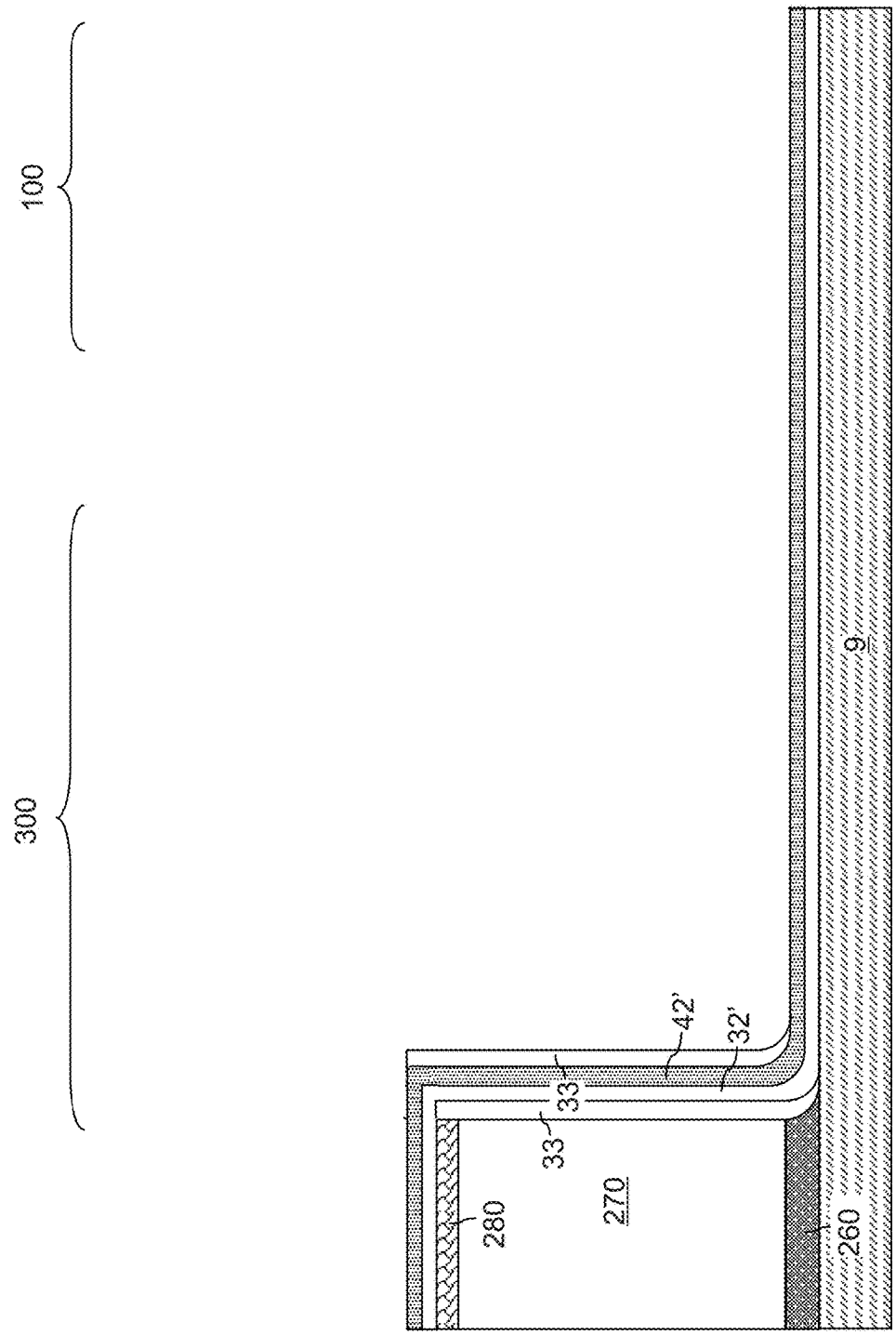
FIG. 8 is a schematic vertical cross-sectional view of the first exemplary structure after formation of a dielectric spacer according to the first embodiment of the present disclosure.

Referring to FIG. 8, the processing steps of FIG. 4 can be performed to form another dielectric spacer 33, which is herein referred to as a second dielectric spacer 33. The second dielectric spacer 33 can have the same composition and the same thickness as the dielectric spacer 33 that is formed at the processing steps FIG. 4.

Figure 9:
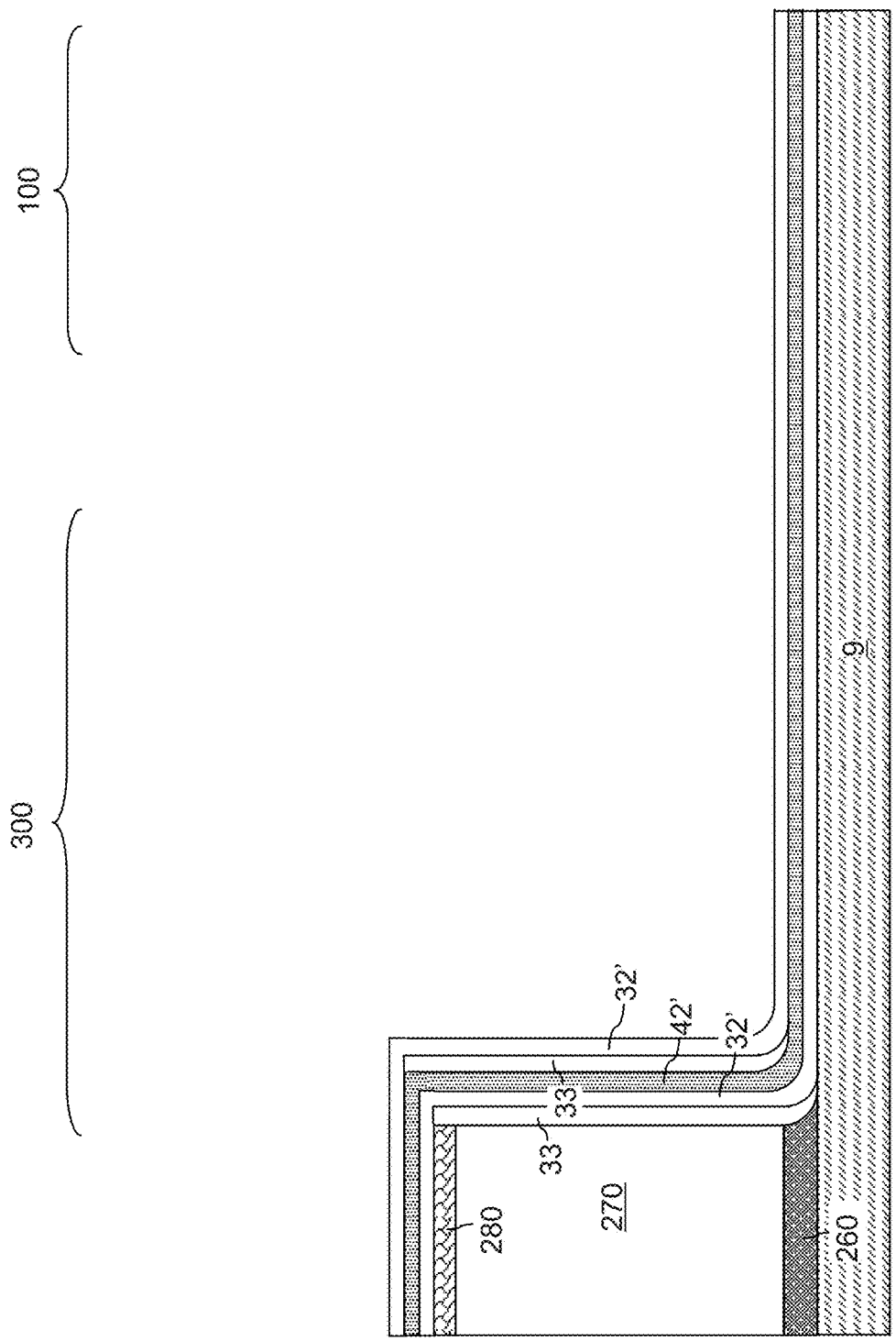
FIG. 9 is a schematic vertical cross-sectional view of the first exemplary structure after formation of a Z-shaped insulating layer according to the first embodiment of the present disclosure.

Referring to FIG. 9, the processing steps of FIG. 5 can be performed to form another Z-shaped insulating layer 32', which is herein referred to as a second Z-shaped insulating layer 32'. The second Z-shaped insulating layer 32' can have the same composition and the same thickness as the Z-shaped insulating layer 32' formed at the processing steps of FIG. 5.

Figure 10:
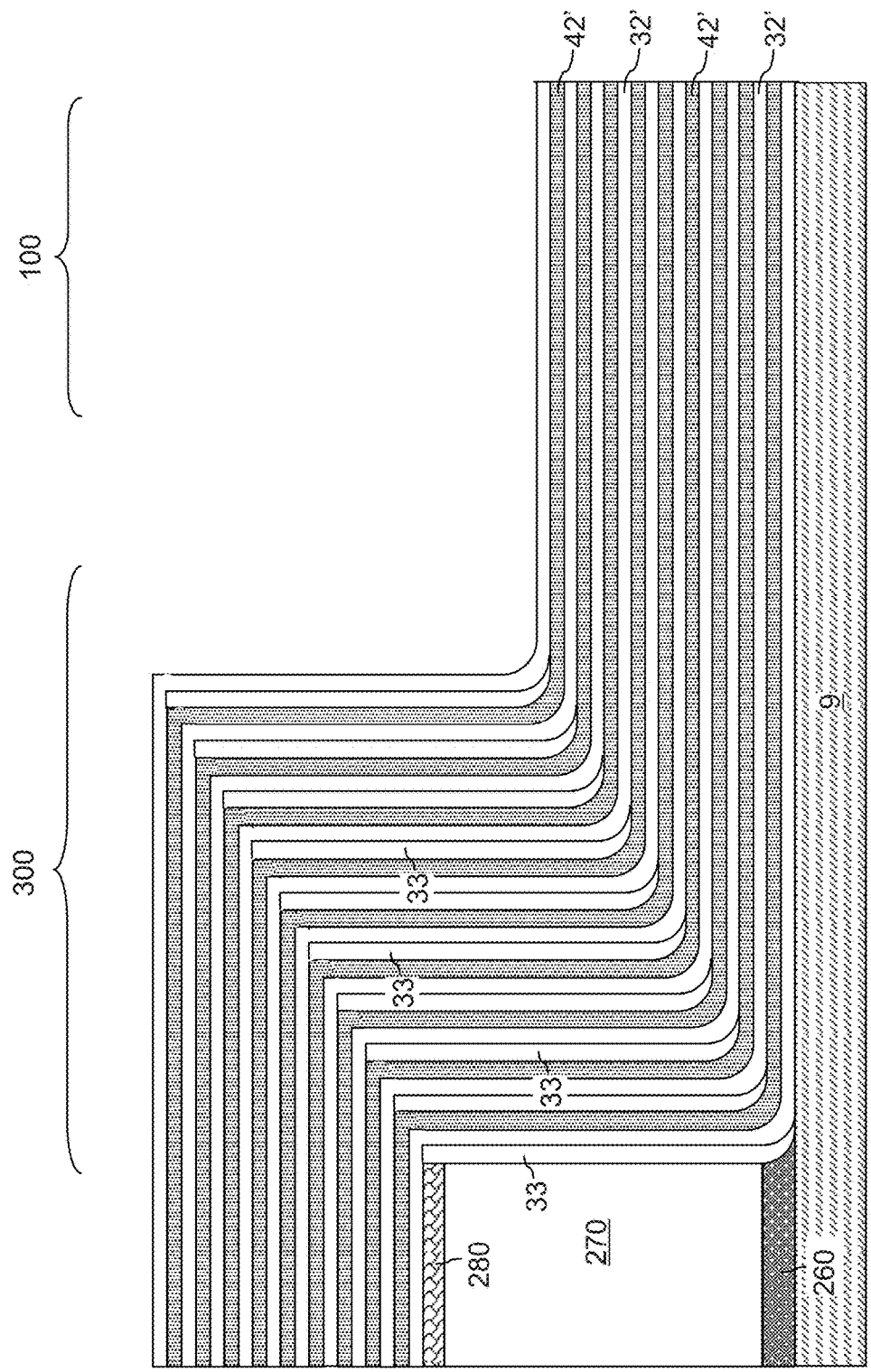
FIG. 10 is a schematic vertical cross-sectional view of the first exemplary structure after formation of multiple sets of a dielectric spacer, a Z-shaped insulating layer, and a Z-shaped sacrificial material layer according to the first embodiment of the present disclosure.

Referring to FIG. 10, the processing steps of FIG. 6 can be performed to form another Z-shaped sacrificial material layer 42', which is herein referred to as a second Z-shaped sacrificial material layer 42'. The second Z-shaped sacrificial material layer 42' can have the same composition and the same thickness as the Z-shaped sacrificial material layer 42' formed at the processing steps of FIG. 6.

Subsequently, the set of processing steps of FIGS. 3-6 can be repeated multiple times, such as 31 to 127 times. Each set of processing steps can form a dielectric spacer 33, a Z-shaped insulating layer 32', and a Z-shaped sacrificial material layer 42' to form a total of 32 to 128 sets of layers, such as 64 to 128 sets of layers (32, 33' 42'). Generally, a set of processing steps can be repeated multiple times provided that the set of processing steps includes an insulating layer deposition step in which a Z-shaped insulating layer 32' is conformally deposited, a dielectric spacer formation step in which a dielectric spacer 33 is formed, and a sacrificial material layer deposition step in which a Z-shaped sacrificial material layer 42' is conformally deposited. The order of the processing steps within the set of processing steps can be rearranged as needed. In some embodiments, a Z-shaped sacrificial material layer 42' is deposited directly on horizontal surfaces of a Z-shaped insulating layer 32' within each set of processing steps. In some other embodiments, a Z-shaped insulating layer 32' is deposited directly on horizontal surfaces of a Z-shaped sacrificial material layer 42' within each set of processing steps. In some embodiments, a Z-shaped sacrificial material layer 42' is deposited directly on a sidewall of a dielectric spacer 33 within each set of processing steps. In some other embodiments, a Z-shaped insulating layer 32' is deposited directly on a sidewall of a dielectric spacer 33 within each set of processing steps.

An alternating stack (32', 42') of Z-shaped insulating layers 32' and Z-shaped sacrificial material layers 42' is formed over the substrate semiconductor layer 9 and the mesa structure (260, 270). A dielectric spacer 33 is provided between each neighboring pairs of a Z-shaped insulating layer 32' and a Z-shaped sacrificial material layer 42'. The lateral extent of vertical portions of the alternating stack (32', 42') in the contact region 300 is greater than the vertical thickness of the alternating stack (32', 42') in the memory array region 100 by the total lateral thickness of the dielectric spacers 33. In one embodiment, the dielectric spacers 33 have a lateral width that is in a range from 50% to 400% of an average lateral width of the non-horizontally-extending portions, such as the vertically-extending portions of the insulating layers 32'.

Figure 11:
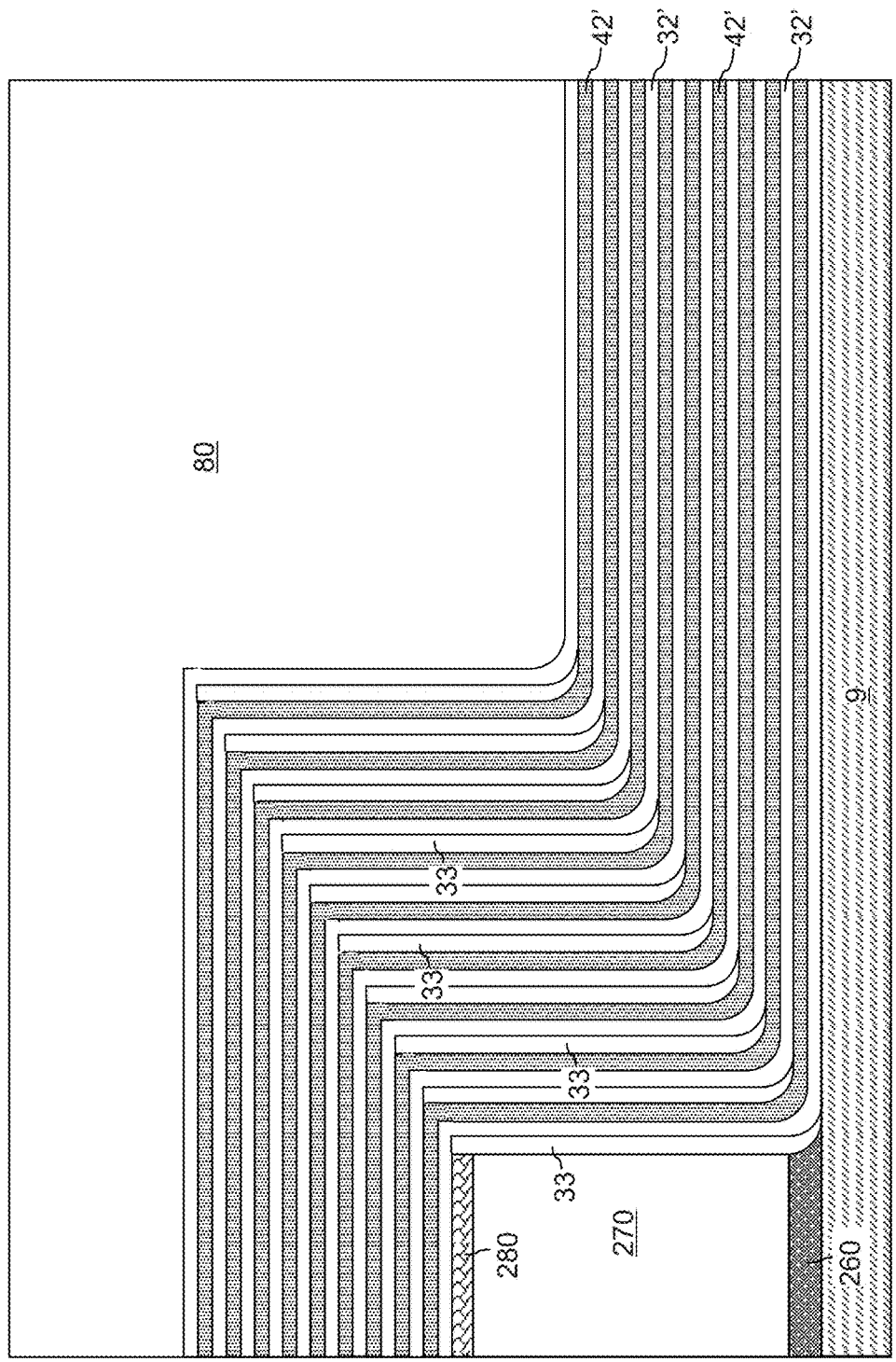
FIG. 11 is a schematic vertical cross-sectional view of the first exemplary structure after formation of a planarization dielectric layer according to the first embodiment of the present disclosure.

Referring to FIG. 11, a planarizable dielectric material is deposited over the alternating stack (32', 42') to form a planarization dielectric layer 80. The planarizable dielectric material may be a self-planarizing material such as spin-on glass (SOG), or a dielectric material such as doped silicate glass or undoped silicate glass that can be planarized by chemical mechanical planarization (CMP) process. The lowest portion of the top surface of the planarization dielectric layer 80 can be located above the horizontal plane including the top surface of the upper template structure 270.

Figure 12:
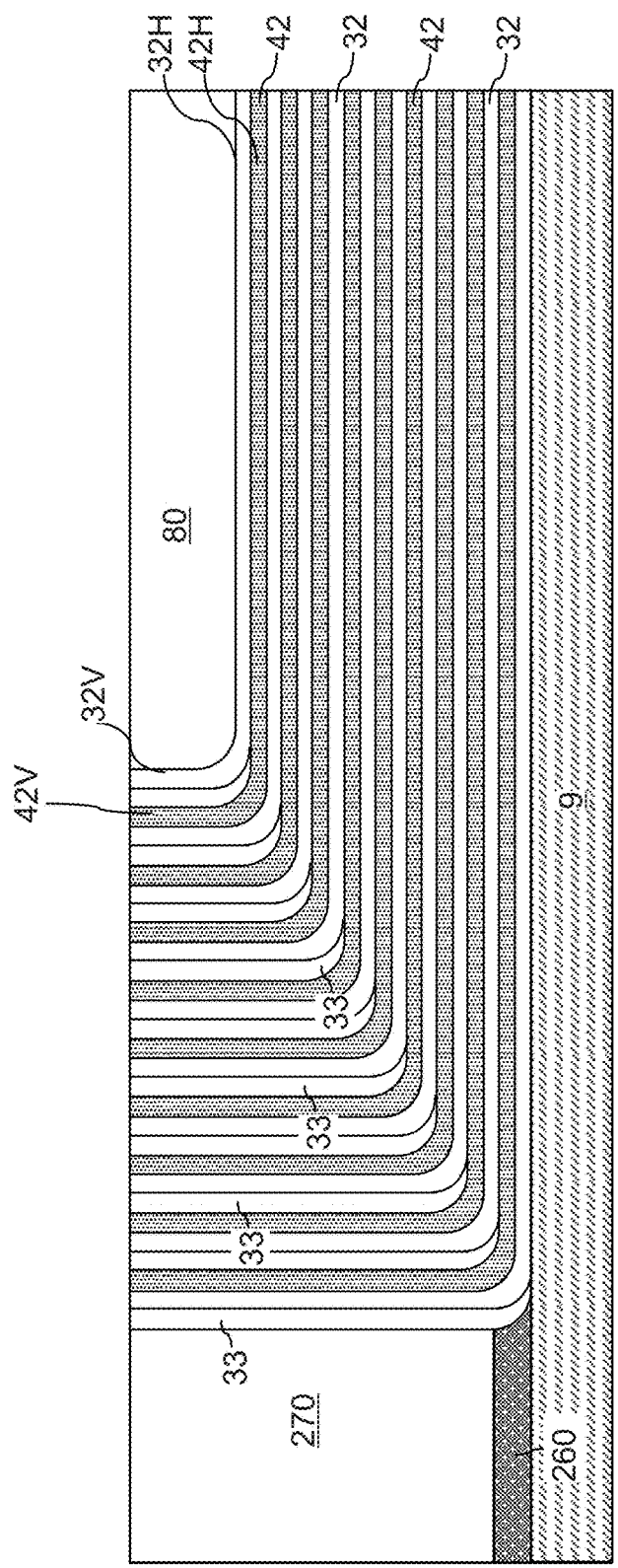
FIG. 12 is a schematic vertical cross-sectional view of the first exemplary structure after a planarization process that forms L-shaped insulating layers and L-shaped sacrificial material layers according to the first embodiment of the present disclosure.

Referring to FIG. 12, the portions of the planarization dielectric layer 80, the alternating stack (32', 42') and the dielectric spacers 33 interspersed therein, and the planarization stopping structure 280 can be removed from above the horizontal plane including the top surface of the upper template structure 270. In one embodiment, a chemical mechanical planarization process can be performed employing the planarization stopping structure 280 as a stopping structure. Over-polishing can be performed to remove additional portions of the planarization dielectric layer 80 and the alternating stack (32', 42') and the dielectric spacers 33 from above the horizontal plane including the top surface of the upper template structure 270. Alternatively or additionally, a recess etch can be performed instead of, or in addition to, the over-polishing so that the recessed surfaces of the planarization dielectric layer 80 and the alternating stack (32', 42') and the dielectric spacers 33 are substantially coplanar with the top surface of the upper template structure 270. Any remaining portion of the planarization stopping structure 280, if present, can be removed by an etch process, which can be a reactive ion etch process or an isotropic etch process such as a wet etch process.

Generally, portions of the Z-shaped insulating layers 32', the dielectric spacers 33, and the Z-shaped sacrificial material layers 42' can be removed from above the horizontal plane including the top surface of the mesa structure (260, 270) by a planarization process. An alternating stack of L-shaped insulating layers 32 and L-shaped sacrificial material layers 42 is formed over the substrate and on a sidewall of the mesa structure (260, 270). Each L-shaped insulating layer 32 is a remaining portion of a Z-shaped insulating layer 32', and each L-shaped sacrificial material layer 42 is a remaining portion of a Z-shaped sacrificial material layer 42'. Each of the L-shaped insulating layers 32 and the L-shaped sacrificial material layers 42 includes a respective horizontally-extending portion (32H, 42H) and a respective non-horizontally-extending portion (32V, 42V) having an angle of 60 to 90 degrees with respect to a horizontal direction, such as a vertically-extending portion. In one embodiment, each horizontally-extending portion has a uniform vertical thickness and each non-horizontally-extending portion has a uniform horizontal thickness. The uniform vertical thickness and the uniform horizontal thickness can be the same for each of the L-shaped insulating layers 32 and the L-shaped sacrificial material layers 42. The dielectric spacers 33 are located between neighboring pairs of a vertically-extending portion of an L-shaped insulating layer 32 and a vertically-extending portion of an L-shaped sacrificial material layer 42 after the planarization process.

Figure 13:
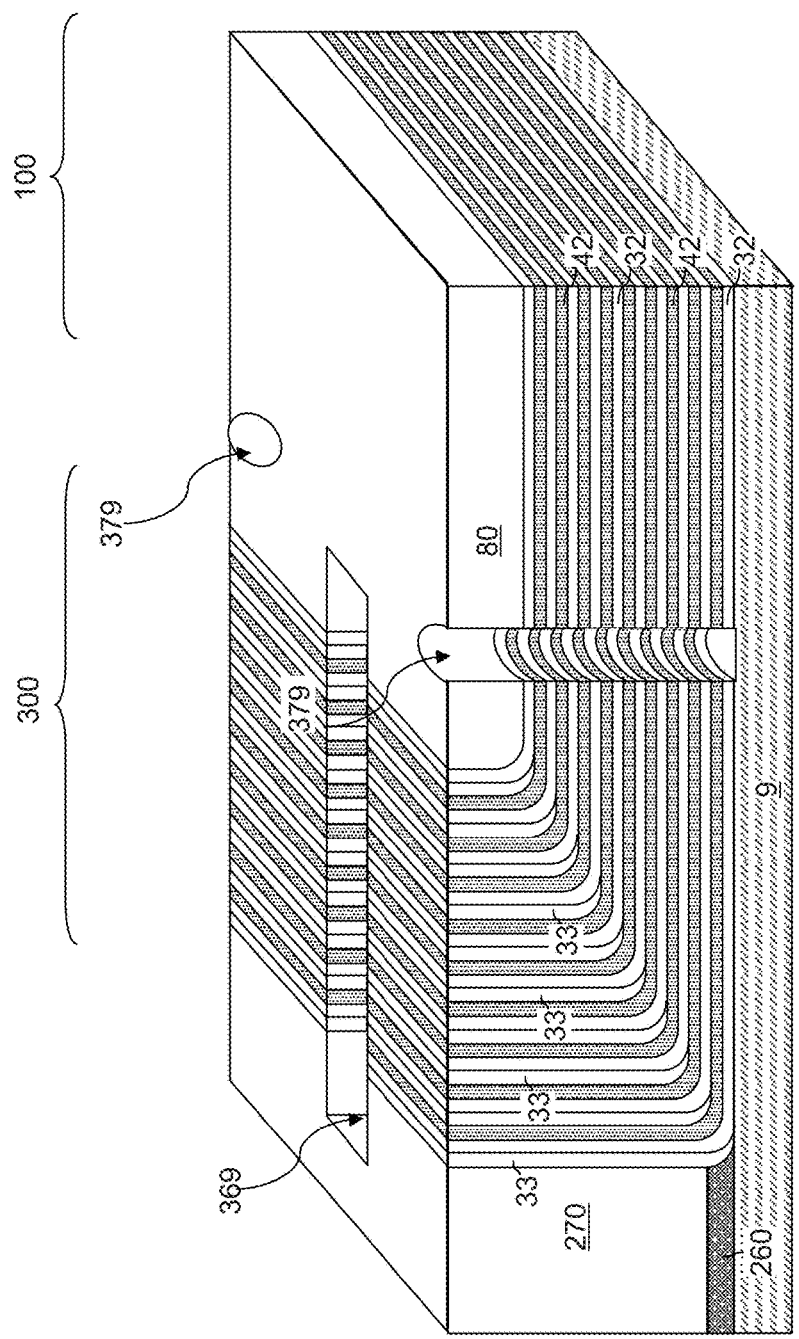
FIG. 13 is a perspective view of the first exemplary structure after formation of various support openings according to the first embodiment of the present disclosure.

Referring to FIG. 13, a photoresist layer (not shown) can be applied over the first exemplary structure, and can be lithographically patterned to form openings therein. The pattern in the photoresist layer can be transferred through the planarization dielectric layer 80, the alternating stack (32, 42) and the dielectric spacers 33, and the mesa structure (260, 270) by an anisotropic etch process. Support openings (369, 379) are formed through the alternating stack (32, 42) and the dielectric spacers 33, and the mesa structure (260, 270). The support openings (369, 379) can include trench-type support openings 369 that laterally extend along a respective lengthwise direction, and cylindrical-type support openings 379 that have a respective generally cylindrical shape.

In one embodiment, at least one of the trench-type support openings 369 can laterally extend through the entire width of the vertically-extending portions of the alternating stack (32, 42) of L-shaped insulating layers 32 and L-shaped sacrificial material layers 42 and the dielectric spacers 33 in the contact region 300. In this case, sidewalls of at least one of the trench-type support openings 369 can include sidewalls of the planarization dielectric layer 80, sidewalls of the horizontally-extending portions (32H, 42H) of the alternating stack (32, 42), sidewalls of the mesa structure (260, 270), and sidewalls of the non-horizontally-extending portions (e.g., vertically-extending portions) (32V, 42V) of the alternating stack (32, 42) of L-shaped insulating layers 32 and L-shaped sacrificial material layers 42 and the dielectric spacers 33.

In one embodiment, the cylindrical-type support openings 379 can be formed within a peripheral portion of the contact region 300 and/or a peripheral portion of the memory array region 100. In one embodiment, the sidewalls of the cylindrical-type support openings 379 can consist of sidewalls of the planarization dielectric layer 80, sidewalls of the horizontally-extending portion of the alternating stack (32, 42), and optionally sidewalls of the substrate semiconductor layer 9 if the cylindrical-type support openings 379 extend into the substrate semiconductor layer 9. The photoresist layer can be subsequently removed, for example, by ashing.

Figure 14:
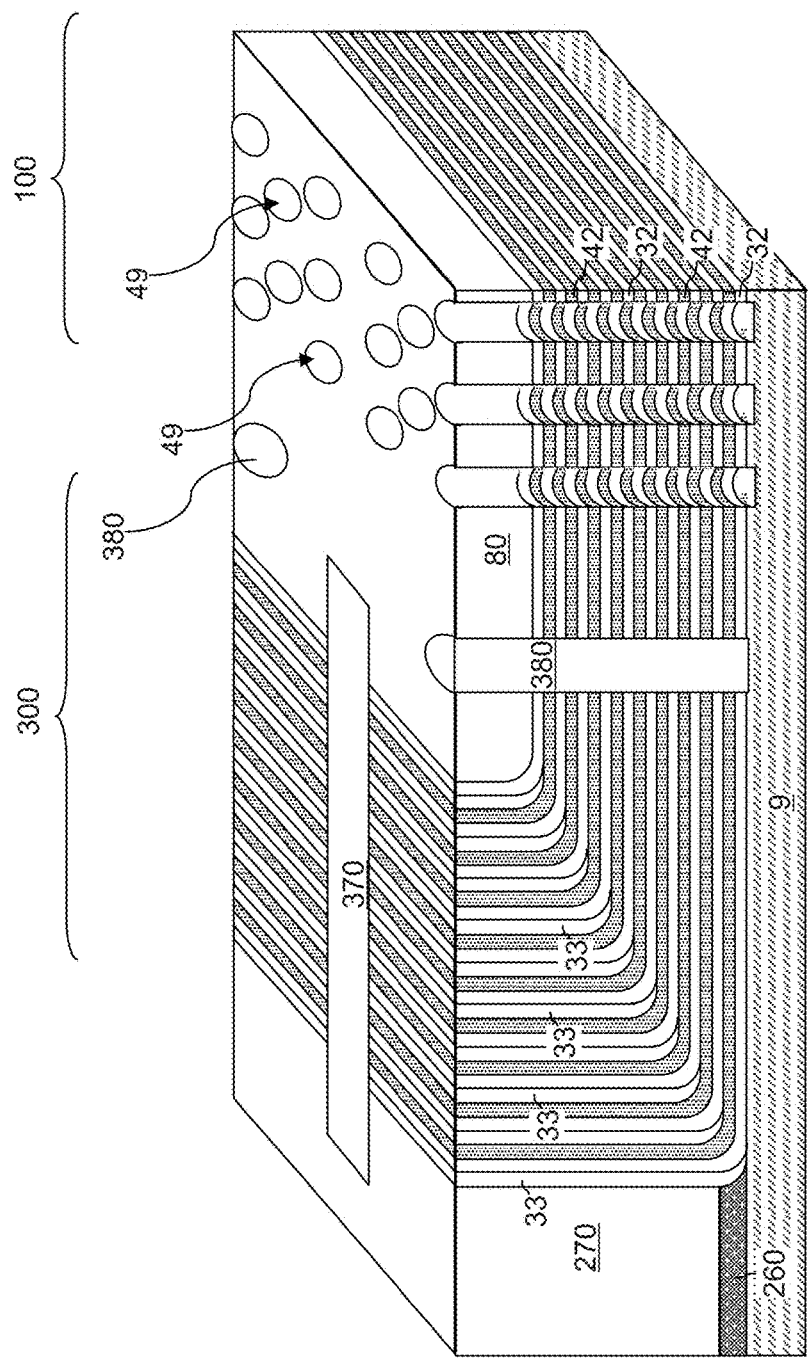
FIG. 14 is a perspective view of the first exemplary structure after formation of a first dielectric wall structure and dielectric support pillar structures and formation of memory openings according to the first embodiment of the present disclosure.

Referring to FIG. 14, a dielectric material such as silicon oxide is deposited in the support openings (369, 379), for example, by spin-coating or a conformal deposition process. The deposited dielectric material may be removed from above the horizontal plane including the top surface of the planarization dielectric layer 80 by a planarization process, which can employ chemical mechanical planarization and/or a recess etch. Each portion of the deposited dielectric material within a trench-type support opening 369 constitutes a dielectric wall support structure, which is herein referred to as a first dielectric wall structure 370. Each first dielectric wall structure 370 is a support structure including a dielectric material and having a wall configuration, i.e., a pair of parallel sidewalls that horizontally extend along a lengthwise direction. Each portion of the deposited dielectric material within a cylindrical-type support opening 379 is a support structure including a dielectric material, and is herein referred to as a support pillar structure 380. Each of the first dielectric wall structures 370 and the support pillar structures 380 can have straight sidewalls that extend vertically from the top surface of the planarization dielectric layer 80 to the substrate semiconductor layer 9. The first dielectric wall structure 370 are formed through the vertically-extending portions of the L-shaped insulating layers 32 and the L-shaped sacrificial material layers 42 of the alternating stack (32, 42).

Subsequently, a lithographic material stack (not shown) including at least a photoresist layer can be formed over the first exemplary structure, and can be lithographically patterned to form openings within the memory array region 100. The pattern in the lithographic material stack can be transferred through the planarization dielectric layer 80 and through horizontally-extending portions of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

Figure 15:
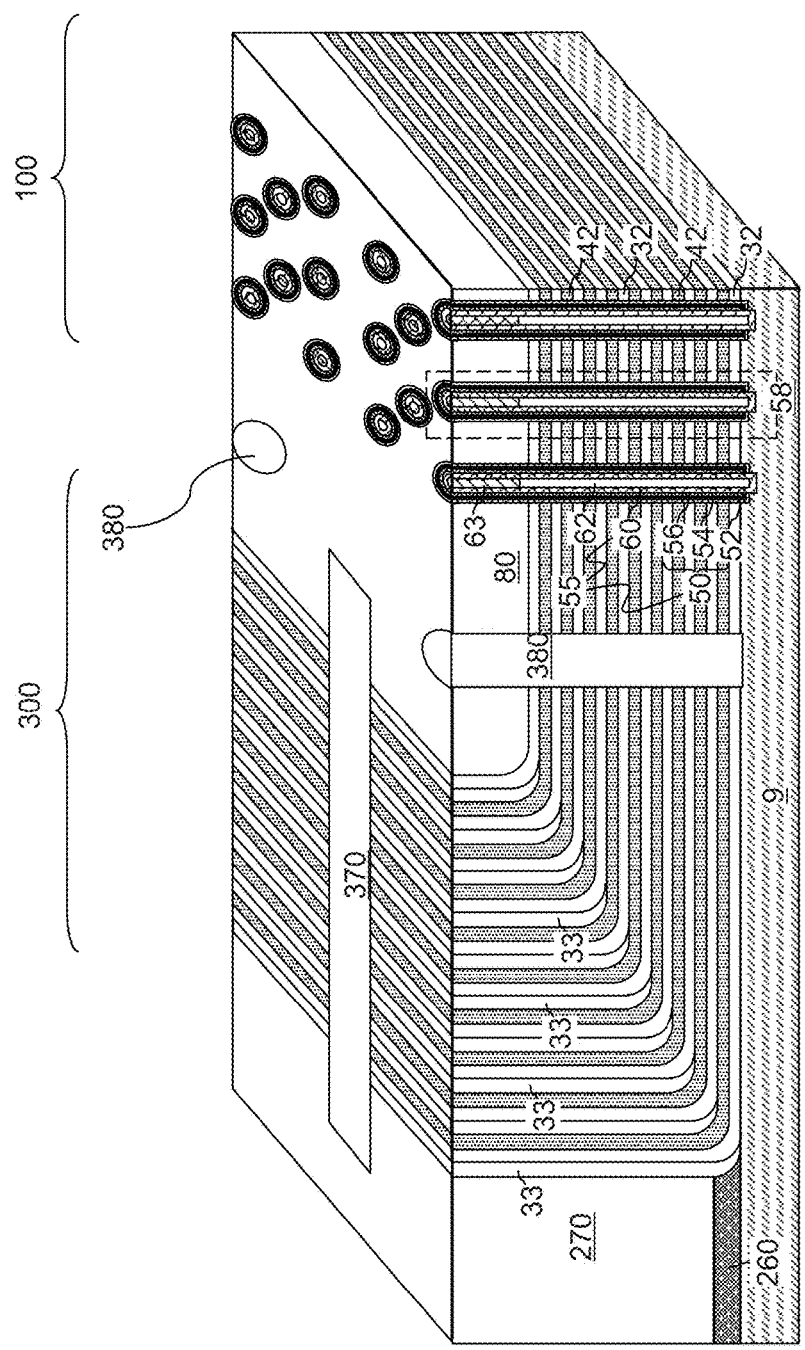
FIG. 15 is a perspective view of the first exemplary structure after formation of memory opening fill structures according to the first embodiment of the present disclosure.

Referring to FIG. 15, a memory opening fill structure 58 is formed within each memory opening 49. Each memory opening fill structure 58 includes a memory stack structure 55, an optional dielectric core 62, and a drain region 63.

For example, a memory film 50 including a blocking dielectric layer 52, a charge storage layer 54, and a tunneling dielectric layer 56 can be sequentially deposited in each of the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within backside recesses into sacrificial material layers 42. In one embodiment, the charge storage layer 54 includes a silicon nitride layer. In one embodiment, the L-shaped sacrificial material layers 42 and the L-shaped insulating layers 32 can have vertically coincident sidewalls, and the charge storage layer 54 can be formed as a single continuous layer.

In another embodiment, the L-shaped sacrificial material layers 42 can be laterally recessed with respect to the sidewalls of the L-shaped insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

An optional first semiconductor channel layer (not expressly shown) may be deposited on the tunneling dielectric. The optional first semiconductor channel layer, the tunneling dielectric layer 56, the charge storage layer 54, and the blocking dielectric layer 52 are sequentially anisotropically etched employing at least one anisotropic etch process. The portions of the optional first semiconductor channel layer, the tunneling dielectric layer 56, the charge storage layer 54, and the blocking dielectric layer 52 located above the top surface of the planarization dielectric layer 80 can be removed by the at least one anisotropic etch process or a chemical mechanical planarization (CMP) process. Further, the horizontal portions of the optional first semiconductor channel layer, the tunneling dielectric layer 56, the charge storage layer 54, and the blocking dielectric layer 52 at a bottom of each memory opening 49 can be removed to form openings in remaining portions thereof. A semiconductor surface of the substrate semiconductor layer 9 can be physically exposed at the bottom of each memory opening 49.

A semiconductor channel material layer can be deposited directly on the semiconductor surface of the substrate semiconductor layer 9. If the optional first semiconductor channel layer is present, then the semiconductor channel material layer comprises a second semiconductor channel layer formed on a surface of the optional first semiconductor channel layer. If the optional first semiconductor channel layer is not present, then the semiconductor channel material layer is formed directly on the tunneling dielectric layer 56. The semiconductor channel material layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer includes amorphous silicon or polysilicon. The semiconductor channel material layer can be formed by a conformal deposition method such as low pressure chemical vapor deposition (LPCVD). The thickness of the semiconductor channel material layer can be in a range from 2 nm to 10 nm, although lesser and greater thicknesses can also be employed. The semiconductor channel material layer may partially or fully fill the cavities in the memory openings 49. Any remaining semiconductor material of the semiconductor channel material layer located above the top surface of the planarization dielectric layer 80 can be removed by a planarization process, which can employ a recess etch or chemical mechanical planarization (CMP). Each remaining portion of the semiconductor channel material layer in the memory openings 49 constitutes a vertical semiconductor channel 60.

In case the cavities in each memory opening 49 are not completely filled by the vertical semiconductor channel 60, a dielectric core layer can be deposited in the cavity to fill any remaining portion of the cavity within each memory opening 49. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. Subsequently, the horizontal portion of the dielectric core layer can be removed, for example, by a recess etch from above the top surface of the planarization dielectric layer 80. Each remaining portion of the dielectric core layer in the memory openings 49 constitutes a dielectric core 62.

Each vertical semiconductor channel 60 formed in the memory openings 49 is a channel of a vertical field effect transistor through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each contiguous set of a blocking dielectric layer 52, a charge storage layer 54, and a tunneling dielectric layer 56 within a memory opening 49 collectively constitutes a memory film 50, which can store electrical charges with a macroscopic retention time.

In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours. Each combination of a memory film 50 and a vertical semiconductor channel 60 located within a same memory opening 49 constitutes a memory stack structure 55.

The top surface of each dielectric core 62 can be further recessed within each memory opening, for example, by a recess etch to a depth that is located between the top surface of the planarization dielectric layer 80 and the bottom surface of the planarization dielectric layer 80. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the planarization dielectric layer 80, for example, by chemical mechanical planarization (CMP) or a recess etch to form the drain regions 63. Each combination of a memory film 50 and a vertical semiconductor channel 60 within a memory opening 49 constitutes a memory stack structure 55.

Figure 16:
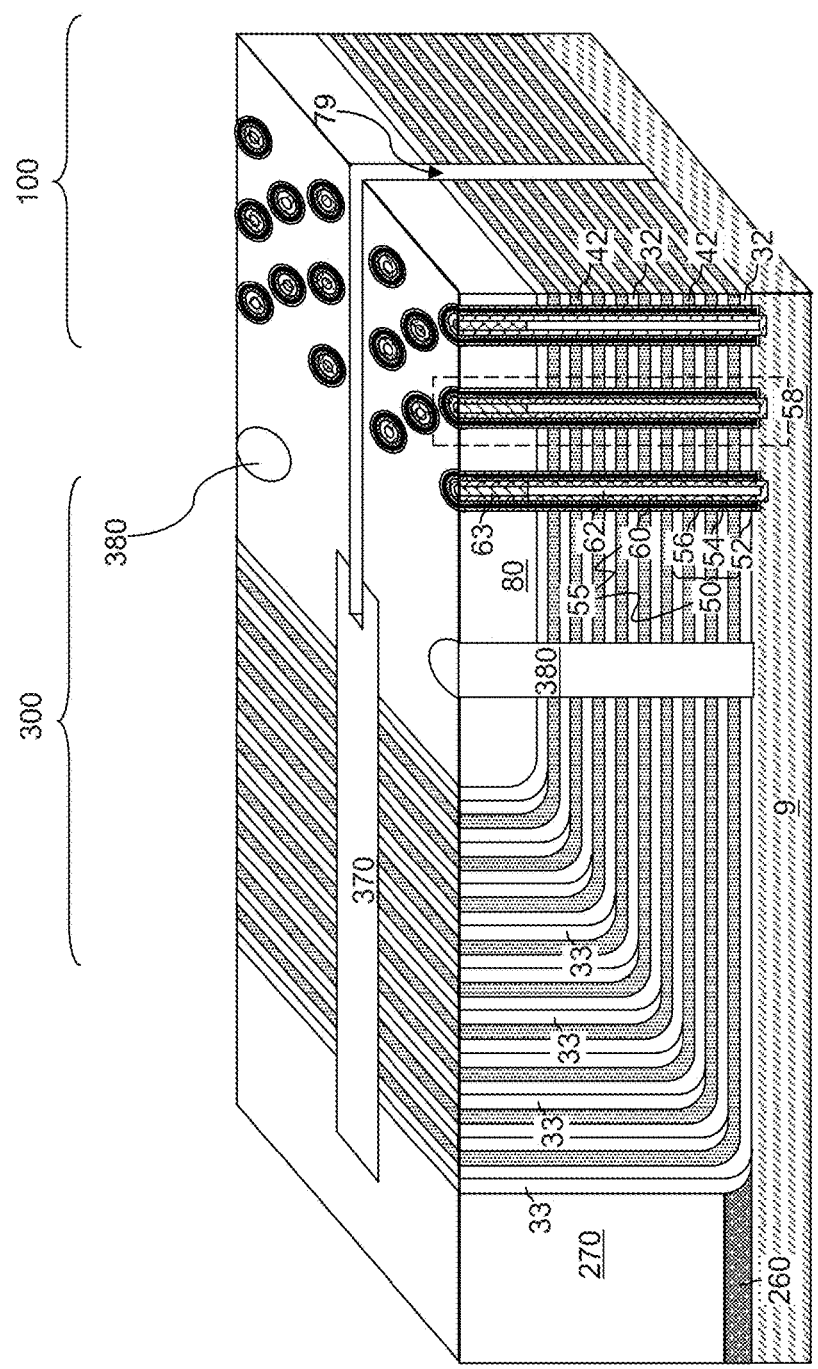
FIG. 16 is a perspective view of the first exemplary structure after formation of a backside trench according to the first embodiment of the present disclosure.

Referring to FIG. 16, a photoresist layer (not shown) can be applied over the alternating stack (32, 42), and is lithographically patterned to form at least one elongated opening between clusters of memory stack structures 55 within the memory array region 100. The pattern in the photoresist layer can be transferred through the planarization dielectric layer 80 and the alternating stack (32, 42) employing an anisotropic etch to form at least one backside trench 79, which extends at least to the top surface of the substrate semiconductor layer 9. In one embodiment, the at least one backside trench 79 can be adjoined a respective one of the first dielectric wall structures 370. In one embodiment, the at least one backside trench 79 can include a source contact opening in which a source contact via structure can be subsequently formed. The photoresist layer can be subsequently removed, for example, by ashing.

Figure 17:
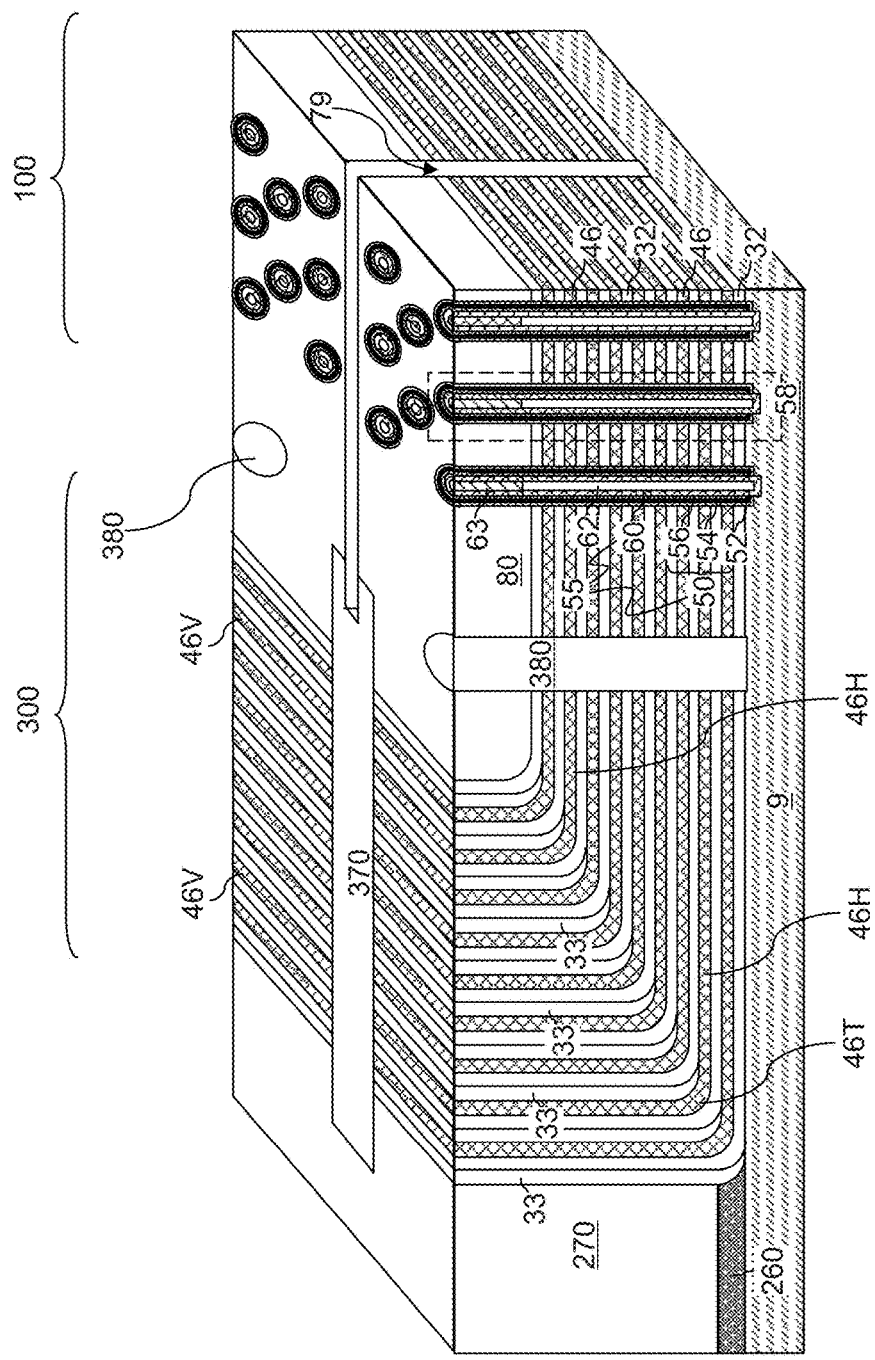
FIG. 17 is a perspective view of the first exemplary structure after replacement of L-shaped sacrificial material layer with L-shaped electrically conductive layers according to the first embodiment of the present disclosure.

Referring to FIG. 17, the L-shaped sacrificial material layers 46 can be replaced with L-shaped electrically conductive layers 46. For example, an etchant that selectively etches the material of the L-shaped sacrificial material layers 42 with respect to the material of the L-shaped insulating layers 32 can be introduced into the at least one backside trench 79, for example, employing an etch process. Backside recesses are formed in volumes from which the L-shaped sacrificial material layers 42 are removed. The removal of the material of the L-shaped sacrificial material layers 42 can be selective to the material of the L-shaped insulating layers 32, the semiconductor material of the substrate semiconductor layer 9, and the material of the outermost layer of the memory films 50. In one embodiment, the L-shaped sacrificial material layers 42 can include silicon nitride, and the L-shaped insulating layers 32 include silicon oxide.

The etch process that removes the material selective to the material and the outermost layer of the memory films 50 can be a wet etch process employing a wet etch solution, or can be a gas phase (dry) etch process in which the etchant is introduced in a vapor phase into the at least one backside trench 79. For example, if the L-shaped sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The first dielectric wall structures 370, the support pillar structures 380, and the memory stack structures 55 provide structural support to prevent collapse of the L-shaped insulating layers 32 while the backside recesses are present within volumes previously occupied by the L-shaped sacrificial material layers 42.

Each backside recess can include a horizontally-extending portion and a non-horizontally-extending portion, which may extend vertically or substantially vertically. Each backside recess extends to the horizontal plane including the top surface of the planarization dielectric layer 80, the top surface of the mesa structure (260, 270), and the top surfaces of the first dielectric wall structures 370 and the support pillar structures 380. A plurality of backside recesses can be formed in the volumes from which the material of the L-shaped sacrificial material layers 42 is removed. The memory openings in which the memory stack structures 55 are formed are herein referred to as front side openings or front side cavities in contrast with the backside recesses. In one embodiment, the memory array region 100 comprises an array of monolithic three-dimensional NAND strings having a plurality of device levels disposed above the substrate semiconductor layer 9. In this case, each backside recess can define a space for receiving a respective word line of the array of monolithic three-dimensional NAND strings.

Each horizontally-extending portion of the backside recesses can extend substantially parallel to the top surface of the substrate semiconductor layer 9. Each horizontally-extending portion of the backside recesses can be vertically bounded by a top surface of an underlying insulating layer 32 and a bottom surface of an overlying insulating layer 32. In one embodiment, each horizontally-extending portion of the backside recesses can have a uniform height throughout.

Each non-horizontally-extending portion of the backside recesses can extend at an angle of 60 to 90 degrees with respect to a horizontal direction, such as vertically or substantially vertically (e.g., within 5 degrees of vertical). Each non-horizontally-extending portion of the backside recesses can be laterally bounded by a sidewall of a vertically-extending portion of an L-shaped insulating layer 32 and a sidewall of a dielectric spacer 33 (if present). In one embodiment, each non-horizontally-extending portion of the backside recesses can have a uniform width throughout, which can be the same as the uniform height of an adjoining horizontally-extending portion of the same backside recess.

Optionally, a backside blocking dielectric layer (not shown) can be optionally formed. The backside blocking dielectric layer, if present, comprises a dielectric material that functions as a control gate dielectric for the control gates to be subsequently formed in the backside recesses. In case the blocking dielectric layer 52 is present within each memory opening, the backside blocking dielectric layer is optional. In case the blocking dielectric layer 52 is omitted, the backside blocking dielectric layer is present. The backside blocking dielectric layer can be formed in the backside recesses and on a sidewall of the backside trench 79. The backside blocking dielectric layer can be formed directly on horizontal surfaces of the L-shaped insulating layers 32 and sidewalls of the memory stack structures 55 within the backside recesses. In one embodiment, the backside blocking dielectric layer can be formed by a conformal deposition process such as atomic layer deposition (ALD). The backside blocking dielectric layer can consist essentially of aluminum oxide. The thickness of the backside blocking dielectric layer can be in a range from 1 nm to 15 nm, such as 2 to 6 nm, although lesser and greater thicknesses can also be employed.

The dielectric material of the backside blocking dielectric layer can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. A backside cavity is present within the portion of each backside trench 79 that is not filled with the backside blocking dielectric layer.

At least one conductive material is deposited within the backside recesses to form electrically conductive layers 46. The at least one conductive material deposited in the at least one backside trench 79 and over the planarization dielectric layer 80 constitutes a continuous conductive material layer (not shown) that is subsequently removed. A backside cavity is present within each backside trench 79. The at least one conductive material can include, for example, a metallic liner material such as a conductive metal nitride (e.g., TiN, TaN, or WN) and a metallic fill material that consists essentially of at least one metal. The metallic fill material can consist essentially of a single elemental metal (such as Cu, Co, W, or Al) or an intermetallic alloy of at least two elemental metals. In one embodiment, the at least one conductive material can include a titanium nitride liner and a tungsten fill material. The at least one conductive material can be deposited by a conductive deposition process such as chemical vapor deposition (CVD) and/or atomic layer deposition (ALD). The at least one conductive material fills each of the backside recesses. Each continuous portion of the deposited at least one conductive material located within a backside recess constitutes an electrically conductive layer 46. Each electrically conductive layer 46 can include an optional metallic liner portion that include the metallic liner material and a metallic fill portion that includes the metallic fill material.

The continuous conductive material layer (i.e., the continuous portion of the at least one conductive material deposited in the at least one backside trench 79 or over the horizontal plane including the top surfaces of the planarization dielectric layer 80 and the mesa structure (260, 270)) can be removed by an etch process, which may be an isotropic etch process. Each of the L-shaped electrically conductive layers 46 comprises a respective continuously-extending conductive material portion of a homogeneous composition that includes a respective horizontally-extending portion 46H that extend parallel to the top surface of the substrate semiconductor layer 9 and a respective non-horizontally-extending portion (such as a vertically extending portion) 46V that extends parallel to the at least one sidewall of the mesa structure (260, 270). In one embodiment, each of the L-shaped electrically conductive layers 46 further comprises a tapered portion 46T which extends in a direction between the vertical and horizontal directions (e.g., at an angle of 10 to 80 degrees with respect to the horizontal direction) and which connects respective vertically-extending 46V and horizontally-extending portions 46H of the respective L-shaped electrically conductive layers 46. The tapered portion 46T of each electrically conductive layer 46 is formed over the tapered sidewall 260T of the lower template layer 260L of the mesa structure (260, 270). As used herein, a "continuously-extending" element or an "integral" refers to an element that consists of a single continuous structure such that each point within the structure can be connected to any other point within the structure by a line that is contained entirely within the volume of the structure. As used herein, a "homogeneous composition" refers to a composition that is the same throughout the entirety of an element.

Specifically, each metallic liner portion within the L-shaped electrically conductive layers 46 is a continuously-extending conductive material portion of a homogeneous composition that includes a respective horizontally-extending portion 46H that extend parallel to the top surface of the substrate semiconductor layer 9 and a respective non-horizontally-extending portion 46V that extend parallel to the at least one sidewall of the mesa structure (260, 270). Further, each metallic fill portion within the L-shaped electrically conductive layers 46 is a continuously-extending conductive material portion of a homogeneous composition that includes a respective horizontally-extending portion that extend parallel to the top surface of the substrate semiconductor layer 9 and a respective non-horizontally-extending portion that extend parallel to the at least one sidewall of the mesa structure (260, 270). Each of the continuously-extending conductive material portions, as embodied as a metallic liner portion or as a metallic fill portion, is free of any physical interface therein. As used herein, a "physical interface" in an element refers to a region including at least one physically observable inhomogeneity therein such as an interfacial compositional change or an interfacial microstructural change.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 18:
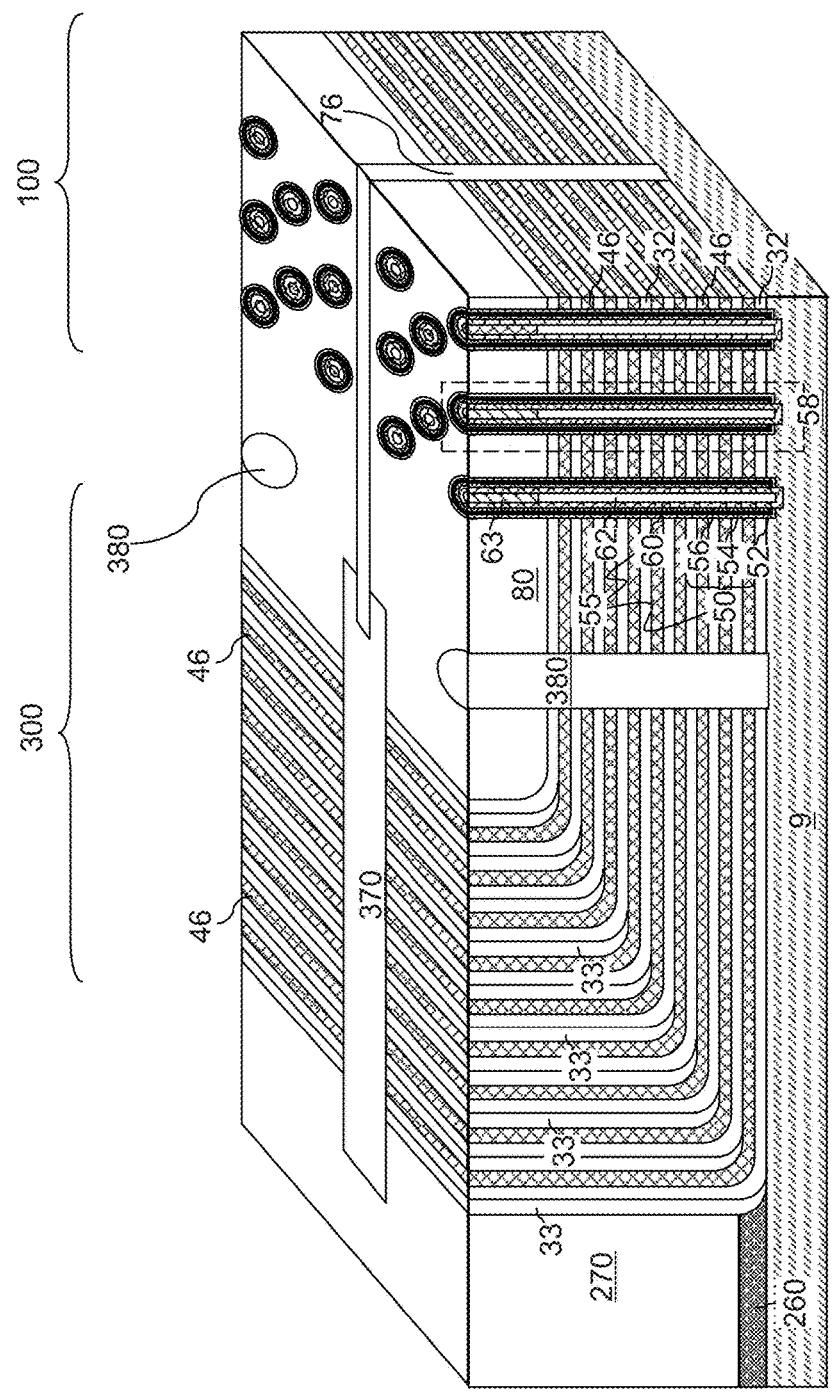
FIG. 18 is a perspective view of the first exemplary structure after formation of a second dielectric wall structure according to the first embodiment of the present disclosure.

Referring to FIG. 18, a dielectric material such as doped silicate glass or undoped silicate glass can be deposited in the at least one backside trench 79 by a conformal deposition process such as chemical vapor deposition. Excess portions of the deposited dielectric material may, or may not, be removed from above the top surface of the planarization dielectric layer 80. A second dielectric wall structure 76 is formed within each of the at least one backside trench 79. Each second dielectric wall structure 76 is formed through the horizontally-extending portions of the L-shaped insulating layers 32 and the L-shaped electrically conductive layers 46, which form an alternating stack (32, 46). In one embodiment, a second dielectric wall structure 76 can contact a sidewall of a first dielectric wall structure 370. In an alternative embodiment, a source region is implanted through the backside trench 79 into the substrate semiconductor layer 9, and the dielectric wall structure 370 comprises a dielectric spacer. In this alternative embodiment, an electrically conductive source line or source electrode is formed inside the dielectric wall structure 370 in contact with the source region.

Figure 19:
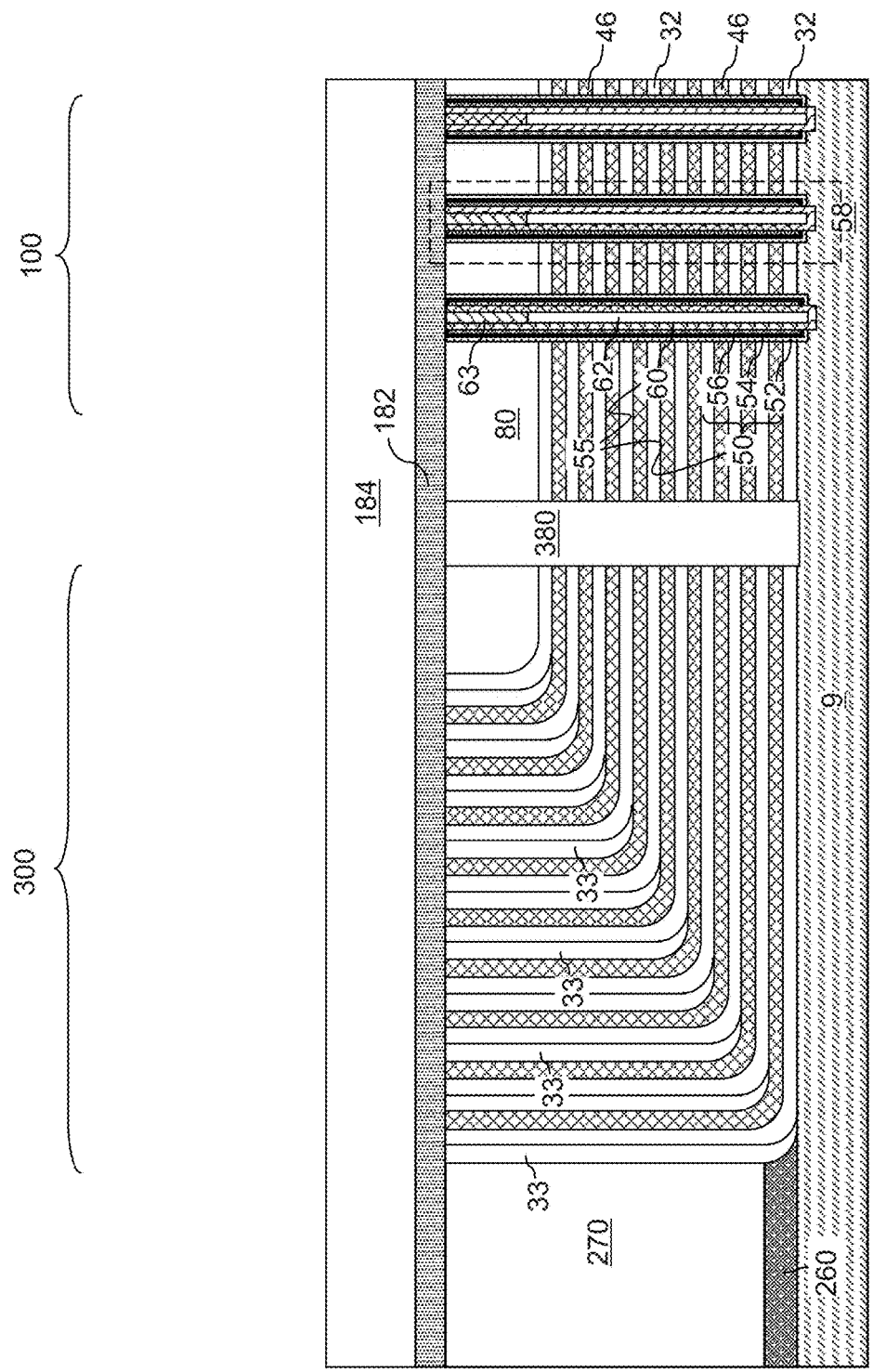
FIG. 19 is a vertical cross-sectional view of the first exemplary structure after formation of at least one contact level dielectric layer according to the first embodiment of the present disclosure.

Referring to FIG. 19, at least one contact level dielectric layer (182, 184) can be formed over the top surface of the planarization dielectric layer 80, over the vertically-extending portions of the alternating stack (32, 46) and the optional dielectric spacers 33, and the mesa structure (260, 270). In case the dielectric material that fills the at least one backside trench is not removed, an additional dielectric material layer may be present between the planarization dielectric layer 80 and the at least one contact level dielectric layer (182, 184). Alternatively, a horizontal portion of the dielectric material that fills the at least one backside trench may remain over the planarization dielectric layer 80, and may be employed in lieu of all, or a part of, the at least one contact level dielectric layer (182, 184).

In an illustrative example, the at least one contact level dielectric layer (182, 184) can include a first contact level dielectric layer 182 and a second contact level dielectric layer 184. The first contact level dielectric layer 182 can include silicon nitride, and can have a thickness in a range from 10 nm to 100 nm. The second contact level dielectric layer 184 can include silicon oxide, and can have a thickness in a range from 100 nm to 1,000 nm.

Figure 20:
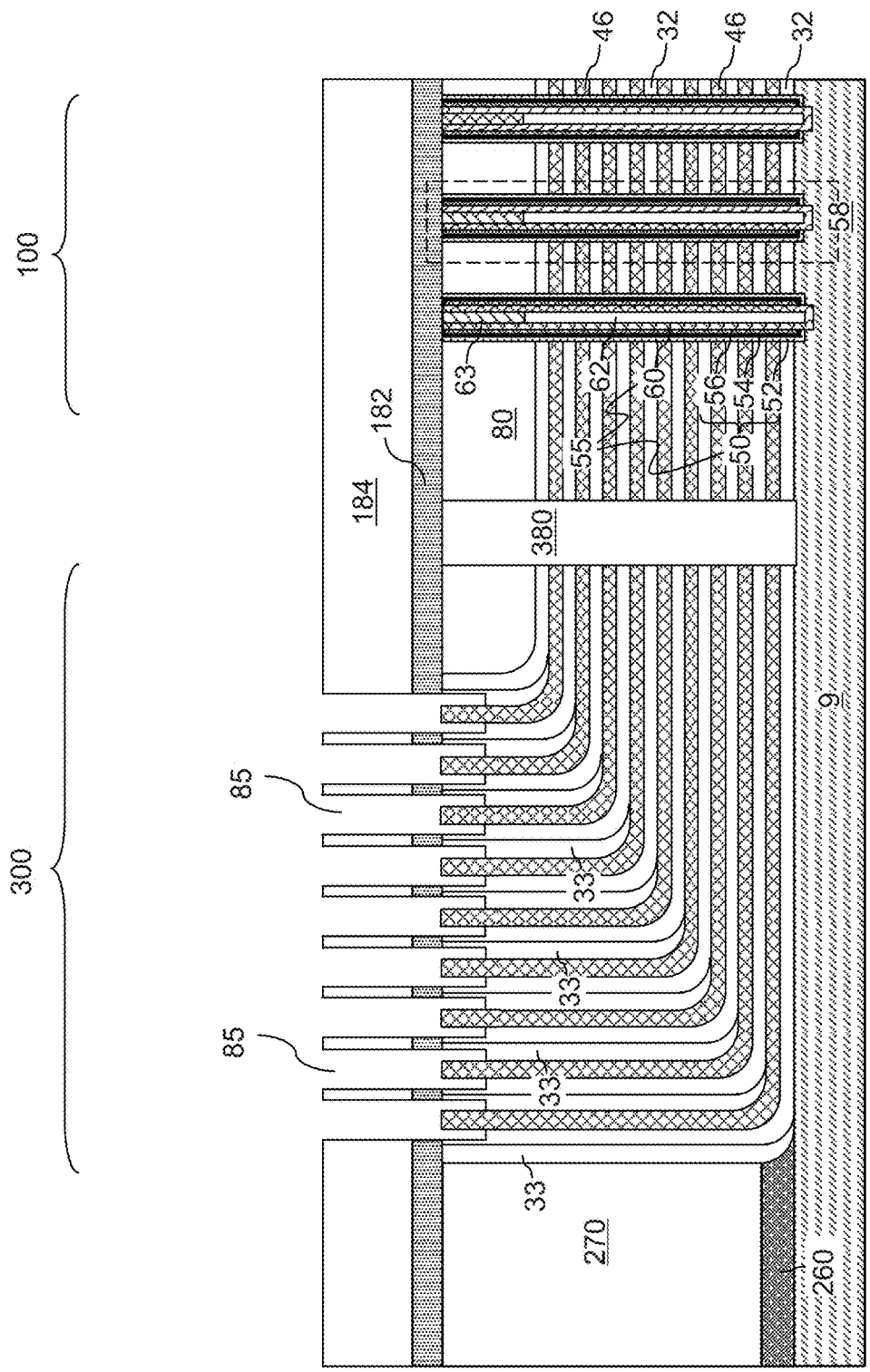
FIG. 20 is a vertical cross-sectional view of the first exemplary structure after formation of word line contact via cavities according to the first embodiment of the present disclosure.

Referring to FIG. 20, a photoresist layer (not shown) can be applied over the at least one contact level dielectric layer (182, 184), and can be lithographically patterned to form openings in the contact region 300. The openings in the photoresist layer can be formed in areas that overlie the vertically-extending portions of the L-shaped electrically conductive layers 46. The pattern in the photoresist layer can be transferred through the at least one contact level dielectric layer (182, 184) and optionally partly through the vertically-extending portions of the L-shaped insulating layers 32 and the dielectric spacers 33. Contact via cavities are formed through the at least one contact level dielectric layer (182, 184) and into upper regions of the vertically-extending portions of the L-shaped insulating layers 32 and the dielectric spacers 33. The contact via cavities are herein referred to as word line contact via cavities 85.

At least a top surface of a respective one of the non-horizontally-extending portions, such as vertically-extending portions of the L-shaped electrically conductive layers 46 is physically exposed at a bottom of each of the word line contact via cavities 85. The lateral dimensions of the word line contact via cavities 85 can be greater than the lateral thickness of the non-horizontally-extending portions, such as vertically-extending portions of the L-shaped electrically conductive layers 46 along the direction of alternation of the non-horizontally-extending portions, such as vertically-extending portions of the L-shaped insulating layers 32 and the L-shaped electrically conductive layers 46. In this case, a pair of sidewalls of the respective one of the non-horizontally-extending portions, such as vertically-extending portions of the L-shaped electrically conductive layers 46 can be physically exposed within each of the word line contact via cavities 85. Further, a sidewall of a non-horizontally-extending portion, such as vertically-extending portion of an L-shaped insulating layer 32 and a sidewall of a dielectric spacer 33 (or another insulating layer 32 if the dielectric spacer 33 is omitted) can be physically exposed at the bottom of each of the word line contact via cavities 85. The photoresist layer can be subsequently removed, for example, by ashing.

Figure 21:
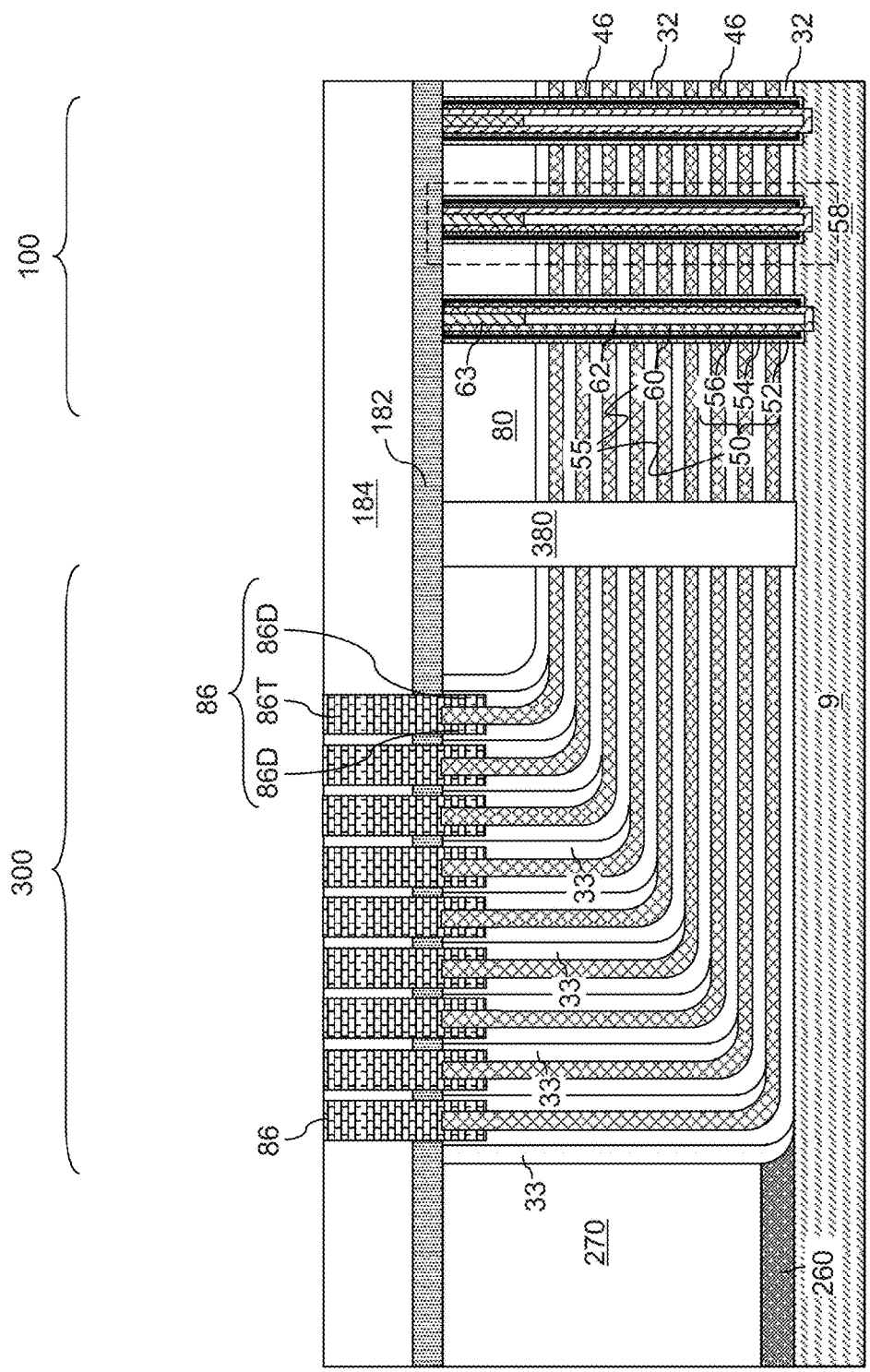
FIG. 21 is a vertical cross-sectional view of the first exemplary structure after formation of contact via structures according to the first embodiment of the present disclosure.

Referring to FIG. 21, at least one conductive material can be deposited in each of the word line contact via cavities 85. The at least one conductive material can include, for example, an optional metallic nitride liner material (such as TiN) and a metallic fill material (such as copper or tungsten). Excess portions of the at least one conductive material can be removed from above the top surface of the at least one contact level dielectric layer (182, 184) by a planarization process such as a recess etch. Each remaining portion of the at least one conductive material in the word line contact via cavities 85 constitutes a contact via structure, which is herein referred to as a word line contact via structure 86.

Each word line contact via structure 86 on a respective one of non-horizontally-extending portions, such as vertically-extending portions of the L-shaped electrically conductive layers 46. One of more of the contact via structures 86 can include a respective pair of downward-protruding portions 86D that straddle and contact sidewalls of a respective one of the non-horizontally-extending portions, such as vertically-extending portions 46V of the L-shaped electrically conductive layers 46. The respective pair of downward-protruding portions 86D contacts a sidewall of one of the dielectric spacers 33 and a sidewall of one of the non-horizontally-extending portions 32V, such as vertically-extending portions of the L-shaped insulating layers 32. In an alternative embodiment, if the dielectric spacer 33 is omitted, then respective pair of downward-protruding portions 86D contacts sidewalls of a pair of nearest neighbor non-horizontally-extending portions 32V of the L-shaped insulating layers 32. A top portion 86T of the word line contact via structure 86 joins portions 86D and contacts the top surface of the non-horizontally-extending portions 46V of the electrically conductive layers 46. In some embodiments, the word line contact via structures 86 can have the same height thereamongst, which can be greater than the total thickness of the at least one contact level dielectric layer (182, 184).

Figure 22A:
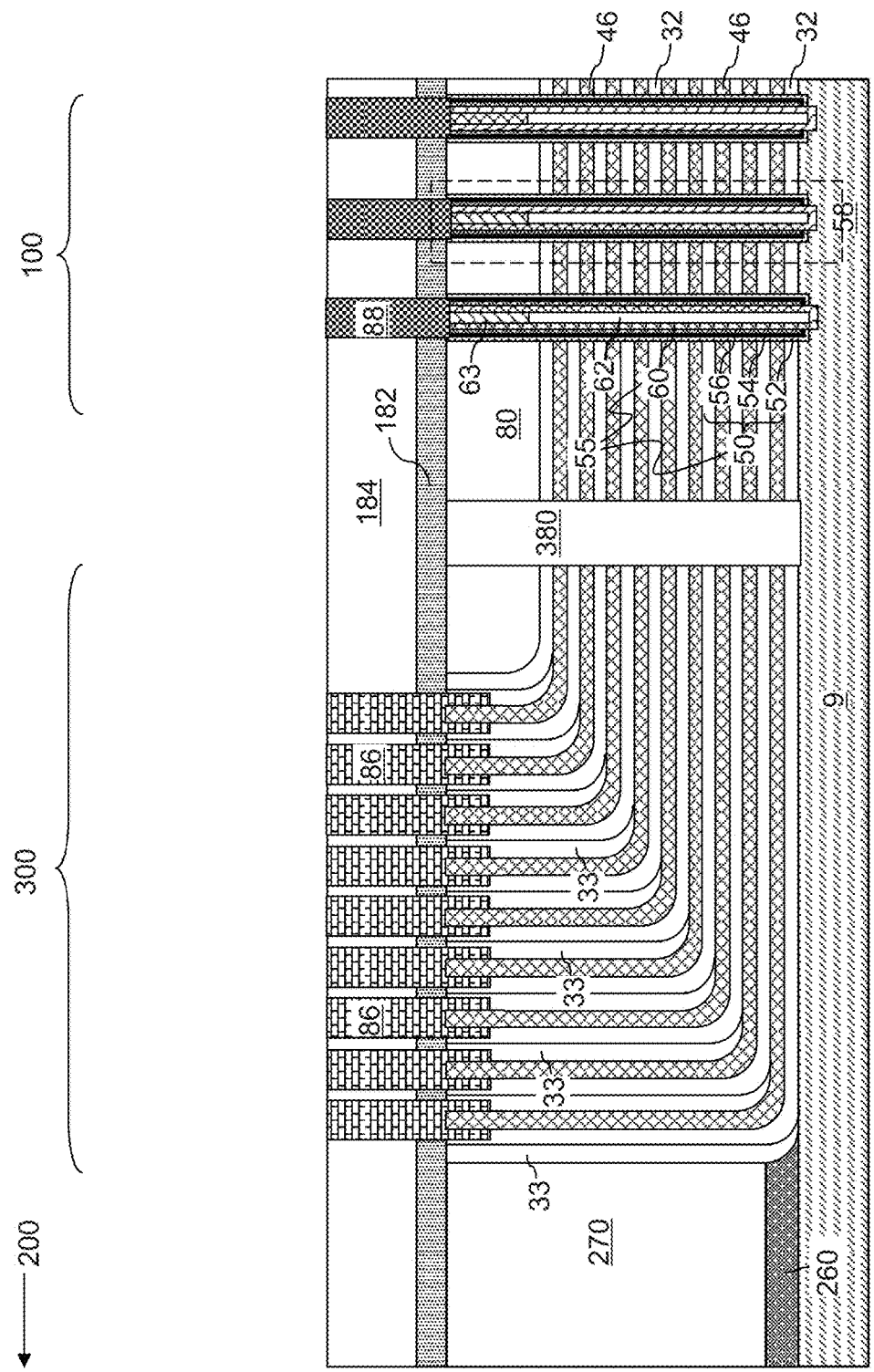
FIG. 22A is a vertical cross-sectional view of the first exemplary structure after formation of array contact via structures according to the first embodiment of the present disclosure.
Figure 22B:
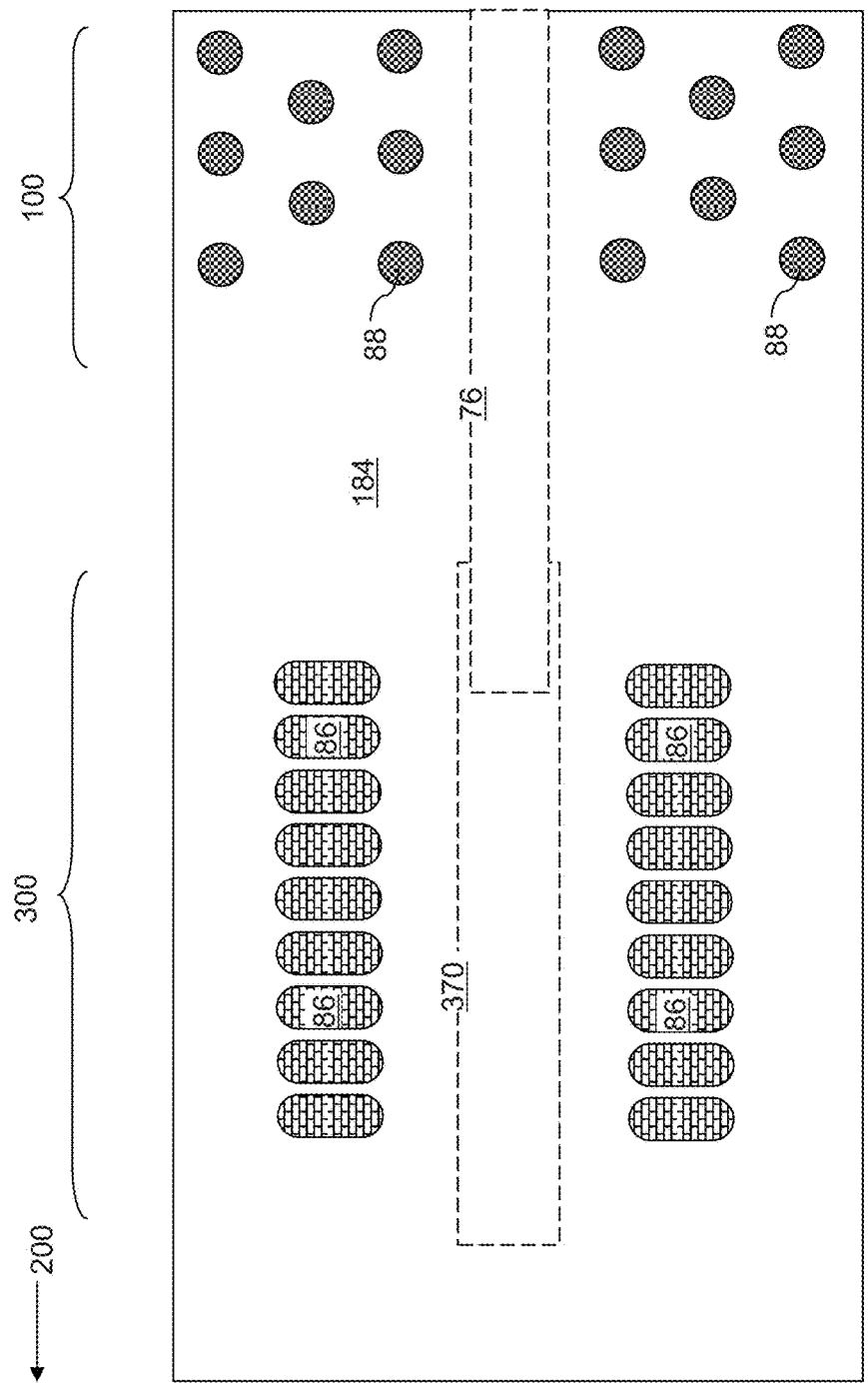
FIG. 22B is a top-down view of the first exemplary structure of FIG. 22A. The plane A-A' is the plane of the cross-section of FIG. 22A.

Referring to FIGS. 22A and 22B, additional contact via structures such as array contact via structures 88 and peripheral device contact via structures (not shown) that contact peripheral devices in the peripheral device region 200 can be formed. The array contact via structures 88 can extend through the at least one contact level dielectric layer (182, 184), and can contact a top surface of a respective one of the drain regions 63. Additional dielectric material layers (not shown) and additional metal interconnect structures (not shown) can be formed above the at least one contact level dielectric layer (182, 184). In one embodiment, the word line contact via structures 86 may be arranged as linear arrays that extend along the horizontal direction that is the same as the thickness direction of the vertically-extending portions of the alternating stack (32, 46).

Figure 23:
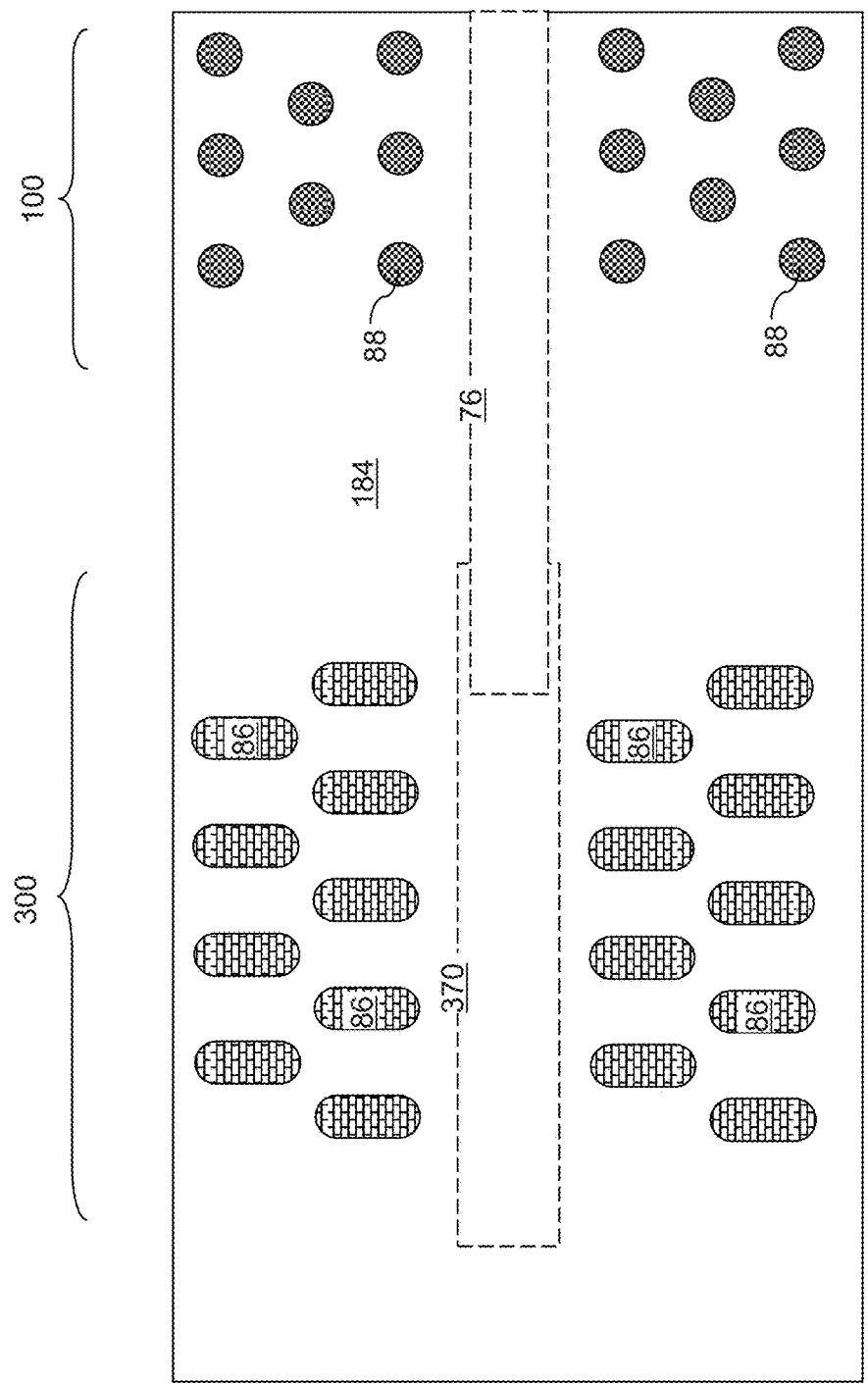
FIG. 23 is a top-down view of an alternative embodiment of the first exemplary structure.

Referring to FIG. 23, an alternative embodiment of the first exemplary structure is illustrated, which can be derived from the first exemplary structure of FIGS. 22A and 22B by forming the word line contact via structures 86 as staggered arrays in which each group of word line contact via structures 86 is arranged in multiple rows.

Referring generally to all drawings of the present disclosure, a three-dimensional memory device includes an alternating stack of L-shaped insulating layers 32 and L-shaped electrically conductive layers 46 located over a top surface 7 of a substrate semiconductor layer 9, such that each of the L-shaped insulating layers 32 and the L-shaped electrically conductive layers 46 includes a respective horizontally-extending portion (32H, 46H) and a respective non-horizontally-extending portion (32V, 46V). Memory stack structures 55 extend through a memory array region 100 of the alternating stack (32, 46) that includes the horizontally-extending portions 32H of the L-shaped electrically conductive layers. Each of the memory stack 55 structures includes a memory film 50 and a vertical semiconductor channel 60. Optional dielectric spacers 33 can be added such that they non-horizontally extend between neighboring pairs of a non-horizontally-extending portion 32V of an L-shaped insulating layer 32 and a non-horizontally-extending portion 46V of an L-shaped electrically conductive layer 46. Contact via structures 86 contact a respective one of the non-horizontally-extending portions 46V of the L-shaped electrically conductive layers 46.

In one embodiment, each respective non-horizontally-extending portion (32V, 46V) of the L-shaped insulating layers 32 and the L-shaped electrically conductive layers 46 extends at angle of 60 to 90 degrees with respect to a horizontal direction which is parallel to the top surface 7 of the substrate semiconductor layer 9. In a non-limiting example, each respective non-horizontally-extending portion (32V, 46V) of the L-shaped insulating layers 32 and the L-shaped electrically conductive layers 46 comprise vertically-extending portions (32V, 46V).

In one embodiment, each respective horizontally-extending portion (32H, 46H) has a uniform vertical thickness and each respective vertically-extending portion (32V, 46V) has a uniform horizontal thickness.

In another embodiment, a mesa structure (260, 270) is located over the substrate semiconductor layer 9. Each respective non-horizontally-extending portion (32V, 46V) of the L-shaped insulating layers 32 and the L-shaped electrically conductive layers 46 is located over a sidewall of the mesa structure.

In one embodiment, each of the L-shaped electrically conductive layers 46 further comprises a tapered portion 46T which extends in a direction between the vertical and horizontal directions (e.g., at an angle of 10 to 80 degrees with respect to the horizontal direction) and which connects respective vertically-extending 46V and horizontally-extending portions 46H of the respective L-shaped electrically conductive layers 46. The tapered portion 46T of each electrically conductive layer 46 is formed over the tapered sidewall 260T of the lower template layer 260L of the mesa structure (260, 270).

In one embodiment, the horizontally-extending portions of the L-shaped electrically conductive layers 46 contact a bottom surface of a respective overlying one of the horizontally-extending portions of the L-shaped insulating layers 32 and a top surface of a respective underlying one of the horizontally-extending portions of the L-shaped insulating layers 32.

In one embodiment, a plurality of the vertically-extending portions of the L-shaped electrically conductive layers 46 contacts a sidewall of a respective one of the L-shaped insulating layers 32 and a sidewall of a respective one of the dielectric spacers 33. In one embodiment, the dielectric spacers 33 have a lateral width that is in a range from 50% to 400% of an average lateral width of the vertically-extending portions of the L-shaped insulating layers 32.

In one embodiment, the contact via structures 86 contact a pair of sidewalls of the respective one of the vertically-extending portions of the L-shaped electrically conductive layers 46. In one embodiment, the contact via structures 86 straddle the respective one of the vertically-extending portions of the L-shaped electrically conductive layers 46 and include a respective pair of downward-protruding portions. In one embodiment, the respective pair of downward-protruding portions contacts a sidewall of one of the dielectric spacers 33 and a sidewall of one of the vertically-extending portions of the L-shaped insulating layers 32.

In one embodiment, at least one contact level dielectric layer (182, 184) can overlie the memory stack structures 55, the vertically-extending portions of the L-shaped insulating layers 32, and the L-shaped electrically conductive layers 46, wherein the contact via structures 86 extend through the at least one contact level dielectric layer (182, 184). In one embodiment, the contact via structures 86 have a same height that is greater than a total thickness of the at least one contact level dielectric layer (182, 184).

In one embodiment, the three-dimensional memory device can comprise: a first dielectric wall structure 370 vertically extending through the vertically-extending portions of the L-shaped insulating layers 32 and the L-shaped electrically conductive layers 46 of the alternating stack (32, 46); and a second dielectric wall structure 76 vertically extending through the horizontally-extending portions of the L-shaped insulating layers 32 and the L-shaped electrically conductive layers 46 of the alternating stack (32, 46).

In one embodiment, the three-dimensional memory structure comprises a vertical NAND memory device. The L-shaped electrically conductive layers 46 can comprise, or can be electrically connected to, a respective word line of the monolithic three-dimensional NAND memory device. The substrate semiconductor layer 9 can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of a charge storage layer 54 at a level of another electrically conductive layer 46) in a second device level of the array of monolithic three-dimensional NAND strings. The silicon substrate can contain an integrated circuit comprising a driver circuit for the memory device located thereon. The L-shaped electrically conductive layers 46 can comprise a plurality of control gate electrodes having a strip shape extending substantially parallel to the top surface of the substrate semiconductor layer 9, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 60), wherein at least one end portion 60 of each of the plurality of semiconductor channels (59, 60) extends substantially perpendicular to a top surface of the substrate semiconductor layer 9; and a plurality of charge storage elements (as embodied as portions of the charge storage layer 54 that are located at each level of the L-shaped electrically conductive layers 46). Each charge storage element can be located adjacent to a respective one of the plurality of vertical semiconductor channels 60.

The various embodiments of the present disclosure provide schemes for formatting an alternating stack of the L-shaped insulating layers 32 and the L-shaped electrically conductive layers 46 such that end portions 46V of the L-shaped electrically conductive layers 46 extend along a non-horizontal (e.g., vertical) direction and provide top surfaces within a same horizontal plane that may be at the height of the top surfaces of drain regions 63 that are formed in the memory array region 100. The L-shaped electrically conductive layers 46 including non-horizontally-extending portions 46V function as angled word lines that facilitate formation of word line contact via structures 86 thereupon. Thus, formation of staircases or a terrace region in which electrically conductive layers 46 extent to different lateral extents is not necessary. By eliminating the need to form a terrace region, the various embodiments of the present disclosure can simplify the process flow for manufacture of word line contact via structures 86, and thus, reduce the manufacturing cost and/or enhance the yield and/or reliability of the word line contact via structures 86 of a three-dimensional memory device.

Referring to FIGS. 24A and 24B, a second exemplary structure according to the second embodiment of the present disclosure is illustrated, which includes a substrate and a plurality of first mesa structures 770. The semiconductor substrate layer 9 can be the same as in the first exemplary structure, and each of the first mesa structures 770 includes a patterned dielectric material portion including sidewalls. The semiconductor substrate layer 9 may be the entirety of a substrate, or may be an upper portion of a substrate that includes at least one underlying material layer. Each first mesa structure 770 may be the same as the mesa structure (270, 280) of the first embodiment, may include only an upper template structure 270 of the first embodiment, or may include a dielectric material portion having a different composition than the mesa structure (270, 280) of the first embodiment.

FIGS. 25A-25C illustrate various alternative configurations for the first exemplary structure at the processing steps of FIGS. 24A and 24B. A first alternative configuration for the first exemplary structure illustrated in FIG. 25A can be provided by forming the first mesa structures 770 with tapered sidewalls. The taper angle (which is measured from a vertical line) may be in a range from 1 degree to 60 degrees. However, lesser or greater taper angles may also be provided. A second alternative configuration of for the first exemplary structure illustrated in FIG. 25B can be provided by forming the first mesa structures 770 with terraces such that stepped surfaces extend from the substrate semiconductor layer 9 to a topmost surface of each first mesa structure 770. A third alternative configuration for the first exemplary structure illustrated in FIG. 25C can be provided by forming the first mesa structures 770 as a stack of multiple material portions (770A, 770B) having a same composition or different compositions. For example, portion 770A can be a silicon oxide portion, while portion 770B can be a planarization stop portion, such as a metal oxide (e.g., aluminum oxide) portion that can be used as a polish stop during a CMP process.

Figure 26A:
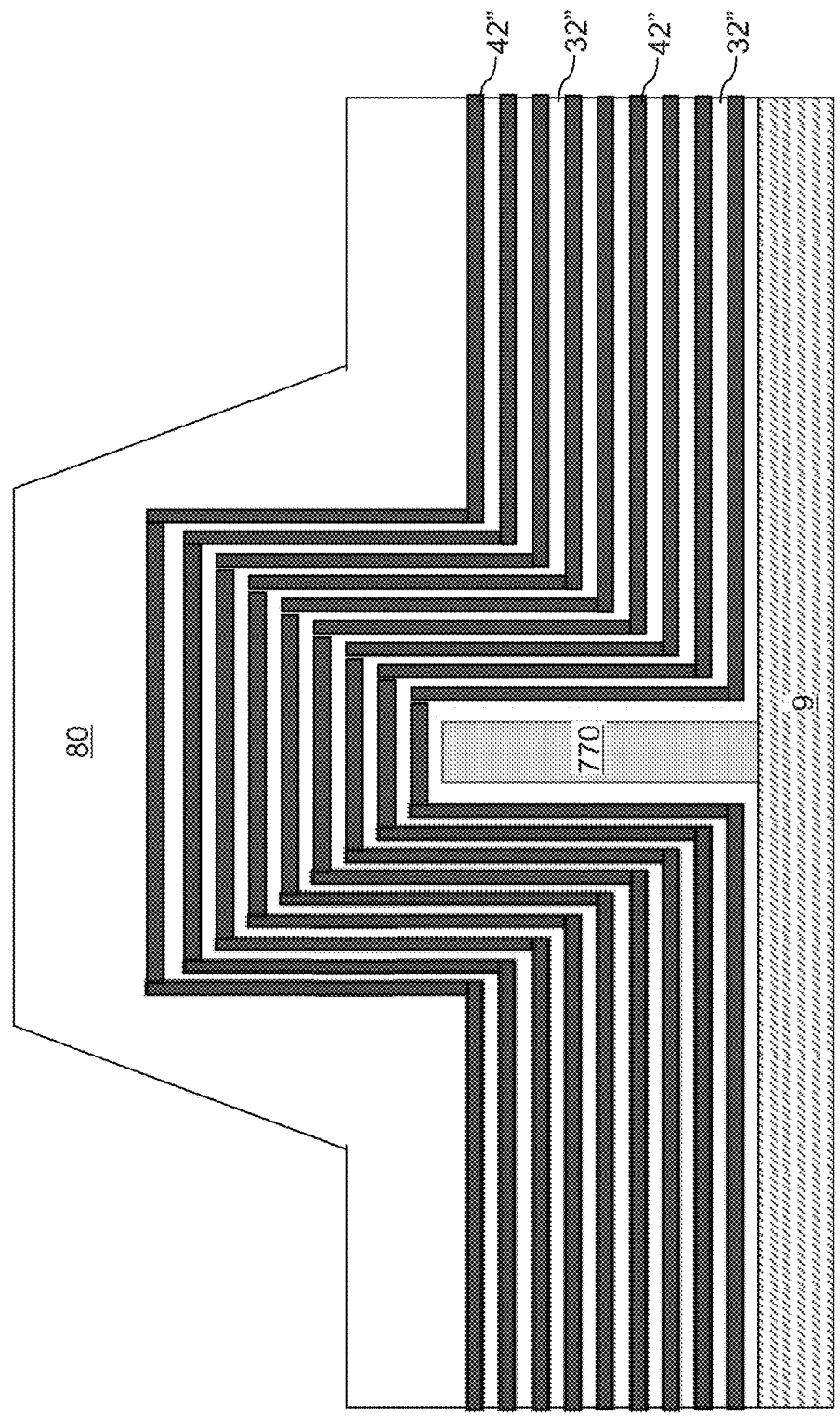
FIG. 26A is a vertical cross-sectional view of the second exemplary structure after formation of an alternating sequence of first conformal insulating layers and first conformal sacrificial material layers and a planarization dielectric layer according to the second embodiment of the present disclosure.

Referring to FIG. 26A, an alternating sequence of first insulating layers and first spacer material layers can be formed. In one embodiment, the first insulating layers can be first conformal insulating layers 32" formed by a respective conformal deposition process, and first spacer material layers can be first conformal spacer material layers formed by a respective conformal deposition process. In one embodiment, the first conformal spacer material layers can be first conformal sacrificial material layers 42" that are subsequently partially replaced with first electrically conductive layers, or can be first conformal electrically conductive layers. While the present disclosure is described employing an embodiment in which the first conformal spacer material layers can be first conformal sacrificial material layers 42" that are subsequently partially replaced with first electrically conductive layers, embodiments are expressly contemplated herein in which the first conformal spacer material layers are formed as first conformal electrically conductive layers and processing steps for replacing the material of the first conformal sacrificial material layers 42' with the first electrically conductive layers are omitted.

Each of the first conformal insulating layers 32" and the first conformal sacrificial material layers 42" can be deposited by a respective conformal deposition process, which can include a chemical vapor deposition (CVD) process or an atomic layer deposition (ALD) process. In one embodiment, the first conformal insulating layers 32" can have the same composition and thickness as the Z-shaped insulating layer 32' of the first exemplary structure, and the first conformal sacrificial material layers 42" can have the same composition and thickness as the Z-shaped sacrificial material layers 42' of the first exemplary structure. Generally speaking, a region of each first conformal insulating layer 32" of the second exemplary structure can be the same as a Z-shaped insulating layer 32' of the first exemplary structure, and each Z-shaped insulating layer 32' of the first exemplary structure may be a region of a first conformal insulating layer 32" in a structure incorporating the first exemplary structure. Likewise, a region of each first conformal sacrificial material layer 42" of the second exemplary structure can be the same as a Z-shaped sacrificial material layer 42' of the first exemplary structure, and each Z-shaped sacrificial material layer 42' of the first exemplary structure may be a region of a first conformal sacrificial material layer 42" in a structure incorporating the first exemplary structure.

In one embodiment, the first conformal insulating layers 32" can include silicon oxide, which may, or may not, be doped with dopants such as B, P, F, or As. In one embodiment, the first conformal insulating layers 32" may consist essentially of $SiO_2$ with a trace level of hydrogen atoms and/or carbon atoms. The first conformal insulating layers 32" can be formed by a conformal deposition process such as low pressure chemical vapor deposition. The thickness of the first conformal insulating layers 32" can be in a range from 25 nm to 60 nm, although lesser and greater thicknesses can also be employed. In one embodiment, the first conformal sacrificial material layers 42" can include silicon nitride. The thickness of each first conformal sacrificial material layer 42" can be in a range from 25 nm to 60 nm, although lesser and greater thicknesses can also be employed.

A planarizable dielectric material is deposited over the alternating sequence (32", 42") to form a planarization dielectric layer 80. The planarization dielectric layer 80 may be deposited by a non-conformal deposition method (such as plasma enhanced chemical vapor deposition), a conformal deposition method, or a self-planarizing deposition method (such as spin coating). The planarizable dielectric material may be a self-planarizing material such as spin-on glass (SOG), or a dielectric material such as doped silicate glass or undoped silicate glass that can be planarized by chemical mechanical planarization (CMP) process. The lowest portion of the top surface of the planarization dielectric layer 80 can be located above the horizontal plane including the top surface of the first mesa structures 770.

Figure 26B:
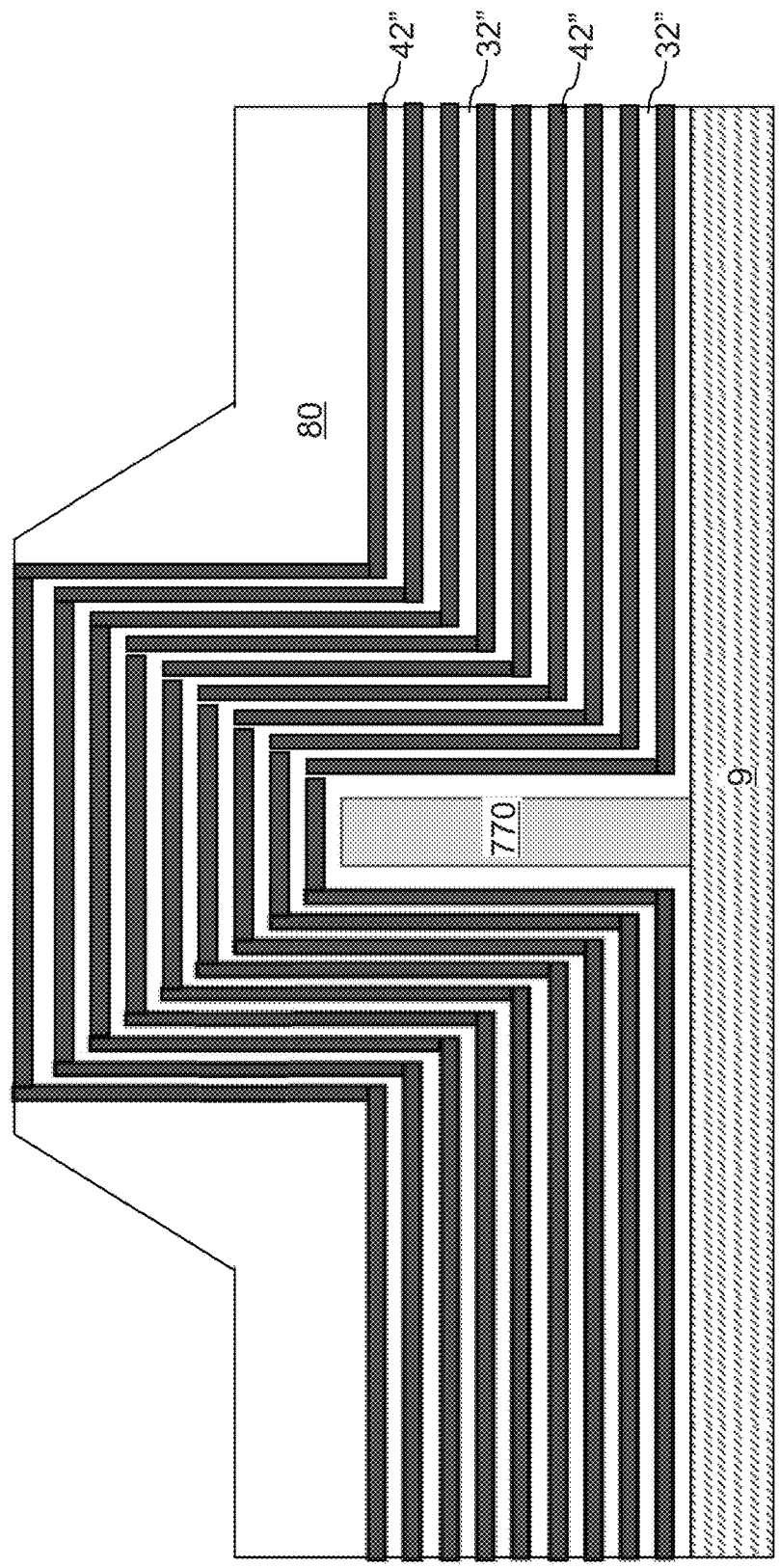
FIG. 26B is a vertical cross-sectional view of the second exemplary structure after a partial chemical mechanical planarization process that removes portions of the planarization dielectric layer from above raised portions of the alternating sequence of first conformal insulating layers and first conformal sacrificial material layers according to the second embodiment of the present disclosure.

Referring to FIG. 26B, a partial chemical mechanical planarization process can be performed to remove portions of the planarization dielectric layer 80 from above raised portions of the alternating sequence (32", 42") of the first conformal insulating layers 32" and the first conformal sacrificial material layers 42", i.e., from above regions of the alternating sequence (32", 42") that protrude above a horizontal plane including the bottommost surface of the planarization dielectric layer 80.

Figure 26C:
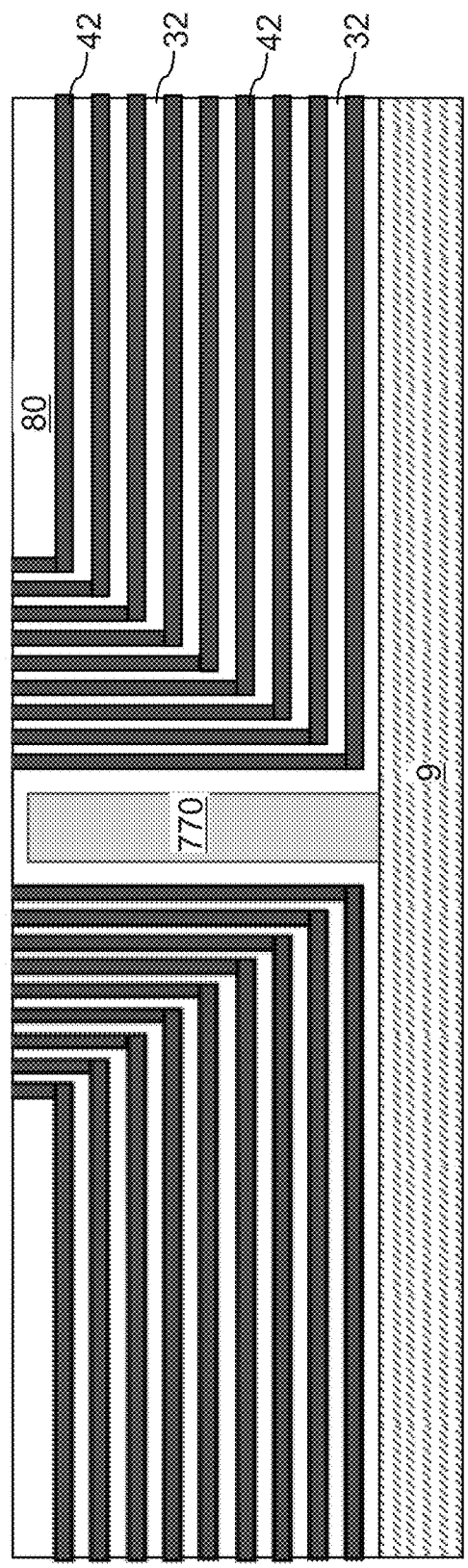
FIG. 26C is a vertical cross-sectional view of the second exemplary structure after a planarization process that forms first alternating stacks of first insulating layers and first sacrificial material layers according to the second embodiment of the present disclosure.

Referring to FIG. 26C, an additional planarization process can be performed to further remove raised portions of the alternating sequence (32", 42") of the first conformal insulating layers 32" and the first conformal sacrificial material layers 42". Specifically, portions of the first conformal insulating layers 32" and the first conformal sacrificial material layers 42" can be removed from above a horizontal plane located at, or above, a top surface of the first mesa structure 770 by the planarization process. Each remaining portion of the first conformal insulating layers 32" constitutes a first insulating layer 32, and each remaining portion of the first conformal sacrificial material layers 42" constitutes a first sacrificial material layer 42. Each remaining portion of the first conformal insulating layers 32" and the first sacrificial material layers 42" (i.e., each first insulating layer 32 and each first sacrificial material layer 42) includes a respective horizontally-extending portion and a respective non-horizontally-extending portion. A first alternating stack (32, 42) of first insulating layers 32 and first sacrificial material layers 42 can be formed between each neighboring pair of first mesa structures 770. In one embodiment, each first insulating layer 32 and each first sacrificial material layer 42 can include a respective horizontally-extending portion and a respective pair of non-horizontally-extending portions. If the sidewalls of the first mesa structures 770 are vertical sidewalls, the non-horizontally-extending portions can be vertically-extending portions. If the sidewalls of the first mesa structures 770 are tapered sidewalls, the non-horizontally-extending portions can be extend non-horizontally and non-vertically, i.e., can extend at a taper angle between 0 degrees and 90 degrees. The thickness of each remaining portion of the planarization dielectric layer 80 may be in a range from 20 nm to 500 nm, such as from 40 nm to 250 nm, although lesser and greater thicknesses can also be employed.

Figure 26D:
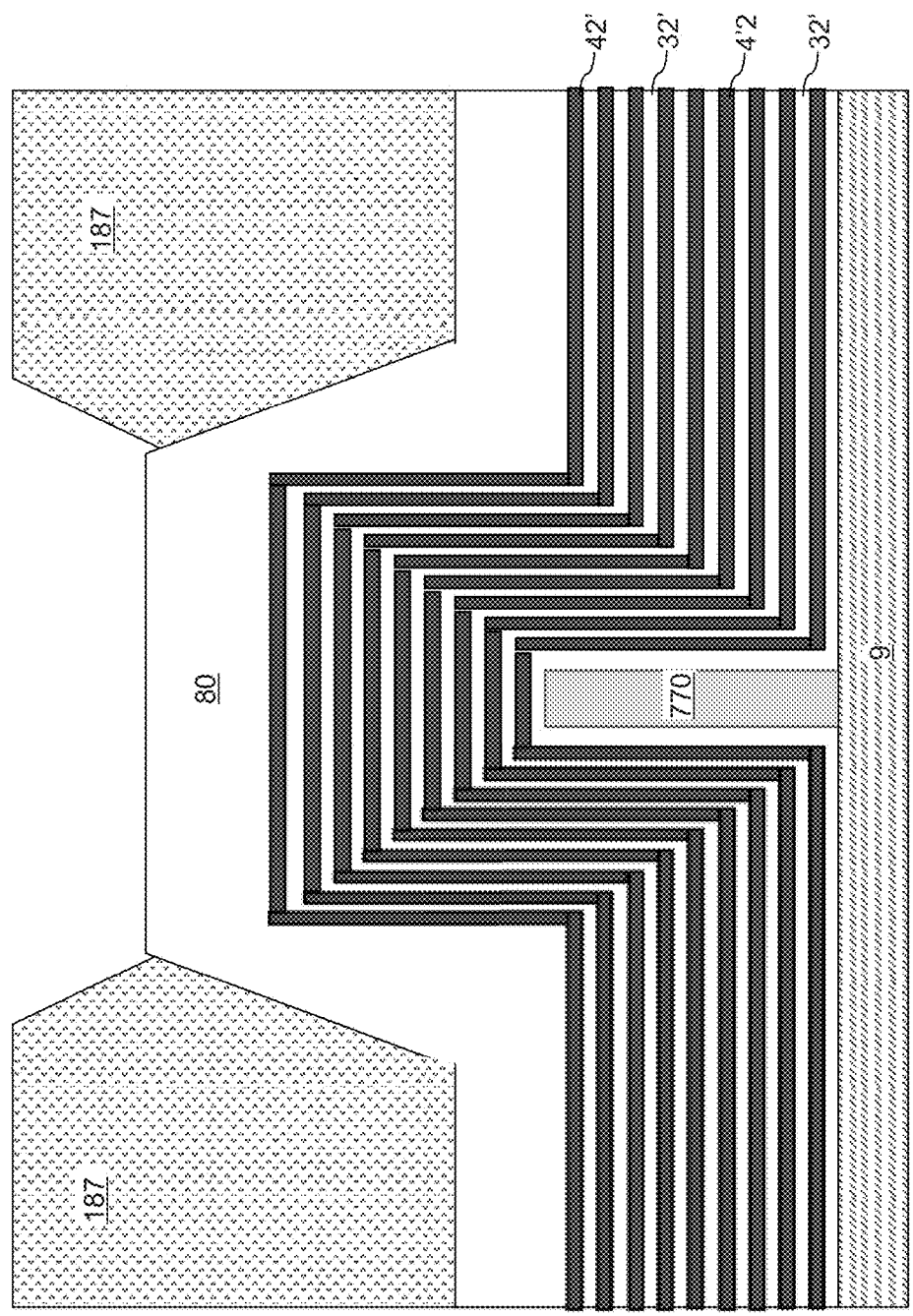
FIG. 26D is a vertical cross-sectional view of the second exemplary structure during an alternative planarization scheme that employed a patterned photoresist layer to provide at least partial planarization of the alternating sequence of first conformal insulating layers and first conformal sacrificial material layers according to the second embodiment of the present disclosure.

FIG. 26D illustrates an alternative planarization scheme that may be employed to provide the second exemplary structure of FIG. 26C from the second exemplary structure of FIG. 26A. In this case, a patterned photoresist layer 187 can be formed with openings in areas that include protruding portions of the planarization dielectric layer 80. The protruding portions of the planarization dielectric layer 80 and the underlying portions of the alternating sequence (32", 42") can be recessed by a recess etch, which may include an anisotropic etch or an isotropic etch. After removal of the patterned photoresist layer 187, a touch-up chemical mechanical planarization process can be performed to provide the second exemplary structure of FIG. 26C. In this case, a masked etch process can be employed in conjunction with chemical mechanical planarization to provide the second exemplary structure of FIG. 26C.

Figure 27:
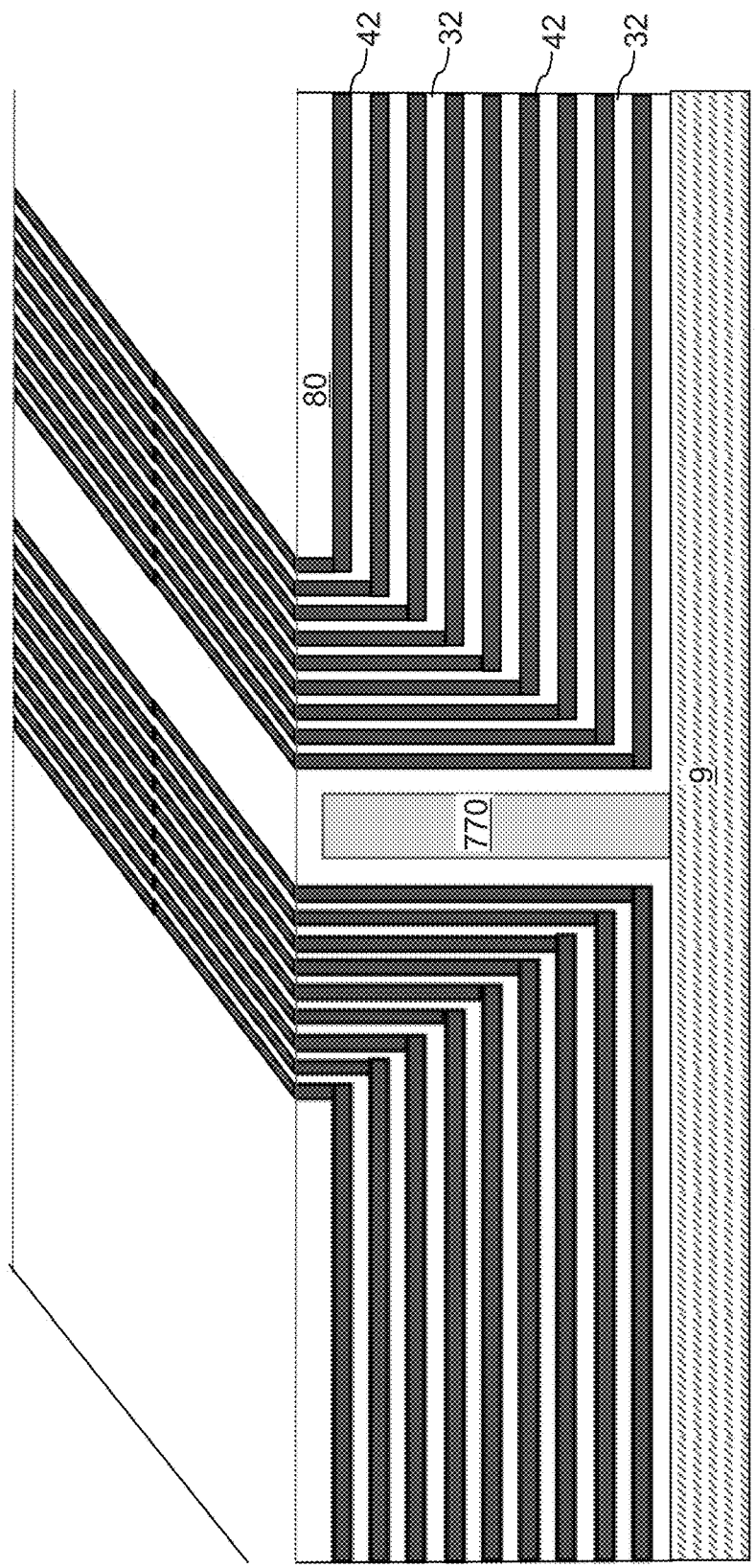
FIG. 27 is a perspective view of a cut portion of the second exemplary structure at the processing steps of FIG. 26C.

FIG. 27 is a perspective view of a cut portion of the second exemplary structure at the processing steps of FIG. 26C. The perspective view includes a vertical cross-sectional view of the second exemplary structure as illustrated in FIG. 26C, and includes an angled top-down view.

Figure 28A:
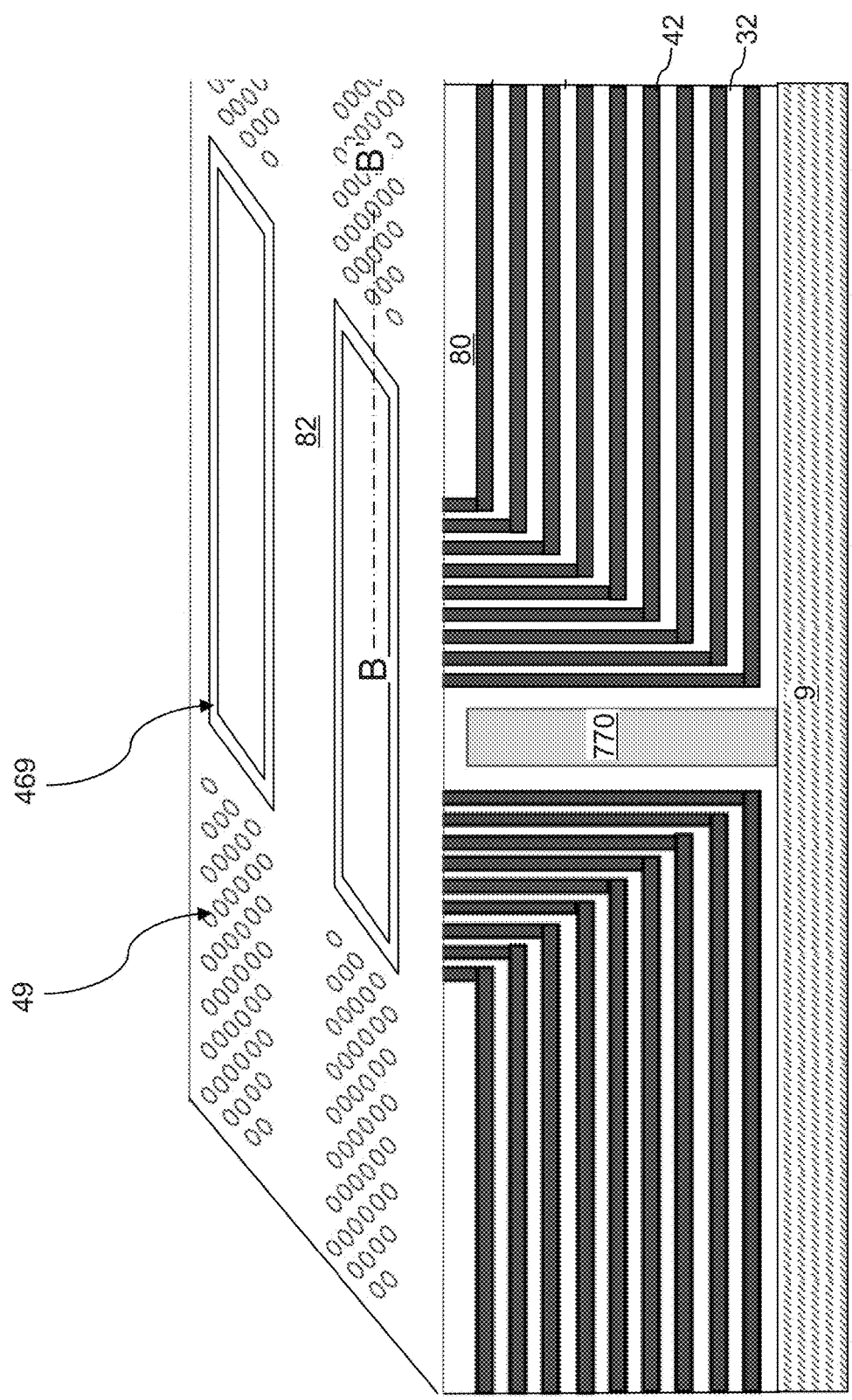
FIG. 28A is a perspective view of a cut portion of the second exemplary structure after formation of memory openings and moat trenches according to the second embodiment of the present disclosure.
Figure 28B:
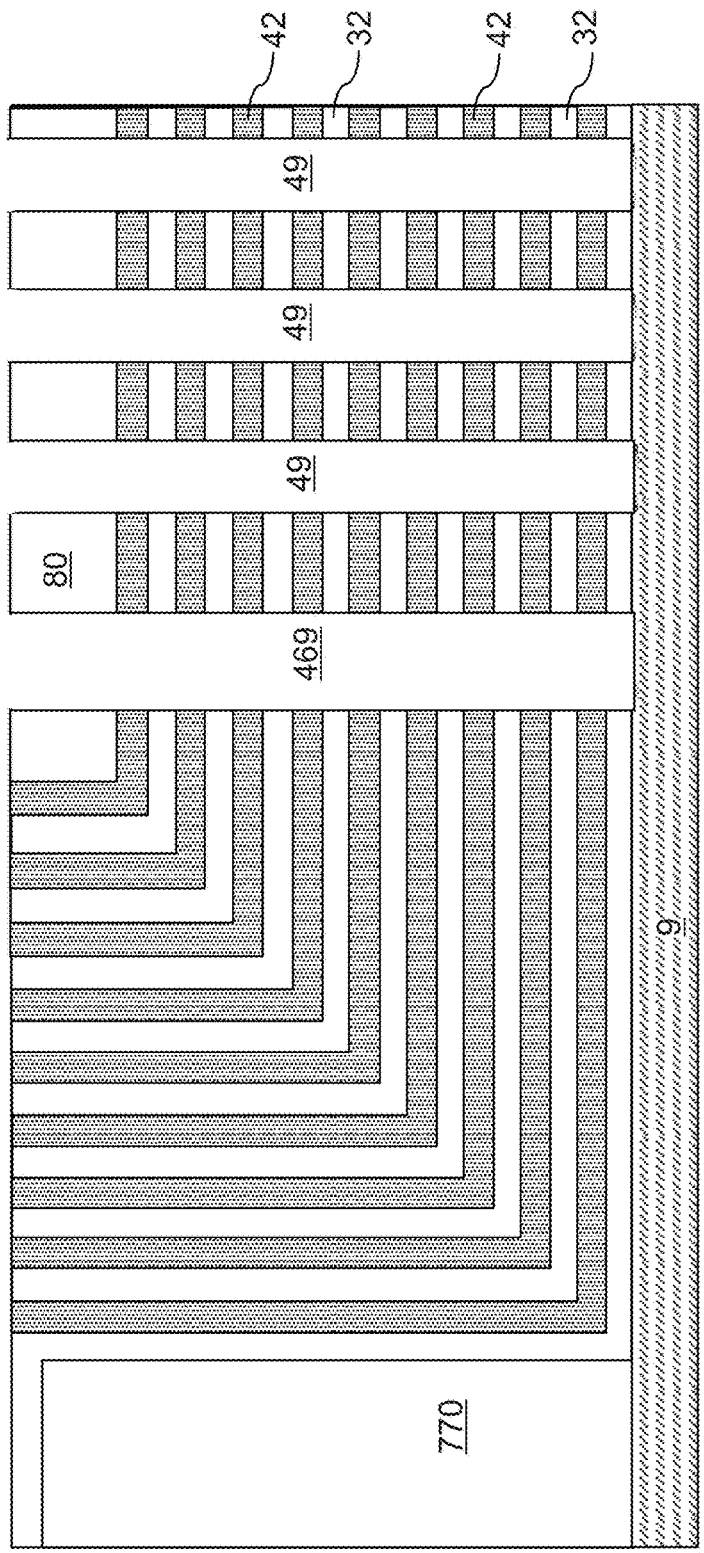
FIG. 28B is a vertical cross-sectional view of the second exemplary structure along the vertical plane B-B' of FIG. 28A.

Referring to FIGS. 28A and 28B, a lithographic material stack (not shown) including at least a photoresist layer can be formed over the second exemplary structure, and can be lithographically patterned to form openings of various shapes. The pattern in the lithographic material stack can be transferred through the planarization dielectric layer 80, the alternating stack (32, 42), and the first mesa structures 770 by at least one anisotropic etch that employs the patterned lithographic material stack as an etch mask. Portions of the alternating stack (32, 42) underlying the openings in the patterned lithographic material stack are etched to form memory openings 49 and trenches, which may be moat trenches 469. Specifically, the pattern in the lithographic material stack can include an array of openings having closed shapes (such as a circles, ellipses, polygons, or other generally curvilinear closed shapes) in regions that overlie horizontally-extending portions of the alternating stacks (32, 42), and transfer of the pattern of the array of openings through the planarization dielectric layer 80 and the horizontally-extending portions of the alternating stacks (32, 42) forms arrays of memory openings 49. Further, the pattern in the lithographic material stack can include openings having generally annular shapes laterally extending over interfaces between the first mesa structures 770 and the alternating stacks (32, 42), and transfer of the pattern of the openings having the generally annular shapes through the first mesa structures 770, the alternating stacks (32, 42), and the planarization dielectric layer 80 can form the moat trenches 469.

As used herein, a "generally annular shape" refers to any two-dimensional shape having a first closed shape as an outer boundary and a second closed shape that is entirely contained within the first shape and does not touch the first closed shape as an inner boundary. The distance between the first closed shape and the second closed shape may be uniform, or non-uniform. In one embodiment, each moat trench 469 can have a first pair of vertical cavities having a first uniform width and laterally extending along a first horizontal direction and a second pair of vertical cavities having a second uniform width and laterally extending along a second horizontal direction that is perpendicular to the first horizontal direction. In one embodiment, the second horizontal direction can be parallel to an interface between a first mesa structure 770 and an alternating stack (32, 42), and the first horizontal direction can be perpendicular to the second horizontal direction.

In one embodiment, the memory openings 49 and the moat trenches 469 can be formed simultaneously by an anisotropic etch process. The anisotropic etch process may etch through the materials of the alternating stack (32, 42), the first mesa structures 770, and the planarization dielectric layer 80 indiscriminately or with selectivity. In one embodiment, multiple etch steps employing different etch chemistries may be employed for the anisotropic etch process to optimize etching of the various materials in the alternating stack (32, 42), the first mesa structures 770, and the planarization dielectric layer 80. The anisotropic etch can be, for example, a series of reactive ion etches. The sidewalls of the memory openings 49 can be substantially vertical, or can be tapered. The patterned lithographic material stack can be subsequently removed, for example, by ashing.

Alternatively, the memory openings 49 and the moat trenches 469 may be formed employing different patterning steps, i.e., employing two sets of lithographic patterning processes and two sets of anisotropic etch processes. In this case, the memory openings 49 may be formed prior to, or after, formation of the moat trenches 469. A top surface of the substrate semiconductor layer 9 can be physically exposed at the bottom of each memory opening 49 and at the bottom of each moat trench 469.

Each moat trench 469 can include inner sidewalls and outer sidewalls. The outer sidewalls can include surfaces of two remaining portions of a first mesa structure 770 and surfaces (i.e., sidewalls) of first remaining portions of an alternating stack (32, 42) located outside the moat trench 469. The surfaces (i.e., sidewalls) of first remaining portions of the alternating stack (32, 42) include sidewalls of non-horizontally-extending portions of the first sacrificial material layers 42 and the first insulating layers 32 and sidewalls of horizontally-extending portions of the first sacrificial material layers 42 and the first insulating layers 32. The inner sidewalls include surfaces of second remaining portions of the alternating stack (32, 42) laterally encircled by the moat trench 469. The inner sidewalls include sidewalls of the first insulating layers 32 and the first sacrificial material layers 42 within the second remaining portions of the alternating stack (32, 42). The inner sidewalls include sidewalls of non-horizontally-extending portions and horizontally-extending portions of the first insulating layers 32 and the first sacrificial material layers 42 within the second remaining portions of the alternating stack (32, 42).

Figure 29B:
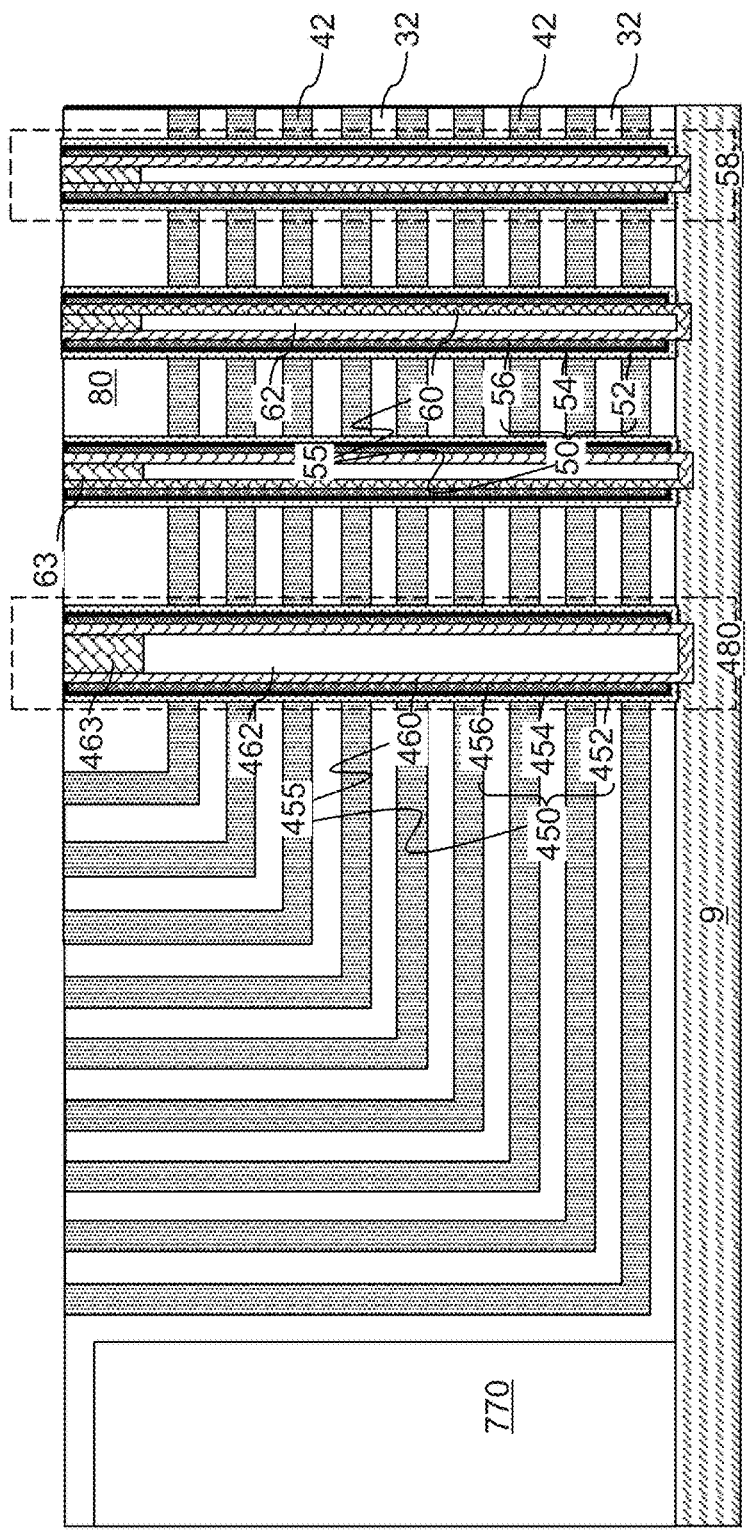
FIG. 29B is a first vertical cross-sectional view of the second exemplary structure along the vertical plane B-B' of FIG. 29A.
Figure 29C:
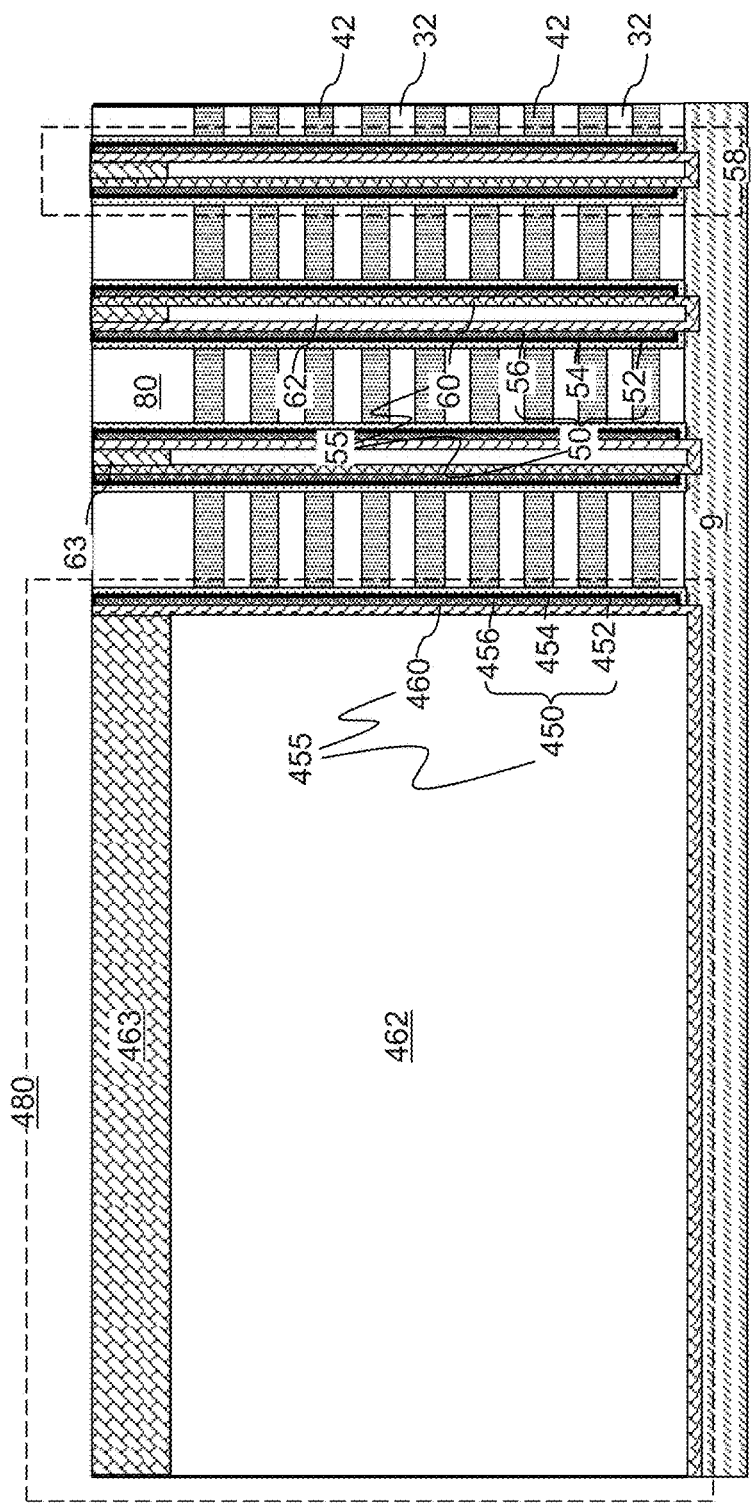
FIG. 29C is a second vertical cross-sectional view of the second exemplary structure along the vertical plane C-C' of FIG. 29A.

Referring to FIGS. 29A-29C, memory opening fill structures 58 and wall support structures are formed in the memory openings 49 and in the moat trenches 469, respectively. In this embodiment, the wall support structures comprise support panel structures 480 which may be formed instead of the dielectric wall support structures 370 of the prior embodiment. The memory opening fill structures 58 can be formed by performed a same set of processing steps that can be employed to form the memory opening fill structures 58 in the first exemplary structure, i.e., by performing the processing steps of FIG. 15. Each region in which the memory opening fill structures 58 are formed is a memory array region of the first alternating stack (32, 42), which includes horizontally-extending portions of the first sacrificial material layers 42 and the first insulating layers 32 of an alternating stack (32, 42).

Each memory opening fill structure 58 of the second exemplary structure includes a memory stack structure 55. Each memory stack structure includes a memory film 50 and a vertical semiconductor channel 60 as in the first exemplary structure. Each memory opening fill structure 58 further includes a drain region 63, and can optionally include a dielectric core 62 as in the first exemplary structure.

The various processing steps employed to form the memory opening fill structures 58 collaterally deposits various material portions in the moat trenches 469. The various collaterally deposited material portions in the moat trenches 469 collectively constitute the support panel structures 480. In one embodiment, each support panel structure 480 can include a first material layer 450 having the same composition as the memory films 50. The first material layer 450 includes at least one dielectric material as the memory films 50. The first material layer 450 can include a blocking dielectric material layer 452 having the same composition and the same thickness as the blocking dielectric layers 52, a charge storage material layer 454 having the same composition and the same thickness as the charge storage layers 54, and a tunneling dielectric material layer 456 having the same composition and the same thickness as the tunneling dielectric material layers 56. Further, each support panel structure 480 can include additional material portions (460, 462, 463) that are formed in a respective moat trench 469 concurrently with formation of the vertical semiconductor channels 60, the dielectric cores 62, and the drain regions 63. The additional material portions (460, 462, 463) can comprise a second material layer, which is a semiconductor material layer 460 and has the same composition as the vertical semiconductor channels 60. In one embodiment, each support panel structure 480 can include a semiconductor material layer 460 having the same composition and/or the same thickness as the vertical semiconductor channels 60, an optional annular dielectric material portion 462 having the same composition as the dielectric cores 62, and an annular doped semiconductor portion 463 having the same composition as the drain regions 63. In another embodiment, one or more layers 450, 460, 462 and/or 463 can have a different thickness and/or a different composition than the respective layers 50, 60, 62 and/or 63.

Each support panel structure 480 can be formed through a first mesa structure 770 and through a first alternating stack (32, 42). Each support panel structure 480 can have a cylindrical configuration such that the lateral extent of the support panel structure 480 is limited between a set of contiguous outer sidewalls of the support panel structure 480 and a set of contiguous inner sidewalls of the support panel structure 480. In one embodiment, each sidewall of the support panel structures 480 can be substantially vertical, i.e., vertical or has a taper angle less than 5 degrees (as measured from a vertical direction). Each support panel structure 480 includes a first sidewall (i.e., one of the outer sidewalls that extend perpendicular to the lengthwise direction of the first mesa structure 770) that contacts a remaining portion of the first mesa structure 770, first remaining portions of the first insulating layers 32, and first remaining portions of the first sacrificial material layers 42 that are located outside the support panel structure. The support panel structure 480 can include a second sidewall (i.e., one of the inner sidewalls that extend perpendicular to the lengthwise direction of the first mesa structure 770) that contacts second remaining portions of the first insulating layers 32 and the second remaining portions of the first sacrificial material layers 42 (i.e., second remaining portions of the alternating stack (32, 42)) that are laterally enclosed by support panel structure 480.

Figure 30:
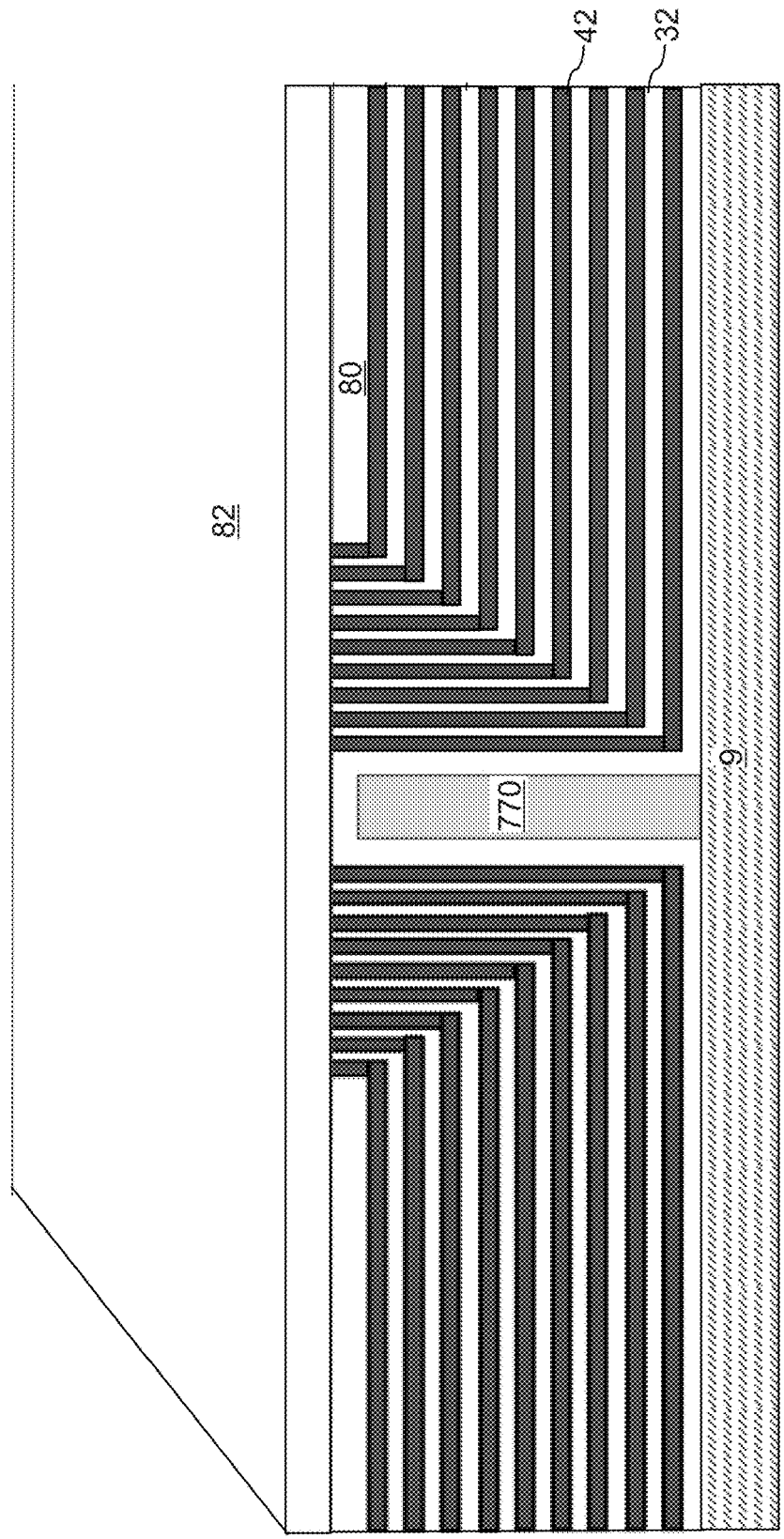
FIG. 30 is a perspective view of a cut portion of the second exemplary structure after formation of a contact level dielectric layer according to the second embodiment of the present disclosure.

Referring to FIG. 30, a contact level dielectric layer 82 can be deposited on the planar top surfaces of the planarization dielectric layer 80 and the alternating stacks (32, 42). The top surfaces of the planarization dielectric layer 80 and the alternating stacks (32, 42) may be coplanar with the top surfaces of the first mesa structures 770, or with topmost surfaces of portions of a bottommost insulating layer 32 within the alternating stack (32, 42) that overlie the first mesa structures 770. The contact level dielectric layer 82 includes a dielectric material that is different from the material of the first sacrificial material layers 42, and may include the same dielectric material as the first insulating layers 32. In one embodiment, the first insulating layers and the contact level dielectric layers 82 can include a silicon oxide material such as undoped silicate glass. The thickness of the contact level dielectric layer 82 can be in a range from 25 nm to 500 nm, such as from 50 nm to 250 nm, although lesser and greater thicknesses can also be employed.

Figure 31:
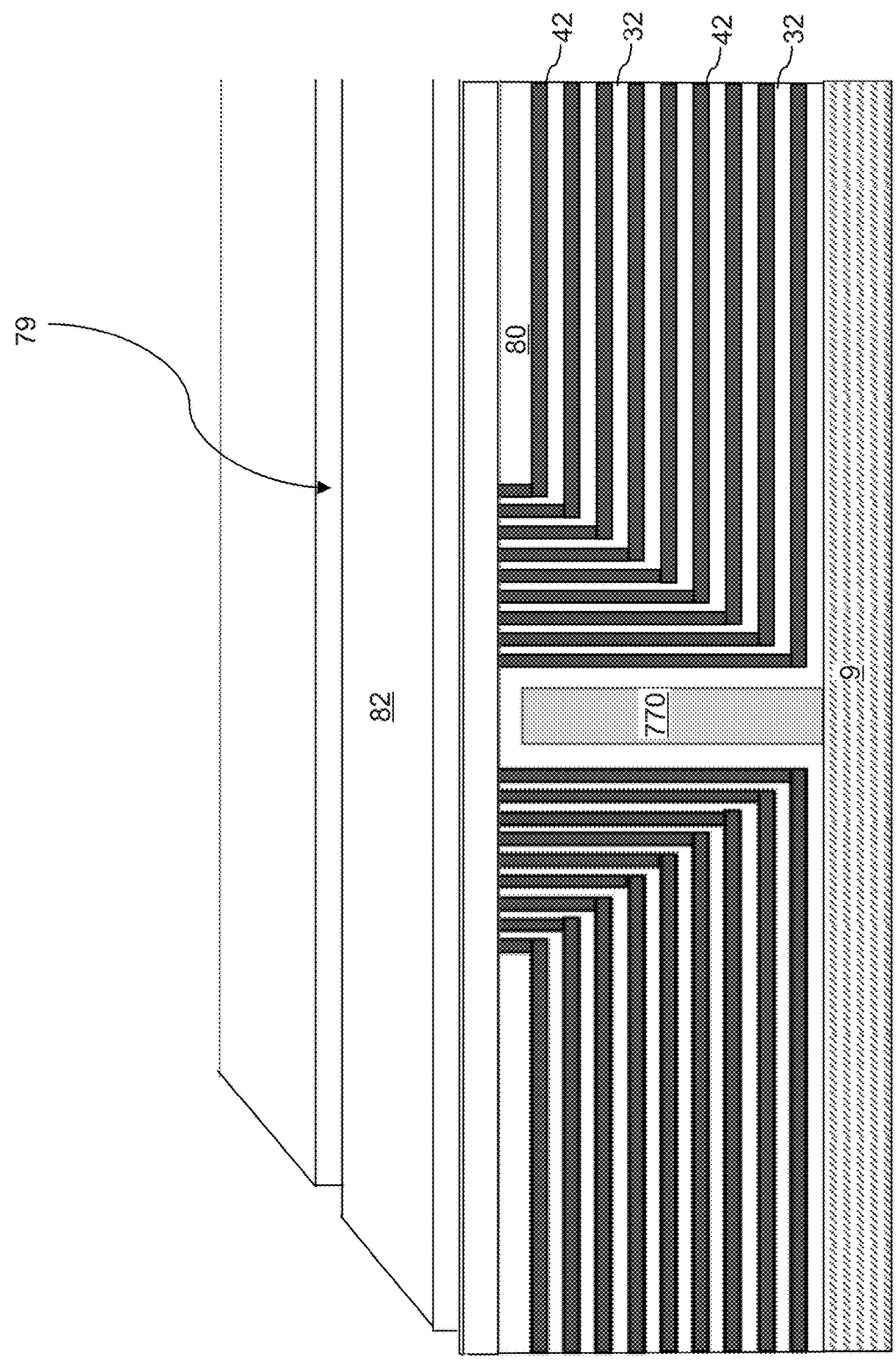
FIG. 31 is a perspective view of a cut portion of the second exemplary structure after formation of backside trenches according to the second embodiment of the present disclosure.

Referring to FIG. 31, a photoresist layer (not shown) can be applied over the contact level dielectric layer 82, and can be lithographically patterned to form elongated openings between clusters of memory stack structures 55. In one embodiment, the elongated openings can laterally extend along a direction perpendicular to the lengthwise direction of the first mesa structures 770. The pattern in the photoresist layer can be transferred through the contact level dielectric layer 82, the planarization dielectric layer 80, the alternating stack (32, 42), and through the first mesa structures 770 employing an anisotropic etch to form at least one backside trench 79, which extends to the top surface of the substrate semiconductor layer 9. The at least one backside trench 79 can be a plurality of backside trenches 79. In one embodiment, each backside trench 79 can include a source contact opening in which a source contact via structure can be subsequently formed. The photoresist layer can be subsequently removed, for example, by ashing.

The backside trenches 79 can be formed outside of the areas of the support panel structures 480. In one embodiment, a backside trench 79 can extend through, and divide, first remaining portions of the first insulating layers 32 and the first remaining portions of the first sacrificial material layers 42 that are located outside of the support panel structures 480. In this case, each backside trench 79 can be laterally spaced from second remaining portions of the first insulating layers 32 and second remaining portions of the first sacrificial material layers 42 that are laterally enclosed by a respective support panel structure 480. In one embodiment, each backside trench 79 can be laterally spaced from the support panel structures 480.

Figure 32A:
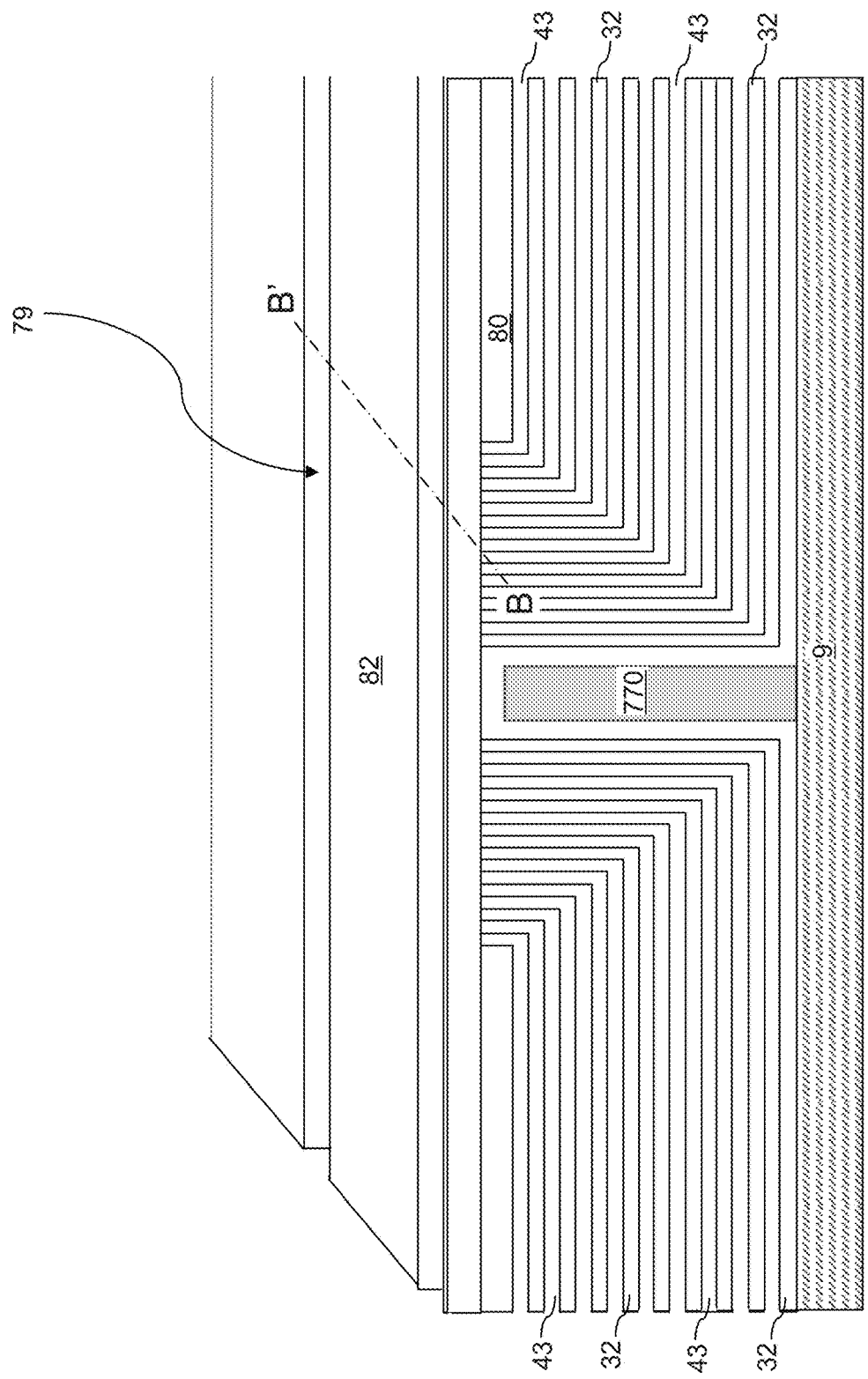
FIG. 32A is a perspective view of a cut portion of the second exemplary structure after formation of backside recesses by removal of the first sacrificial material layers selective to the first insulating layers according to the second embodiment of the present disclosure.
Figure 32B:
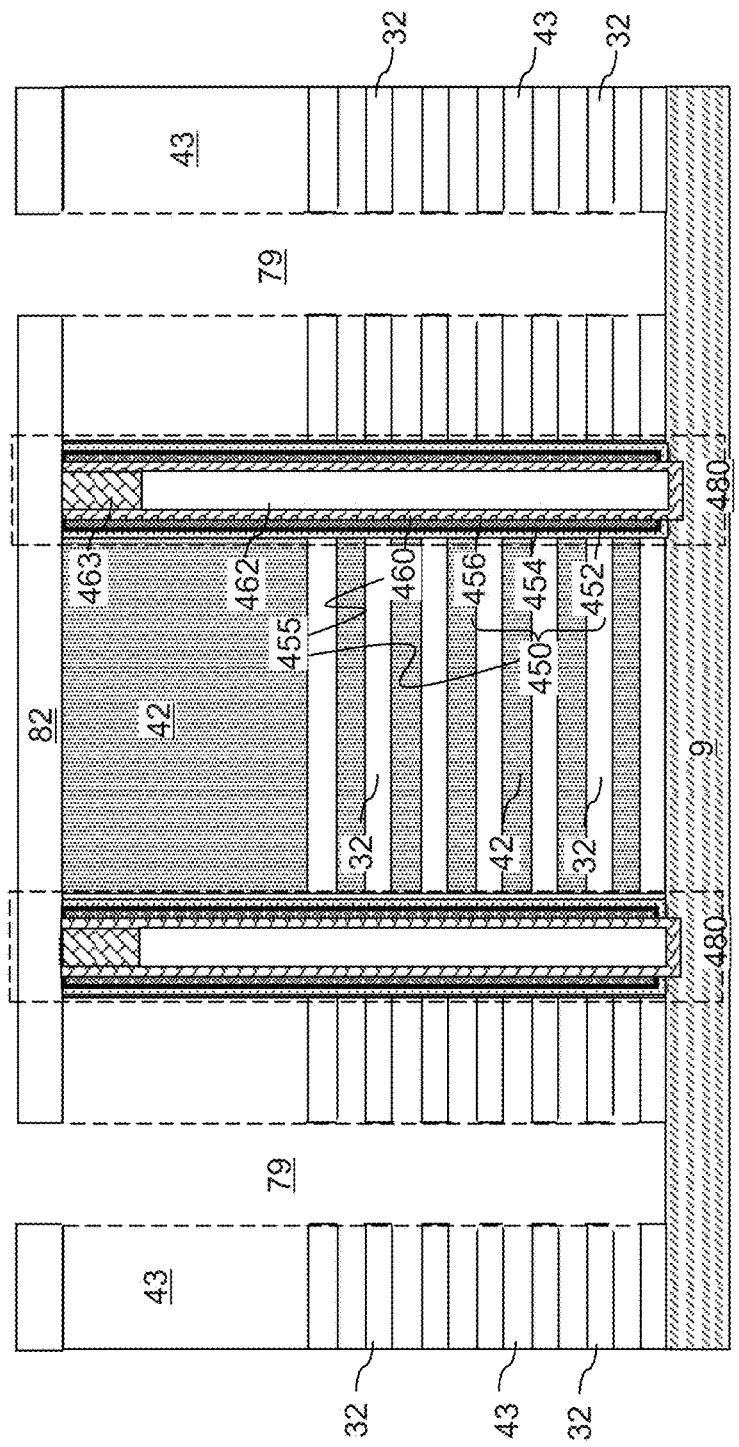
FIG. 32B is a vertical cross-sectional view of the second exemplary structure along the vertical plane B-B' of FIG. 32A.

Referring to FIGS. 32A and 32B, an isotropic etchant the removes the material of the first sacrificial material layers 42 selective to the material of the first insulating layers 32 can be introduced into the backside trench in an isotropic etch process. In one embodiment, the isotropic etch process may be selective to the material of first sacrificial material layers 42 versus the materials of the outermost layers of the memory opening fill structures 58 and the support panel structures 480. The isotropic etchant can be a liquid phase etchant or a gas phase etchant. The first remaining portions of the first sacrificial material layers 42 that are not enclosed by the support panel structures 480 are removed by the isotropic etchant to form backside recesses (e.g., lateral recesses) 43. The backside recesses 43 are formed in volumes from which the first remaining portions of the first sacrificial material layers 42 are removed. In one embodiment, the first sacrificial material layers 42 can include silicon nitride, the first insulating layers 32 include silicon oxide, and the isotropic etchant can be hot phosphoric acid.

A backside recess 43 can include a horizontally-extending portion and a non-horizontally-extending portion, which may extend vertically or substantially vertically. Each non-horizontally-extending portion of the backside recesses 43 extends to a portion of a bottom surface of the contact level dielectric layer 82. A plurality of backside recesses 43 can be formed in the volumes from which the material of the first sacrificial material layers 42 is removed. The memory openings 49 in which the memory stack structures 55 are formed are herein referred to as front side openings or front side cavities in contrast to the backside recesses 43. In one embodiment, the memory stack structures 55 can constitute arrays of monolithic three-dimensional NAND strings having a plurality of device levels disposed above the substrate semiconductor layer 9. In this case, each backside recess 43 can define a space for receiving a respective word line of the arrays of monolithic three-dimensional NAND strings.

Each horizontally-extending portion of the backside recesses 43 can extend substantially parallel to the top surface of the substrate semiconductor layer 9. A horizontally-extending portion of the backside recesses 43 can be vertically bounded by a top surface of an underlying insulating layer 32 and a bottom surface of an overlying insulating layer 32. In one embodiment, each horizontally-extending portion of the backside recesses 43 can have a uniform height throughout.

Each non-horizontally-extending portion of the backside recesses 43 can extend at any suitable angle other than zero degrees, such as an angle from 30 to 90 degrees with respect to a horizontal direction, and may extend vertically or substantially vertically (e.g., within 5 degrees of vertical). A non-horizontally-extending portion of a backside recess 43 may be laterally bounded by sidewalls of a pair of non-horizontally-extending portions of the first insulating layers 32.

Optionally, a backside blocking dielectric layer (not shown) can be optionally formed. The backside blocking dielectric layer, if present, comprises a dielectric material that functions as a control gate dielectric for the control gates to be subsequently formed in the backside recesses. In case the blocking dielectric layer 52 is present within each memory opening, the backside blocking dielectric layer is optional. In case the blocking dielectric layer 52 is omitted, the backside blocking dielectric layer is present. The backside blocking dielectric layer can be formed in the backside recesses 43 and on a sidewall of the backside trench 79 by a conformal deposition method such as atomic layer deposition (ALD). In one embodiment, the backside blocking dielectric layer can consist essentially of a dielectric metal oxide such as aluminum oxide. The thickness of the backside blocking dielectric layer can be in a range from 1 nm to 15 nm, such as 2 to 6 nm, although lesser and greater thicknesses can also be employed.

The second remaining portions of the first sacrificial material layers 42 and the first insulating layers 32 that are laterally enclosed by the support panel structures 480 are not removed through processing steps that form the backside recesses 43 because the combination of the support panel structures 480, the contact level dielectric layer 82, and the semiconductor substrate layer 9 encapsulates each contiguous set of second remaining portions of the first sacrificial material layers 42 and the first insulating layers 32, and prevents access by the isotropic etchant during the etch process. The support panel structures 480 and the memory opening fill structures 58 provide structural support during formation of the backside recesses 43, i.e., prevents collapse of the second exemplary structure by providing structural support.

Figure 33A:
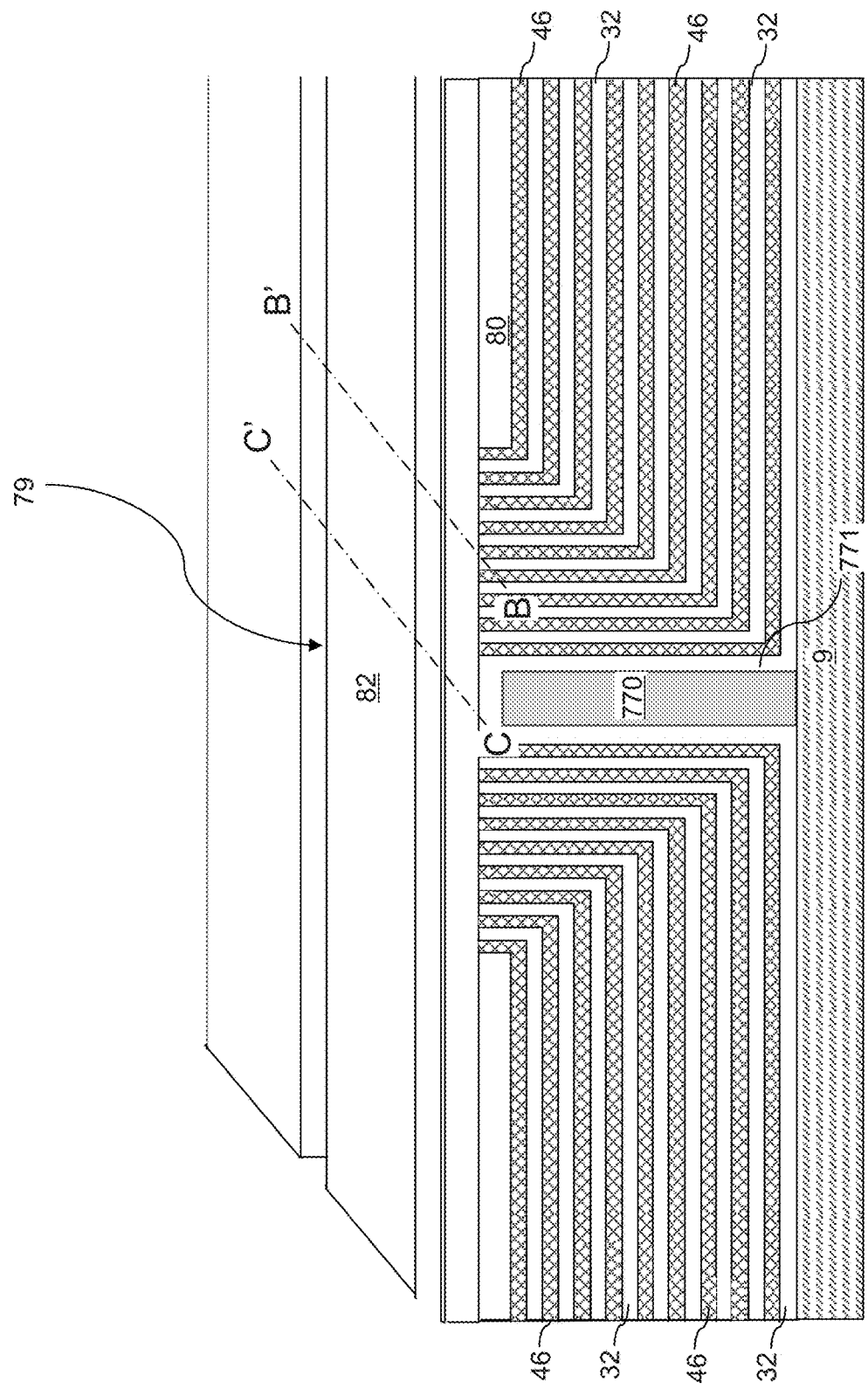
FIG. 33A is a perspective view of a cut portion of the second exemplary structure after formation of first electrically conductive layers by filling the backside recesses with at least one conductive material according to the second embodiment of the present disclosure.
Figure 33B:
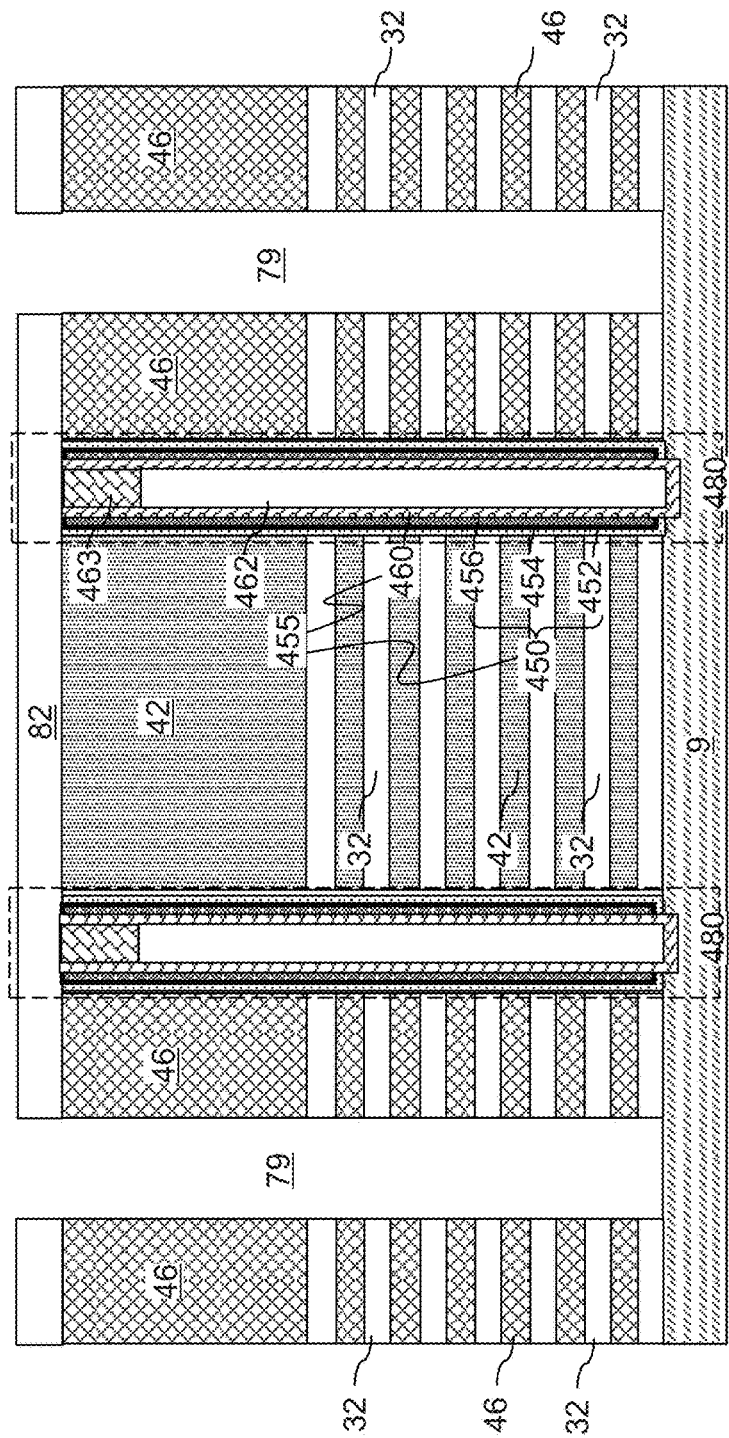
FIG. 33B is a vertical cross-sectional view of the second exemplary structure along the vertical plane B-B' of FIG. 33A.
Figure 33C:
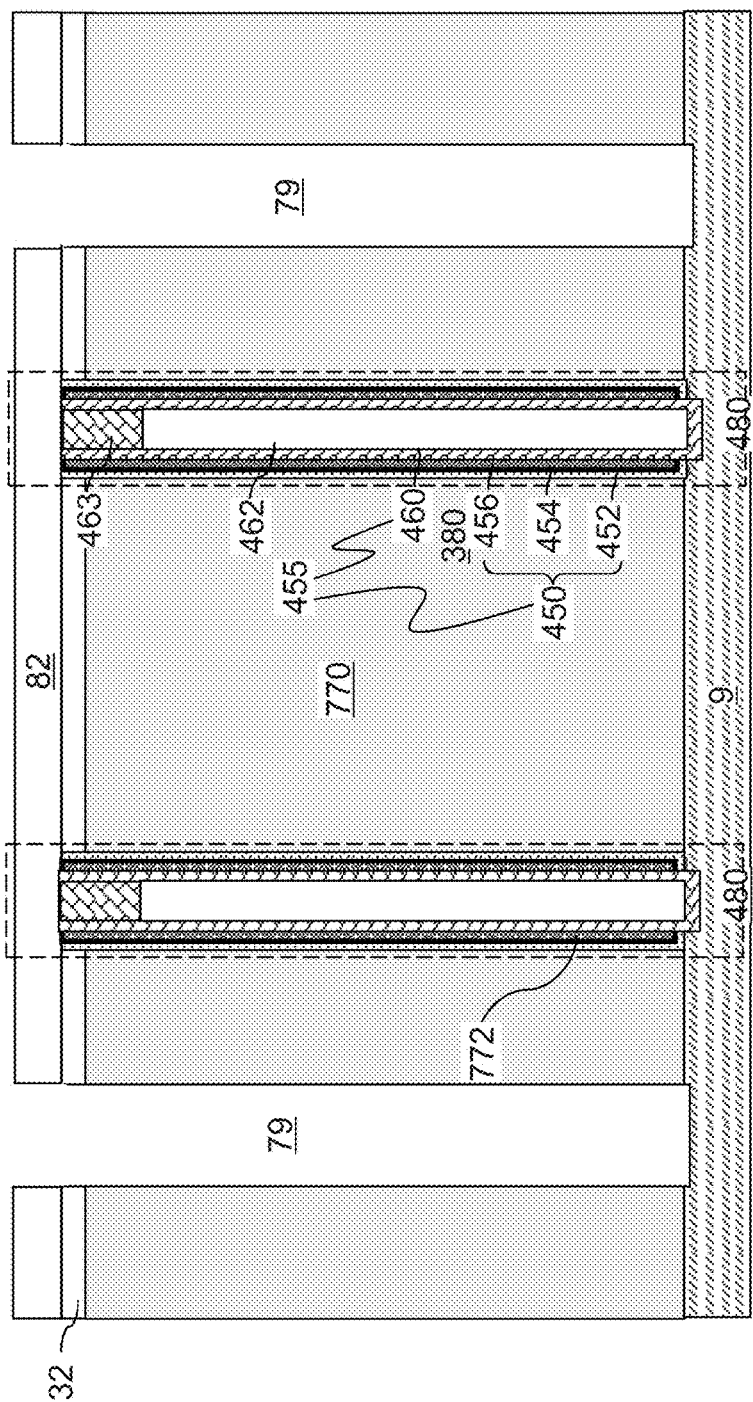
FIG. 33C is a vertical cross-sectional view of the second exemplary structure along the vertical plane C-C' of FIG. 33A

Referring to FIGS. 33A-33C, the backside recesses 43 can be filled with the first electrically conductive layers 46. Thus, portions of the first sacrificial material layers 42 that are located outside of the support panel structures 480 are replaced with the first electrically conductive layers 46, which can be word lines for the memory stack structures 55.

Specifically, at least one conductive material can be deposited within the backside recesses 43 to form the first electrically conductive layers 46. The at least one conductive material deposited at the periphery of each backside trench 79 and over the planarization dielectric layer 80 constitutes a continuous conductive material layer (not shown) that is subsequently removed by an etch-back process.

The at least one conductive material can include, for example, a metallic liner material such as a conductive metal nitride (e.g., TiN, TaN, or WN) and a metallic fill material that consists essentially of at least one metal. The metallic fill material can consist essentially of a single elemental metal (such as Cu, Co, W, or Al) or an intermetallic alloy of at least two elemental metals. In one embodiment, the at least one conductive material can include a titanium nitride liner and a tungsten fill material. The at least one conductive material can be deposited by a conductive deposition process such as chemical vapor deposition (CVD) and/or atomic layer deposition (ALD). The at least one conductive material fills each of the backside recesses. Each continuous portion of the deposited at least one conductive material formed within a backside recess 43 constitutes a first electrically conductive layer 46. Each first electrically conductive layer 46 can include an optional metallic liner portion that include the metallic liner material and a metallic fill portion that includes the metallic fill material.

The continuous conductive material layer (i.e., the continuous portion of the at least one conductive material deposited at the periphery of each backside trench 79 or above the contact level dielectric layer 82) can be removed by an etch-back process, which may include an isotropic etch process and/or an anisotropic etch process. Each first electrically conductive layer 46 comprises a respective continuously-extending conductive material portion of a homogeneous composition that includes a horizontally-extending portion and a non-horizontally-extending portion. Each first electrically conductive layer 46 can function as a combination of a set of control gate electrodes for memory stack structures 55 and a word line electrically interconnecting, i.e., electrically shorting, the set of control gate electrodes.

The first mesa structure 770 can include a first dielectric sidewall 771 that contacts a sidewall of a non-horizontally-extending portion of a most proximal one of the first insulating layers 32, and a second dielectric sidewall 772 that contacts a sidewall of a support panel structure 480. The support panel structure 480 contacts sidewalls of the non-horizontally-extending portions of the first electrically conductive layers 46.

Figure 34A:
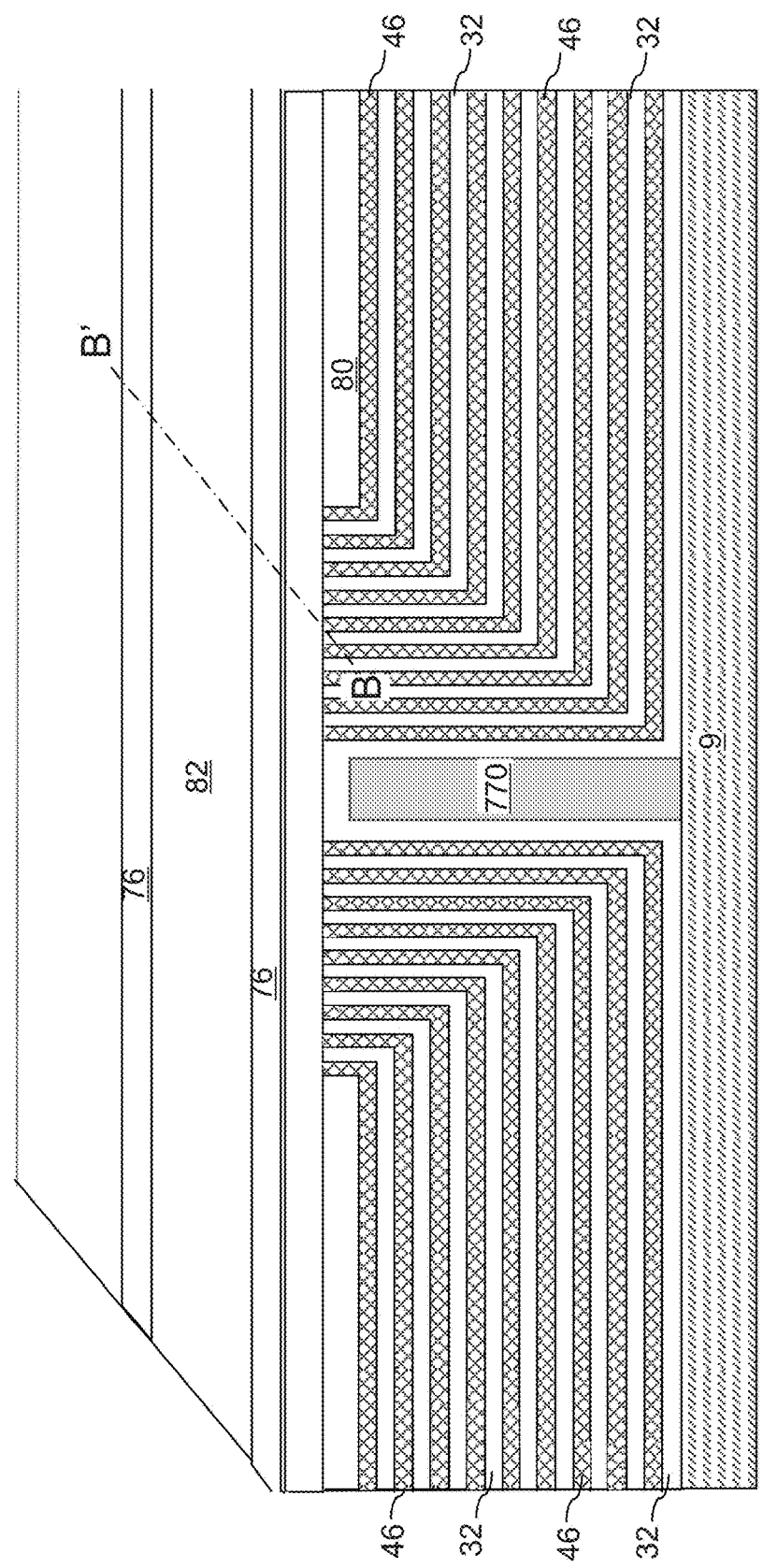
FIG. 34A is a perspective view of a cut portion of the second exemplary structure after formation of dielectric wall structures in the backside trenches according to the second embodiment of the present disclosure.
Figure 34B:
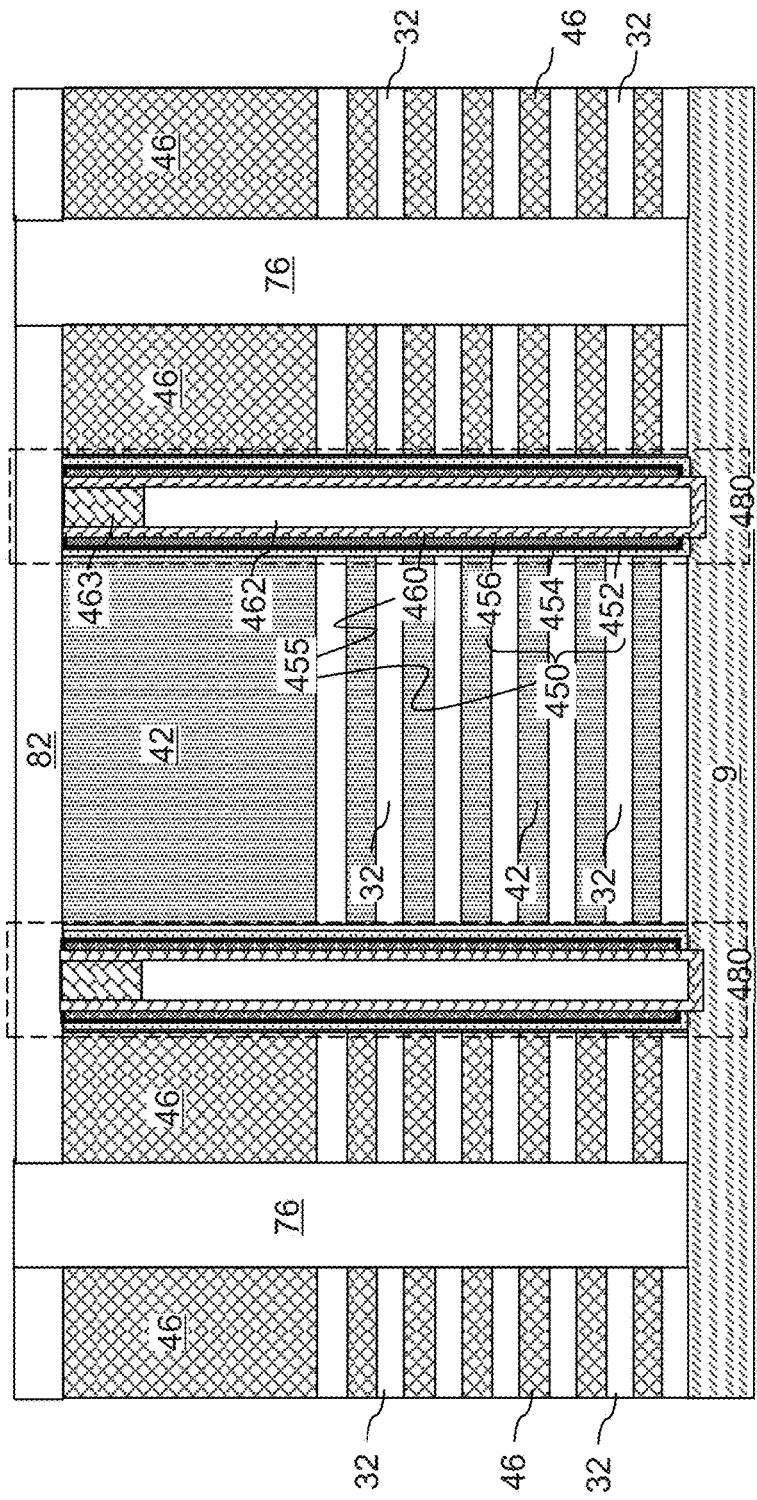
FIG. 34B is a vertical cross-sectional view of the second exemplary structure along the vertical plane B-B' of FIG. 34A.
Figure 34C:
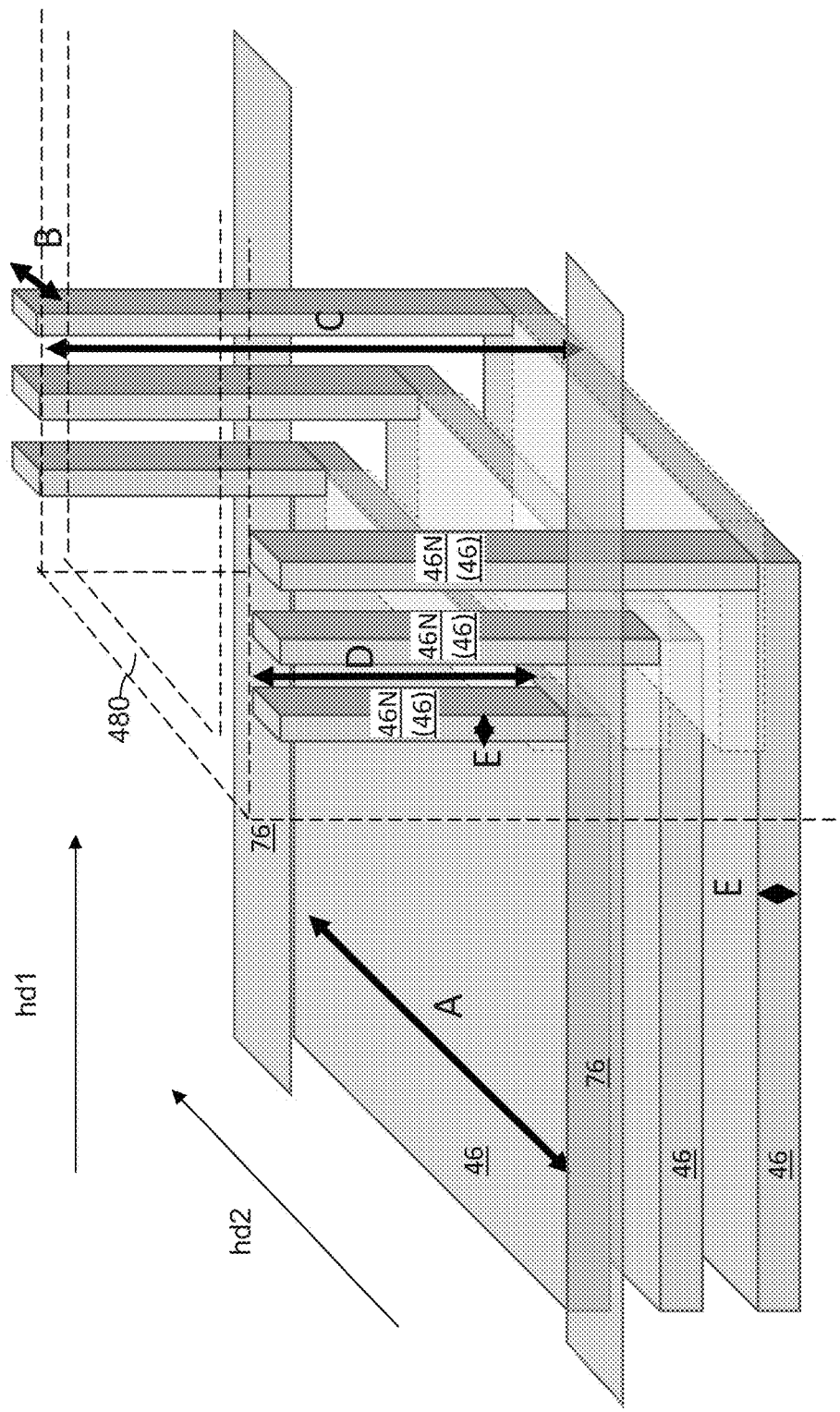
FIG. 34C is a see-through perspective view of a region of the cut portion of the second exemplary structure of FIG. 34A in which first insulating layers are omitted from view.

Referring to FIGS. 34A-34C, a dielectric material such as doped silicate glass or undoped silicate glass can be deposited in each backside trench 79 by a conformal deposition process such as chemical vapor deposition. Excess portions of the deposited dielectric material may, or may not, be removed from above the top surface of the contact level dielectric layer 82. A dielectric wall structure 76 can be formed within each backside trench 79. Each dielectric wall structure 76 can contact sidewalls of an alternating stack of first insulating layers 32 and first electrically conductive layers 46. In an alternative embodiment, a source region (not illustrated) can be formed in a surface portion of the substrate semiconductor layer 9 that underlies a backside trench 79 by ion implantation. In this case, an insulating spacer having a tubular configuration and a source contact via structure (i.e., source local interconnect) laterally surrounded by the insulating spacer can be formed in each backside trench 79 instead of the dielectric wall structure 76.

Portions of the first sacrificial material layers 42 and the first insulating layers 32 that are laterally enclosed by the support panel structures 480 are not removed through processing steps that form the backside recesses 43, the first electrically conductive layers 46, and dielectric material portions (such as the dielectric wall structures 76 or the insulating spacers that laterally surround a respective source contact via structure) filling the backside trenches 79.

Each first electrically conductive layer 46 can include a horizontally-extending portion and a pair of non-horizontally-extending portions 46N, which may be a pair of vertically-extending portions. Non-limiting examples of various dimensions in the second exemplary structure are provided herein for illustrative purposes. The width A of each horizontally-extending portion of the first electrically conductive layers 46 along the second horizontal direction hd2 that is parallel to the interface between a first mesa structure 770 and an alternating stack (32, 46) can be the same as the lateral separation distance between a neighboring pair of backside trenches 79, and can be in a range from 1 micron to 10 microns, although lesser and greater widths A can also be employed. The second horizontal direction hd2 can be perpendicular to the first horizontal direction hd1, which is the lengthwise direction of the backside trenches 79. The width B of each non-horizontally-extending portion of the first electrically conductive layers 46 along the second horizontal direction hd2 can be in a range from 60 nm to 90 nm, although lesser and greater widths B can also be employed. The maximum height C of the non-horizontally-extending portions of the first electrically conductive layers 46 can be in a range from 2 microns to 20 microns, although lesser and greater maximum heights C can also be employed. The minimum height D of the non-horizontally-extending portions of the first electrically conductive layers 46 can be in a range from 100 nm to 1,000 nm, although lesser and greater minimum heights D can also be employed. The thickness E of each first electrically conductive layer 46 can be the same in the non-horizontally-extending portions as in the horizontally-extending portion, and can be in a range from 15 nm to 50 nm, such as from 20 nm to 35 nm, although lesser and greater thicknesses E can also be employed.

Figure 35:
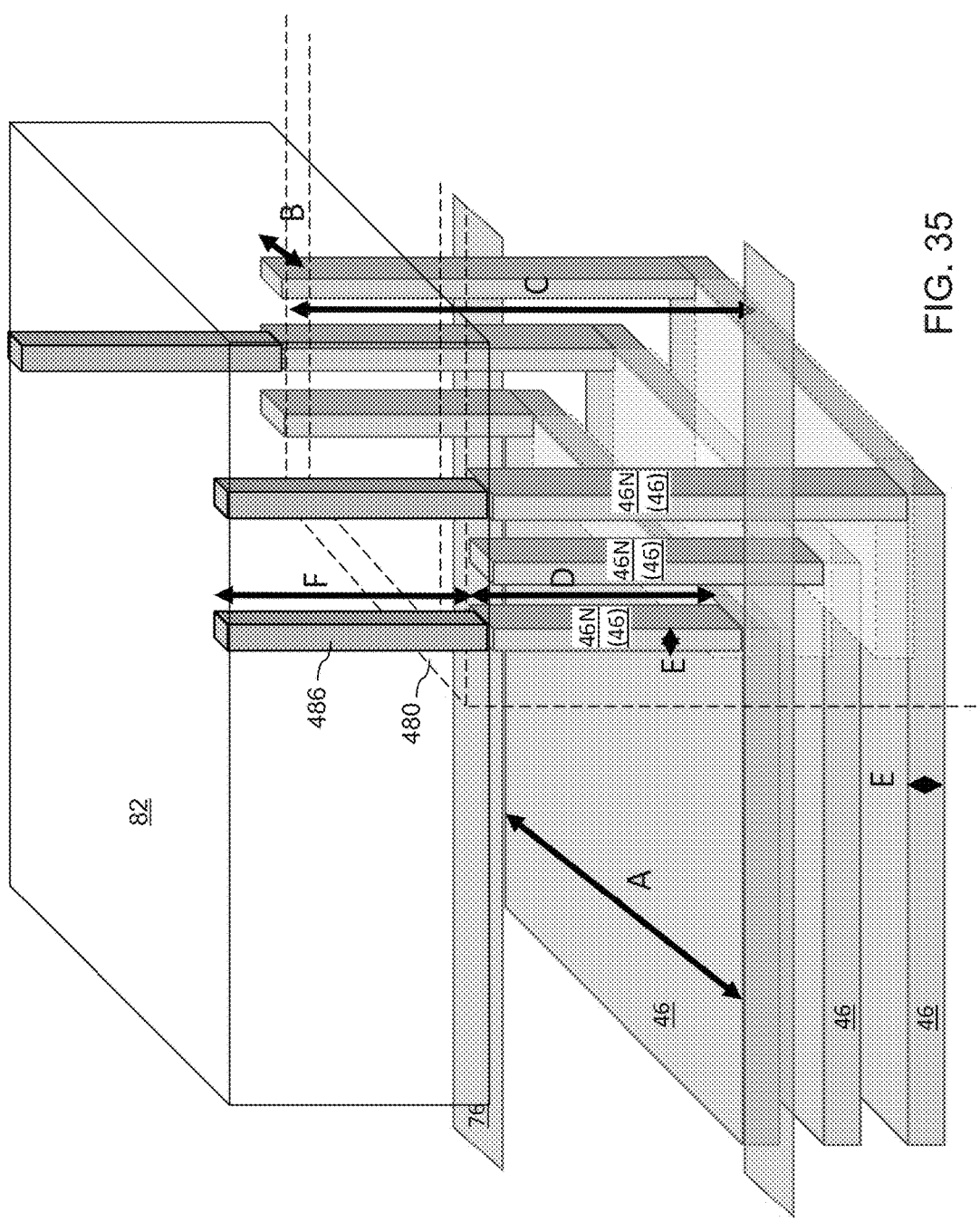
FIG. 35 is a see-through perspective view of a cut portion of the second exemplary structure after formation of contact structures through the contact level dielectric layer according to the second embodiment of the present disclosure.

Referring to FIG. 35, various electrically conductive (e.g., metal, etc.) contact structures can be formed through the contact level dielectric layer 82 directly on a respective one of the non-horizontally-extending portions 46N of the first electrically conductive layers 46. The contact structures can include contact via structures 486 having a respective generally cylindrical shape, contact pad structures having a respective disk shape, and/or metal interconnect structures, such as a metal line structures that laterally extend within the contact level dielectric layer 82. In one embodiment, the contact structures can include contact via structures 486 contacting a top surface of a respective one of the non-horizontally-extending portions 46N of the first electrically conductive layers 46. Metal contact via structures 486 can be formed if the spacer material layers 42 are formed as electrically conductive (e.g., heavily doped polysilicon) word line layers in the initial alternating stack (32, 42). If the spacer material layers 42 comprise sacrificial spacer material layers which are replaced with electrically conductive (e.g., metal) word line layers 46, then the contact via structures 486 are optional. Interconnect level dielectric layers (not illustrated) can be formed above the contact level dielectric layer 82. Additional metal interconnect structures can be formed in the interconnect level dielectric layers and on a respective one of the metal interconnect structures embedded in the contact level dielectric layer 82.

Figure 36A:
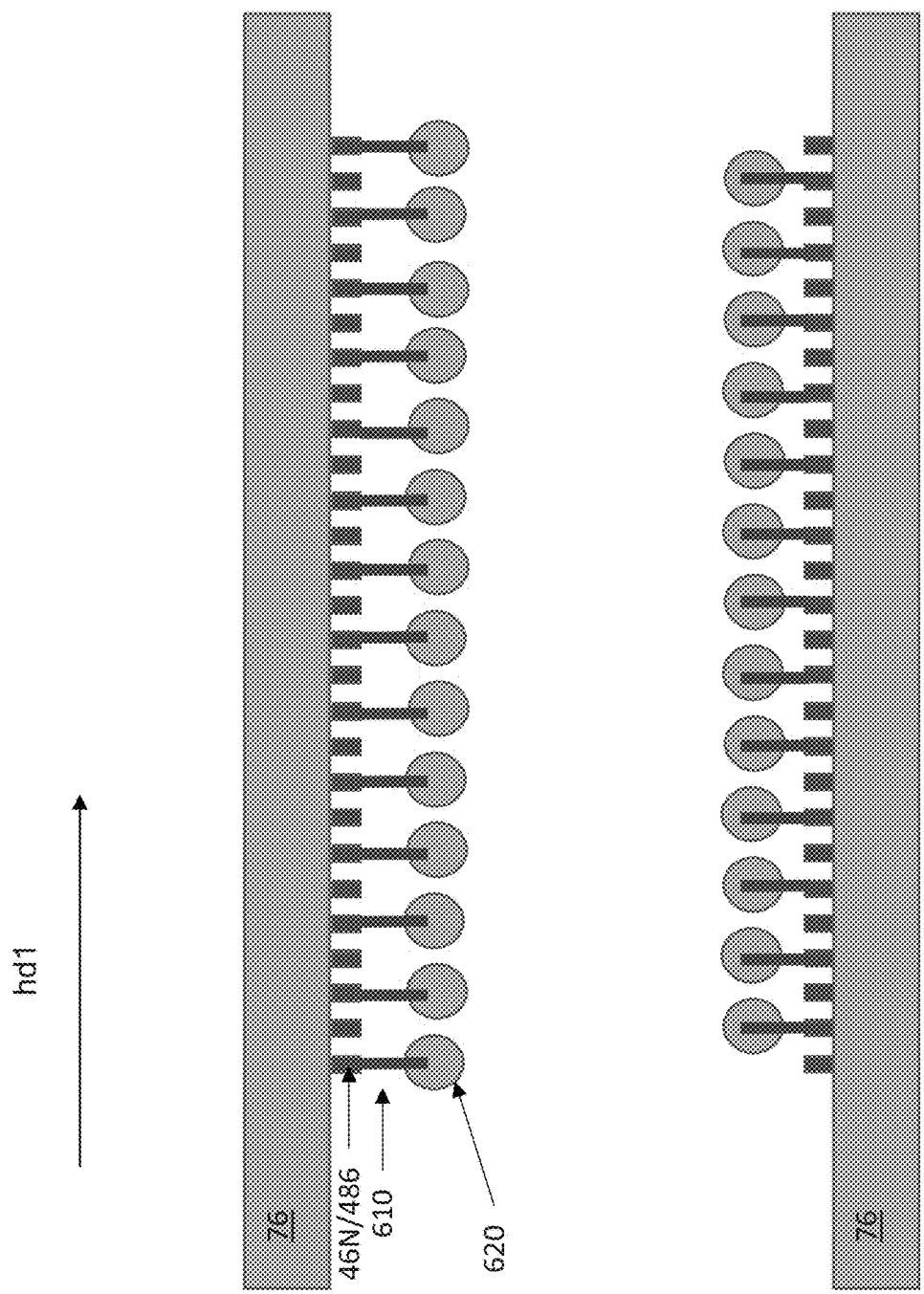
FIG. 36A is top view of a first exemplary layout of contact pad structures, metal lines, and top surfaces of non-horizontally-extending portions of the first electrically conductive layers for the second exemplary structure according to the second embodiment of the present disclosure.

Referring to FIGS. 36A and 36B, the contact structures (486, 610, 620) formed in the contact level dielectric layer 82 and the interconnect level dielectric layers can include optional contact via structures 486, metal lines 610, and contact pad structures 620 that can be employed as landing pads for additional contact via structures that can be formed thereabove. If the contact via structures 486 are employed, then such contact via structures 486 can contact a top surface of a respective one of the non-horizontally-extending portions 46N of the first electrically conductive layers 46. If the contact via structures 486 are not employed, the metal lines 610 may be embedded in the contact level dielectric layer 82, and can contact a top surface of a respective one of the non-horizontally-extending portions 46N of the first electrically conductive layers 46. The contact pad structures 620 may be formed at the level immediately above the level of the metal lines 610, at the level immediately below the level of the metal lines 610, or may be formed at the same level as the metal lines 610 as portions of integrated line and pad structures. The contact pad structures 620 may be arranged in rows that laterally extend along the first horizontal direction hd1. The number of rows of contact pad structures 620 per each row of non-horizontally-extending portions 46N of the first electrically conductive layers 46 may be optimized as needed. For example, one row of contact pad structures 620 may be provided per row of non-horizontally-extending portions 46N of the first electrically conductive layers 46 as illustrated in FIG. 36A, or two rows of contact pad structures 620 may be provided per row of non-horizontally-extending portions 46N of the first electrically conductive layers 46 as illustrated in FIG. 36B. Alternatively, three or more rows of contact pad structures 620 may be provided per row of non-horizontally-extending portions 46N of the first electrically conductive layers 46. In some embodiments, the contact (486, 610, 620) can include metal lines 610 having a respective first end portion contacting, or electrically shorted to, a top surface of a respective one of the non-horizontally-extending portions 46N of the first electrically conductive layers 46 and having a respective second end portion that contacts a respective contact pad structure 620.

Figure 37A:
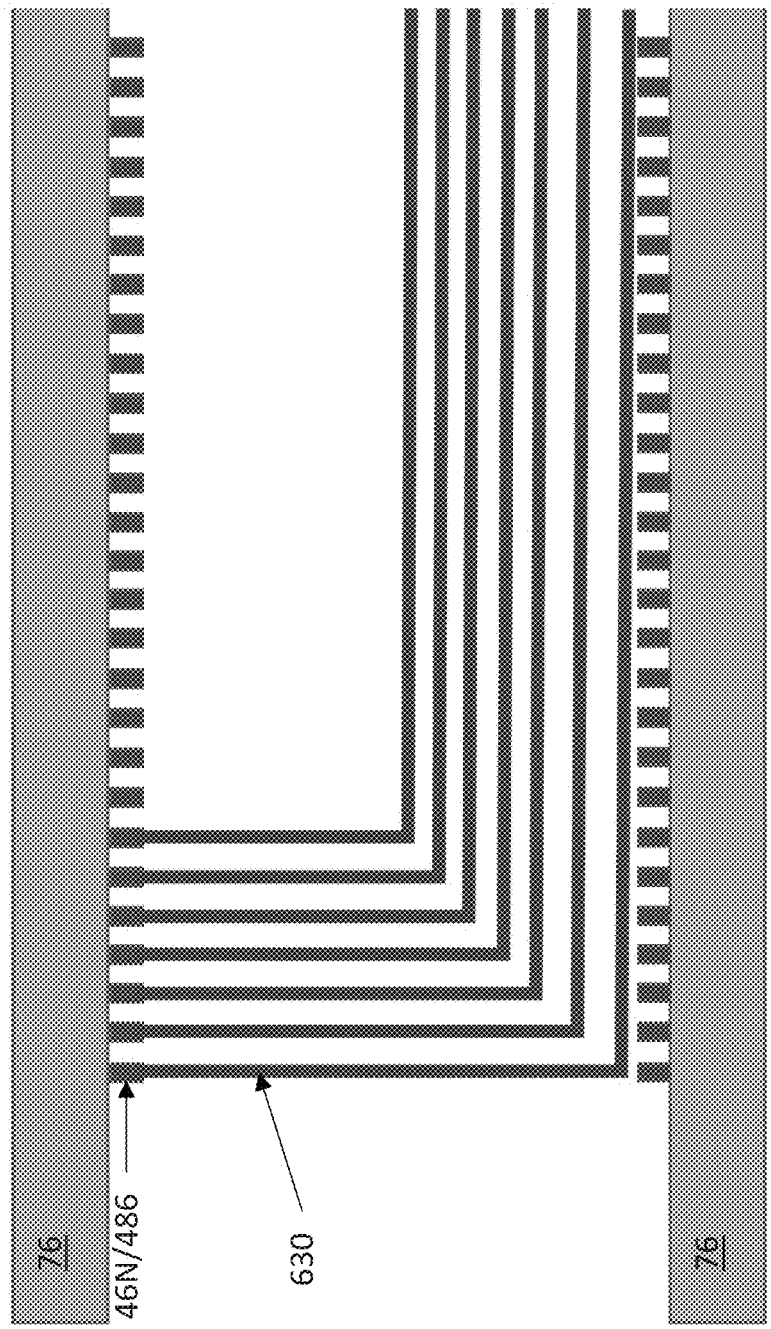
FIG. 37A is top view of a first exemplary layout of metal lines and top surfaces of non-horizontally-extending portions of the first electrically conductive layers for the second exemplary structure according to the second embodiment of the present disclosure.
Figure 37B:
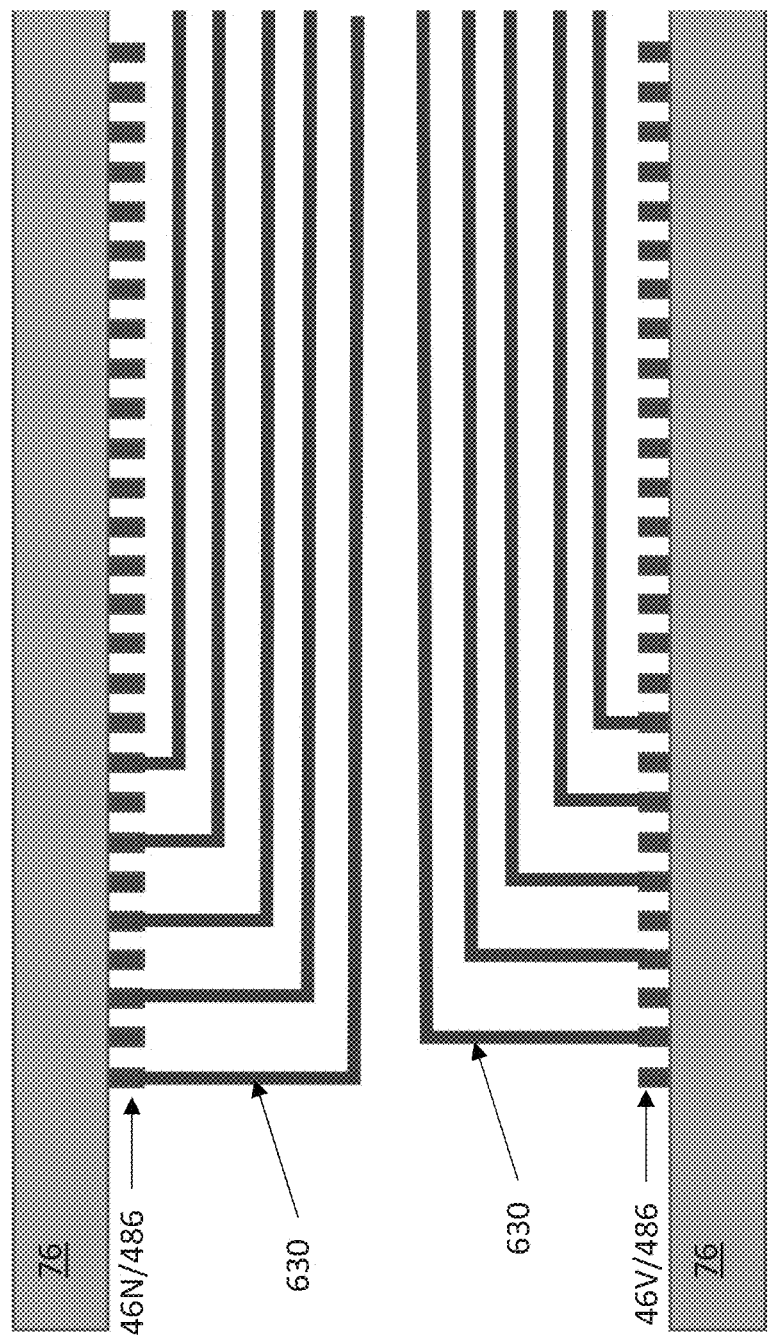
FIG. 37B is top view of a second exemplary layout of metal line, and top surfaces of non-horizontally-extending portions of the first electrically conductive layers for the second exemplary structure according to the second embodiment of the present disclosure.

Referring to FIGS. 37A and 37B, the contact structures (486, 630) formed in the contact level dielectric layer 82 and the interconnect level dielectric layers can include optional contact via structures 486 and metal lines 630 that provide a laterally-extending electrical connection to the first electrically conductive layers 46. If the contact via structures 486 are employed, such contact via structures 486 can contact a top surface of a respective one of the non-horizontally-extending portions 46N of the first electrically conductive layers 46, and the metal lines 630 can contact a top surface of a respective one of the contact via structures 486 If the contact via structures 486 are not employed, the metal lines 630 may be embedded in the contact level dielectric layer 82, and can contact a top surface of a respective one of the non-horizontally-extending portions 46N of the first electrically conductive layers 46. The metal lines 630 can be configured to provide electrical connection to each of the first electrically conductive layers 46, or to a subset of the first electrically conductive layers 46 while additional contact structures are employed to provide electrical connection to a complementary subset of the first electrically conductive layers 46. The configurations for the metal lines 630 in FIGS. 37A and 37B are merely illustrative, and may be modified as necessary in various manners.

Figure 38C:
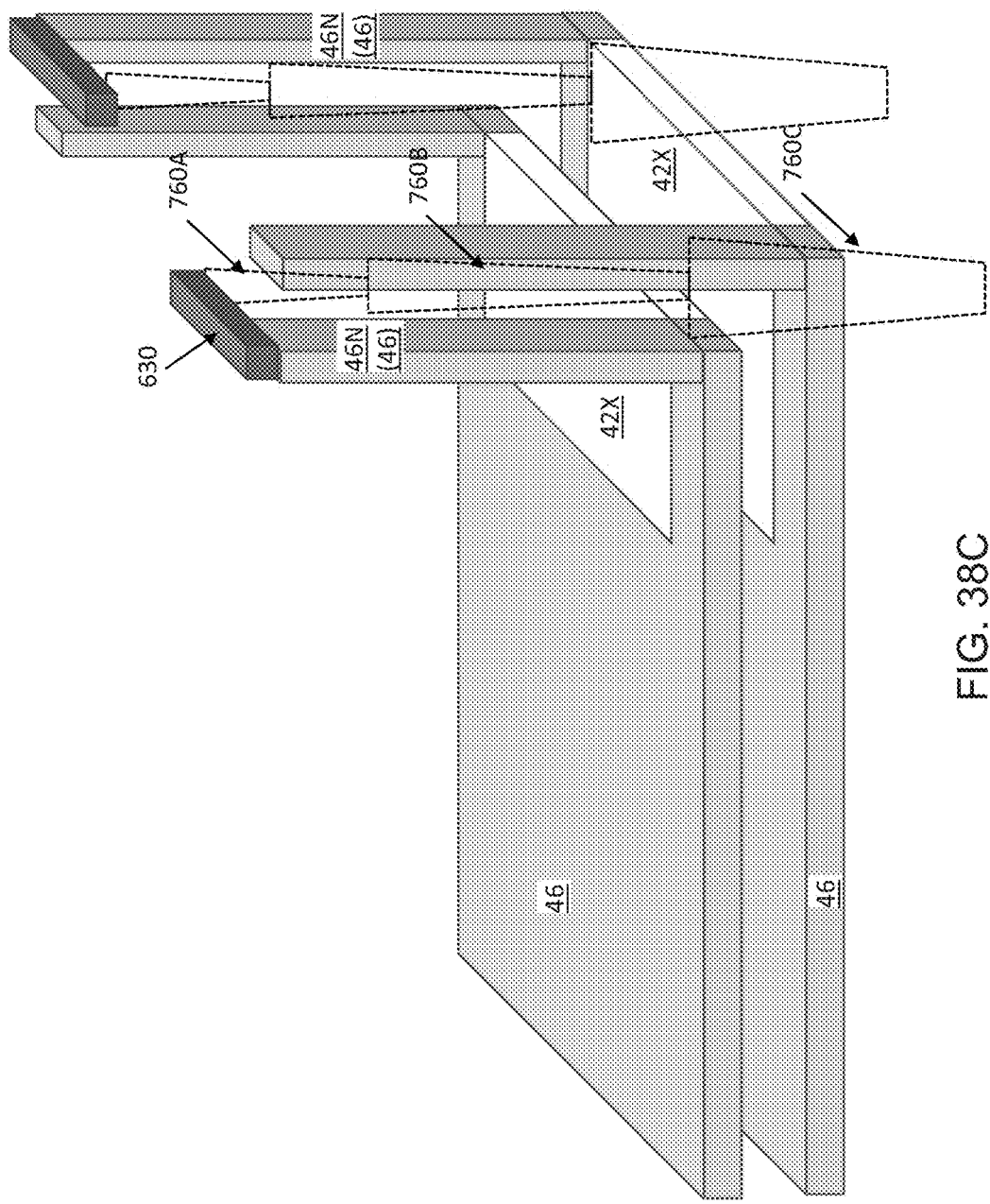
FIG. 38C is a perspective view of a third interconnect configuration of the second exemplary structure according to the second embodiment of the present disclosure.

FIGS. 38A-38C illustrate various configurations for contact structures that can be employed for the second exemplary structure. Non-replacing horizontal portions 42X of the first sacrificial material layers 42, i.e., horizontal portions of the first sacrificial material layers 42 that are not subsequently replaced with the first electrically conductive layers 46 are illustrated in FIGS. 38A-38C. Peripheral regions of the non-replacing horizontal portions 42X of the first sacrificial material layers 42 are replaced with the support panel structures 480, and center regions of the non-replacing horizontal portions 42X of the first sacrificial material layers 42 remain within a respective one of the support panel structures 480 without any change in composition, i.e., within remaining portions of the alternating sequence (32", 42").

Referring to FIG. 38A, metal lines 710 may be embedded at the level of a topmost first sacrificial material layer 42 or at the level of a topmost insulating layer, for example, by replacing portions of the topmost first sacrificial material layer 42 or the topmost first insulating layer 32 with metal portions. In some embodiments, the metal lines 710 formed by such a replacement scheme may be provided within areas enclosed by the support panel structures 480.

Referring to FIG. 38B, metal lines 710 may be formed by replacement of upper segments of the support panel structures 480 with metal portions, and optionally by additional replacement of portions of the topmost first sacrificial material layer 42 or the topmost first insulating layer 32 with additional metal portions. Contact pad structures 740 may be formed above, below, or at the same level as, the metal lines 710. In this case, the contact structures (710, 740) can include metal lines 710 having a respective first end portion contacting, and electrically shorted to, a top surface of a respective one of the non-horizontally-extending portions 46N of the first electrically conductive layers 46 and having a respective second end portion that contacts a respective contact pad structure 740. The contact pad structures 740 can be employed as landing pad structures for additional contact via structures (not shown) to be employed as additional contact structures that provide electrical connection to the first electrically conductive layers 46.

Referring to FIG. 38C, the contact structures (630, 760A, 760B, 760C) can include metal lines 630 that contact, or are electrically connected to, the non-horizontally-extending portions 46N of the first electrically conductive layers 46, and contact via structures (760A, 760B, 760C) that vertically protrude downward from the metal lines 630. The contact via structures (760A, 760B, 760C) may vertically extend through a respective remaining portion of the alternating stack (32", 42") of the first conformal insulating layers 32" and the first conformal sacrificial material layers 42" (i.e., 42X) that is laterally enclosed by a support panel structure 480. Each remaining portion of the alternating stack (32", 42") of the first conformal insulating layers 32" and the first conformal sacrificial material layers 42" within a support panel structure 480 can form an alternating stack of first insulating layers 32 and first dielectric material layers (that are the remaining portions of the first conformal sacrificial material layers 42" in case the first conformal sacrificial material layers 42" include a dielectric material). The contact via structures (760A, 760B, 760C) can be formed as vertical stacks of contact via structures (760A, 760B, 760C). For example, the contact via structures (760A, 760B, 760C) can include vertical stacks of a bottom contact via structure 760C, a middle contact via structure 760B, and a top contact via structure 760A which extend to the word line driver circuits on the underlying substrate 9.

Referring to FIG. 39, a configuration of the second exemplary structure is illustrated, which can be derived from the second exemplary structure of FIG. 27 by forming a second mesa structure 2770 above each first mesa structure 770, and by forming an alternating sequence of second conformal insulating layers 2032" and second conformal sacrificial material layers 2042". The first mesa structure 770 and the alternating stack (32, 42) of first insulating layers 32 and first sacrificial material layers 42 as provided at the processing steps of FIG. 27 constitutes a first-tier structure 1000, and the set of all elements formed above the first-tier structure 1000 constitutes a second-tier structure 2000.

The second mesa structure 2770 can include any material that can be employed for the first mesa structures 770, and can be formed employing a same processing method. The second conformal insulating layers 2032" can have the same composition as, and can have the same thickness range as, the first conformal insulating layers 32", and can be formed by any of the methods that can be employed to form the first conformal insulating layers 32". The second conformal sacrificial material layers 2042" can have the same composition as, and can have the same thickness range as, the first conformal sacrificial material layers 42", and can be formed by any of the methods that can be employed to form the first conformal sacrificial material layers 42".

Each second mesa structure 2770 can be formed over, and may optionally contact top surfaces of, a respective first mesa structure 770, at least one support panel structure 480, and non-horizontally-extending portions of the first sacrificial material layers 42. Each second mesa structure 2770 can have a greater lateral dimension than the underlying first mesa structure 770 along the first horizontal direction hd1. In one embodiment, the entirety of the top surfaces of the non-horizontally-extending portions of the first sacrificial material layers 42 can contact bottom surfaces of the second mesa structures 2770.

Subsequently, a planarization process can be performed to form a planarization dielectric layer and to remove protruding portions of the alternating sequence of second conformal insulating layers 2032" and second conformal sacrificial material layers 2042" from above the second mesa structures 2770. Remaining portions of the alternating sequence of second conformal insulating layers 2032" and second conformal sacrificial material layers 2042" constitute an alternating stack of second insulating layers and second sacrificial material layers covered with a planarization dielectric layer. The second processing steps of FIGS. 28A, 28B, 29A, and 29B can be performed mutatis mutandis so that memory opening fill structures and support panel structures 480 are formed through the first alternating stack of first insulating layers 32 and first sacrificial material layers 42 and through the second alternating stack of second insulating layers and second sacrificial material layers. In this case, each memory opening fill structure can be formed through horizontally-extending portions of the first alternating stack and the second alternating stack. Each support panel structure 480 can be formed through a first mesa structure 770, a second mesa structure, and non-horizontally-extending portions and horizontally-extending portions of each layer within the first alternating stack and the second alternating stack.

Figure 40:
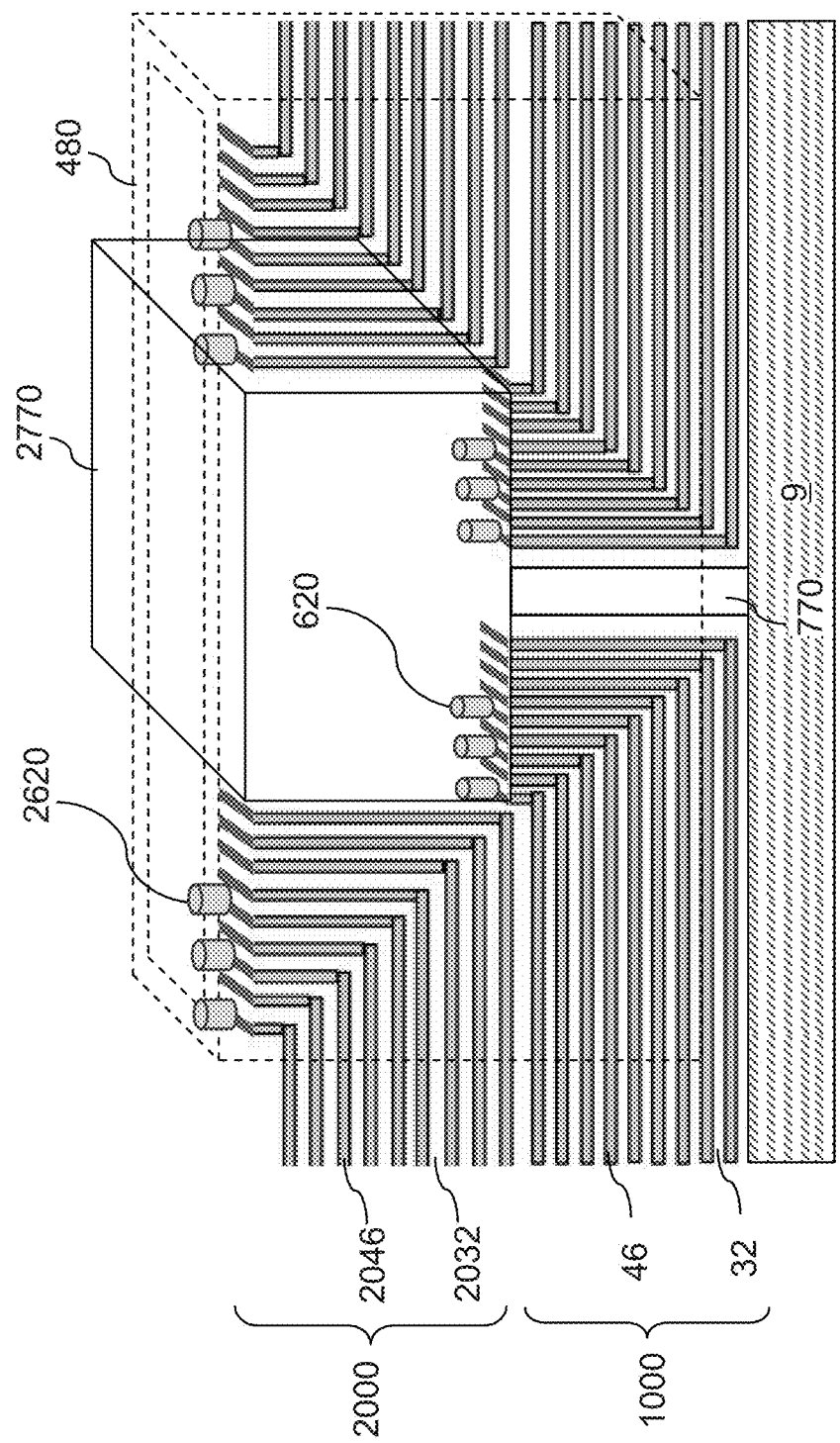
FIG. 40 is a perspective view of a cut portion of the second exemplary structure after formation of electrically conductive layers and contact structures according to the second embodiment of the present disclosure.

Referring to FIG. 40, a contact level dielectric layer (not expressly shown) can be formed by performing the processing steps of FIG. 30. Backside trenches (not expressly shown) can be formed through each layer in the first alternating stack and the second alternating stack and through the first and second mesa structures (770, 2770). The first sacrificial material layers 42 and the second sacrificial material layers are replaced with first electrically conductive layers 46 and second electrically conductive layers 2046, respectively, by performing the processing steps of FIGS. 32A, 32B, 33A, and 33B. Dielectric wall structures 76 or insulating spacer having a tubular configuration and a source contact via structure (not expressly shown) can be formed in the backside trenches by performing the processing steps of FIGS. 34A and 34B.

Thus, a second alternating stack of second insulating layers 2032 and second electrically conductive layers 2046 can be formed over horizontally-extending portions of the first insulating layers 32 (which are first remaining portions of the first conformal insulating layers 32") and horizontally-extending portions of the first electrically conductive layers 46. Each of the second insulating layers 2032 and the second electrically conductive layers 2046 includes a respective horizontally-extending portion and a respective non-horizontally-extending portion. The second alternating stack (2032, 2046) can be formed on a sidewall of a second mesa structure 2770, and the first alternating stack (32, 46) can be formed on a sidewall of a first mesa structure 770.

Any of the contact structures described above can be employed to provide electrical connection to top surfaces of the non-horizontally-extending portions of the first electrically conductive layers 46 and second electrically conductive layers 2046. In an illustrative example, contact structures such as contact pad structures 620 may be formed on top surfaces of non-horizontally-extending portions of the first electrically conductive layers 46, and additional contact structures 2620 such as additional contact pad structures, metal lines and/or contact via structures may be formed on top surfaces of non-horizontally-extending portions of the second electrically conductive layers 2046.

Figure 41:
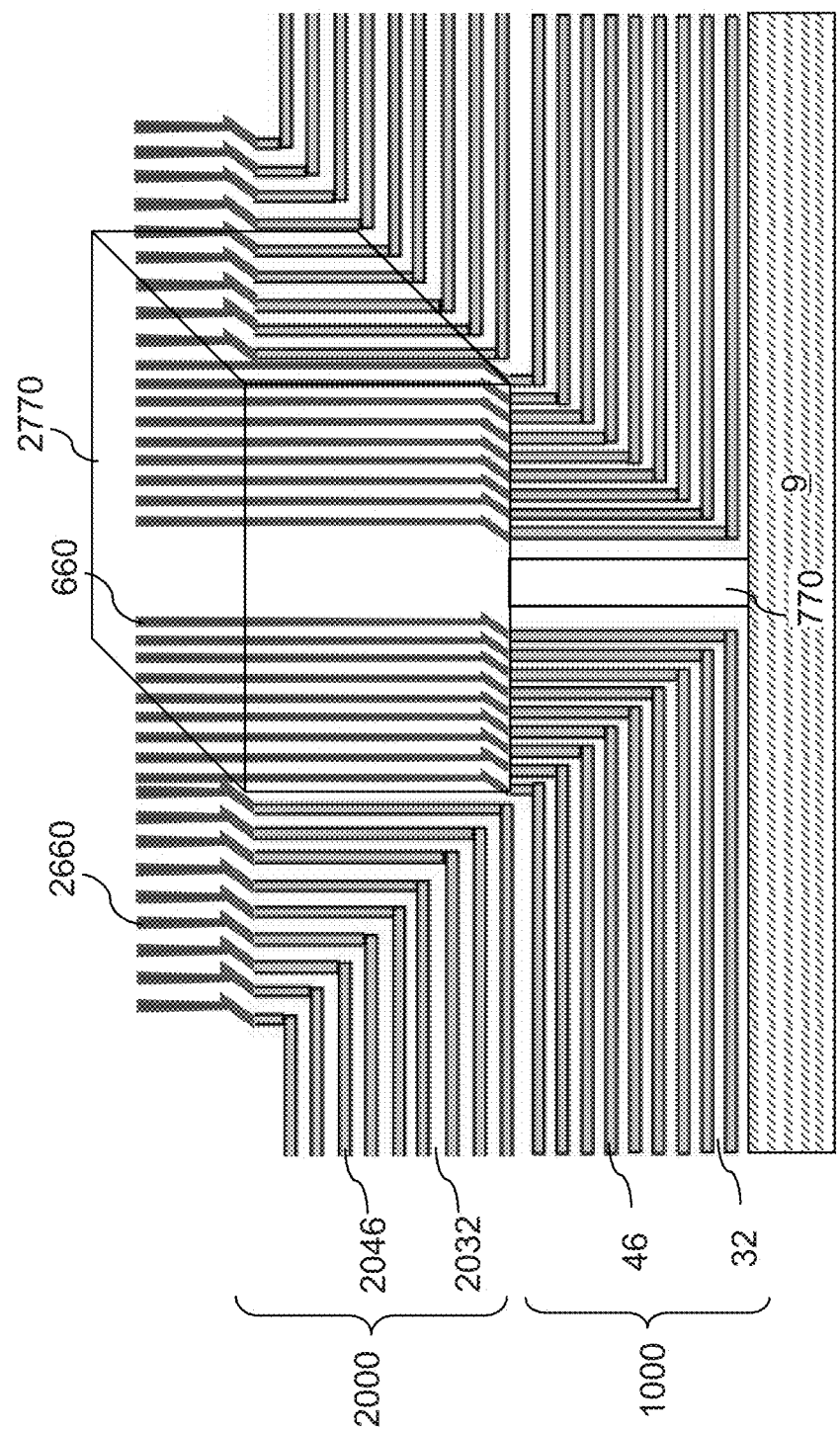
FIG. 41 is a perspective view of a cut portion of an alternative embodiment of the second exemplary structure after formation of electrically conductive layers and contact structures according to the second embodiment of the present disclosure.

Referring to FIG. 41, the contact structures that provide electrical connection to the first electrically conductive layers 46 can vertically extend through a respective second mesa structure 2770, which may consist of at least one dielectric material. In one embodiment, the contact structures that extend through the second mesa structures 2770 can include first contact via structures 660, which may directly contact a respective top surface of a non-horizontally-extending portion of a first electrically conductive layer 46, or can be electrically shorted to a non-horizontally-extending portion of a first electrically conductive layer 46 through at least one intervening contact structure such as a contact pad structure 620 illustrated in FIG. 40. Additional contact structures that provide electrical connection to the second electrically conductive layers 2046 can include second contact via structures 2660, which may directly contact a respective top surface of a non-horizontally-extending portion of a second electrically conductive layer 46, or can be electrically shorted to a non-horizontally-extending portion of a second electrically conductive layer 46 through at least one intervening contact structure 2620 such as an additional contact pad structure illustrated in FIG. 40.

Figure 42:
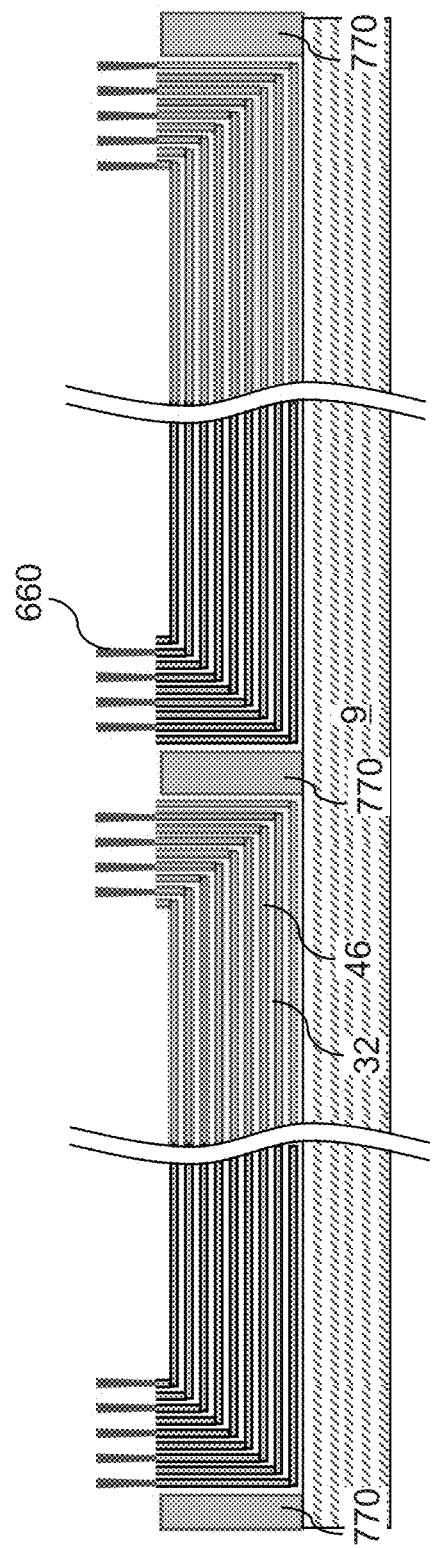
FIG. 42 is a vertical cross-sectional view of the second exemplary structure according to the second embodiment of the present disclosure.

The second exemplary structure can include multiple first mesa structures 770, and optionally, multiple second mesa structures 2770. One such configuration is illustrated in FIG. 42, which illustrates multiple first alternating stacks of first insulating layers 32 and first electrically conductive layers 46. It is understood that the various additional and/or optional elements for the second exemplary structure that are described above are omitted in FIG. 42 for clarity.

Referring to all drawings of the present disclosure, the various embodiments of the second exemplary structure can include a three-dimensional memory device. The three-dimensional memory device can comprise a first alternating stack (32, 46) of first insulating layers 32 and first electrically conductive layers 46 located over a top surface of a substrate 9, wherein each of the first insulating layers 32 and the first electrically conductive layers 46 includes a respective horizontally-extending portion and a respective non-horizontally-extending portion. The device can also comprise memory stack structures 55 (located within a respective memory opening fill structure 58) extending through a memory array region (i.e., the region that includes an array of the memory stack structures 55) of the first alternating stack (32, 46) that includes the horizontally-extending portions of the first electrically conductive layers 46, wherein each of the memory stack structures 55 comprises a memory film 50 and a vertical semiconductor channel 60. The device can also comprise a mesa structure (270 or 770) located over the substrate 9, wherein each respective non-horizontally-extending portion of the first insulating layers 32 and the first electrically conductive layers 46 is located over a sidewall of the mesa structure (270, 770) and contact structures (86, 486, 610, 620, 630, 660, 710 and/or 740), that contact a respective one of the non-horizontally-extending portions 46N of the first electrically conductive layers 46.

In one embodiment, the device also contains a support structure (370, 380 and/or 480) extending through the first alternating stack (32, 46). In one embodiment, the mesa structure 770 comprises a dielectric sidewall 771 that contacts a sidewall of a non-horizontally-extending portion of a most proximal one of the first insulating layers 32 and the support structure (370, 380 and/or 480) comprises a support panel structure 480 comprising a first sidewall that contacts a second dielectric sidewall 772 of the mesa structure 770 and sidewalls of the non-horizontally-extending portions of the first electrically conductive layers 46.

In one embodiment, each of the non-horizontally-extending portions of the first electrically conductive layers 46 can have a topmost surface within a horizontal plane including a top surface of the support panel structure 480.

In one embodiment, the support panel structure 480 can contact the substrate 9, and the support panel structure 480 can include an opening therethrough. In one embodiment, the support panel structure 480 comprises a first material layer 450 having a same composition as the memory films 50 and a second material layer 460 having a same composition as the vertical semiconductor channels 60 and laterally surrounded by the first material layer 450.

In one embodiment, the support panel structure 480 can be located within a moat trench 469 having inner sidewalls and outer sidewalls, the outer sidewalls of the support panel structure 480 can comprise the first sidewall (that contacts a second dielectric sidewall 772 of the mesa structure 770), and the moat trench 469 can laterally surround a dielectric layer stack (which can be a stack of additional first insulating layers 32 and first dielectric material layers that are remaining portions 42X of the first sacrificial material layers 42).

In one embodiment, the dielectric layer stack comprises an additional alternating stack of additional insulating layers 32 (i.e., the additional first insulating layers 32) and spacer material layers 42 (i.e., the remaining portions of the first sacrificial material layers 42), and each of the additional insulating layers and the spacer material layers can include a respective horizontally-extending portion and a respective non-horizontally-extending portion.

In one embodiment, the additional insulating layers 32 have a same material composition as the first insulating layers 32, and each of the additional insulating layers 32 has a same thickness as a respective one of the first insulating layers 32 located at a vertical distance from the substrate 9.

In one embodiment, the spacer material layers 42 can have a different composition from the additional insulating layers 32, and topmost surfaces of non-horizontally-extending portions of the additional insulating layers 32 can be located within a same horizontal plane as topmost surfaces on non-horizontally-extending portions of the first insulating layers 32 and the first electrically conductive layers 46.

In one embodiment, the outer sidewalls of the support panel structure 480 comprise a second sidewall that is adjoined to the first sidewall and contacts each of the horizontally-extending portions of the first insulating layers 32 and the first electrically conductive layers 42. The second sidewall can laterally extend along the second horizontal direction hd2.

In one embodiment, each non-horizontally-extending portion of the first insulating layers 32 and the first electrically conductive layers 46 can have a respective pair of sidewalls that are parallel to the first dielectric sidewall 771 of the mesa structure 770, which can be parallel to the first horizontal direction hd1 and may, or may not, be vertical, substantially vertical, or tapered.

In one embodiment, contact structures can contact a top surface of a respective one of the non-horizontally-extending portions of the first electrically conductive layers 46. In one embodiment, the contact structures comprise metal line structures (610, 710) having a respective first end portion contacting, or electrically shorted to, a top surface of a respective one of the non-horizontally-extending portions 46N of the first electrically conductive layers 46 and having a respective second end portion that contacts a respective contact pad structure (620, 740).

In one embodiment, the three-dimensional memory device can further comprise a second alternating stack (2032, 2046) of second insulating layers 2032 and second electrically conductive layers 2046 located over the horizontally-extending portions of the first insulating layers 32 and the first electrically conductive layers 46 of the first alternating stack (32, 46). Each of the second insulating layers 2032 and the second electrically conductive layers 2046 can include a respective horizontally-extending portion and a respective non-horizontally-extending portion. Additional contact structures can contact a respective one of the non-horizontally-extending portions of the second electrically conductive layers 2046.

In one embodiment, the three-dimensional memory device can further include an additional mesa structure 2770 located over the mesa structure 770, the support panel structure 480, and the non-horizontally-extending portions 46N of the first electrically conductive layers 46. The contact structures 660 extend through the additional mesa structure 2770, and the additional mesa structure 2770 has a greater lateral dimension than the mesa structure 770 along a first horizontal direction hd1.

In one embodiment, the three-dimensional memory structure comprises a vertical NAND memory device. The first electrically conductive layers 46 (and the second electrically conductive layers 2046, if present) can comprise, or can be electrically connected to, a respective word line of the monolithic three-dimensional NAND memory device. The substrate semiconductor layer 9 can comprise a silicon substrate. The vertical NAND memory device can comprise an array of monolithic three-dimensional NAND strings over the silicon substrate. At least one memory cell (as embodied as a portion of a charge storage layer 54 at a level of a horizontally-extending portion of a first or second electrically conductive layer (46 or 2046)) in a first device level of the array of monolithic three-dimensional NAND strings can be located over another memory cell (as embodied as another portion of a charge storage layer 54 at a level of a horizontally-extending portion of another first electrically conductive layer 46) in a second device level of the array of monolithic three-dimensional NAND strings. The silicon substrate can contain an integrated circuit comprising a driver circuit for the memory device located thereon. The first electrically conductive layers 46 (and the second electrically conductive layers 2046) can comprise a plurality of control gate electrodes having a strip shape extending substantially parallel to the top surface of the substrate semiconductor layer 9, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels 60, wherein at least one end portion 60 of each of the plurality of semiconductor channels 60 extends substantially perpendicular to a top surface of the substrate semiconductor layer 9; and a plurality of charge storage elements (as embodied as portions of the charge storage layer 54 that are located at each level of the horizontally-extending portions of the first electrically conductive layers 46). Each charge storage element can be located adjacent to a respective one of the plurality of vertical semiconductor channels 60.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   a first alternating stack of first insulating layers and first electrically conductive layers located over a top surface of a substrate, wherein each of the first insulating layers and the first electrically conductive layers includes a respective horizontally-extending portion and a respective non-horizontally-extending portion;
   memory stack structures extending through a memory array region of the first alternating stack that includes the horizontally-extending portions of the first electrically conductive layers, wherein each of the memory stack structures comprises a memory film and a vertical semiconductor channel;
   a mesa structure located over the substrate, wherein each respective non-horizontally-extending portion of the first insulating layers and the first electrically conductive layers is located over a sidewall of the mesa structure;
   contact structures that contact a respective one of the non-horizontally-extending portions of the first electrically conductive layers;
   a support structure extending through the first alternating stack; and
   metal line structures having a respective first end portion that electrically contacts a respective contact structure and a respective second end portion that electrically contacts a respective contact pad structure;
   wherein:
   the mesa structure comprises a dielectric sidewall that contacts a sidewall of a non-horizontally-extending portion of a most proximal one of the first insulating layers;
   the support structure comprises a support panel structure comprising a first sidewall that contacts a second dielectric sidewall of the mesa structure and sidewalls of the non-horizontally-extending portions of the first electrically conductive layers; and
   each non-horizontally-extending portion of the first insulating layers and the first electrically conductive layers has a respective pair of sidewalls that are parallel to the first dielectric sidewall of the mesa structure.

2. The three-dimensional memory device of claim 1, wherein:
   each of the non-horizontally-extending portions of the first electrically conductive layers has a topmost surface within a horizontal plane including a top surface of the support panel structure;
   the support panel structure contacts the substrate; and
   the support panel structure includes an opening therethrough.

3. The three-dimensional memory device of claim 2, wherein the support panel structure comprises a first material layer having a same composition as the memory films and a second material layer having a same composition as the vertical semiconductor channels, and wherein the second material layer is laterally surrounded by the first material layer.

4. The three-dimensional memory device of claim 2, wherein:
   the support panel structure is located within a moat trench having inner sidewalls and outer sidewalls;
   the outer sidewalls of the support panel structure comprise the first sidewall; and
   the moat trench laterally surrounds a dielectric layer stack.

5. The three-dimensional memory device of claim 4, wherein:
   the dielectric layer stack comprises an additional alternating stack of additional insulating layers and spacer material layers;
   each of the additional insulating layers and the spacer material layers includes a respective horizontally-extending portion and a respective non-horizontally-extending portion;
   the additional insulating layers have a same material composition as the first insulating layers; and each of the additional insulating layers has a same thickness as a respective one of the first insulating layers located at a vertical distance from the substrate.

6. The three-dimensional memory device of claim 5, wherein:
the spacer material layers have a different composition from the additional insulating layers; and
topmost surfaces of non-horizontally-extending portions of the additional insulating layers are located within a same horizontal plane as topmost surfaces on non-horizontally-extending portions of the first insulating layers and the first electrically conductive layers.

7. The three-dimensional memory device of claim 4, wherein the outer sidewalls of the support panel structure comprise a second sidewall that is adjoined to the first sidewall and contacts each of the horizontally-extending portions of the first insulating layers and the first electrically conductive layers.

8. The three-dimensional memory device of claim 1, further comprising:
a second alternating stack of second insulating layers and second electrically conductive layers located over the horizontally-extending portions of the first insulating layers and the first electrically conductive layers of the first alternating stack, wherein each of the second insulating layers and the second electrically conductive layers includes a respective horizontally-extending portion and a respective non-horizontally-extending portion;
additional contact structures that electrically contact a respective one of the non-horizontally-extending portions of the second electrically conductive layers; and
an additional mesa structure located over the mesa structure, the support panel structure, and the non-horizontally-extending portions of the first electrically conductive layers, wherein the contact structures extend through the additional mesa structure, and the additional mesa structure has a greater lateral dimension than the mesa structure.

9. A method of forming a three-dimensional memory device, comprising:
forming a mesa structure over a substrate;
forming a first alternating stack of first insulating layers and first sacrificial material layers over a top surface of a substrate and over the mesa structure employing a series of conformal deposition processes;
removing portions of the first insulating layers and the first sacrificial material layers from above a horizontal plane located at, or above, a top surface of the mesa structure by a planarization process, wherein each remaining portion of the first insulating layers and the first sacrificial material layers includes a respective horizontally-extending portion and a respective non-horizontally-extending portion;
forming memory stack structures through a memory array region of the first alternating stack that includes the horizontally-extending portions of the first sacrificial material layers, wherein each of the memory stack structures comprises a memory film and a vertical semiconductor channel;
forming a support panel structure through the mesa structure and through the first alternating stack, wherein the support panel structure includes a first sidewall that contacts a remaining portion of the mesa structure, first remaining portions of the first insulating layers, and first remaining portions of the first sacrificial material layers that are located outside the support panel structure;
replacing the first remaining portions of the first sacrificial material layers with first electrically conductive layers, wherein the first electrically conductive layers comprise word lines for the memory stack structures;
forming contact structures on a respective one of the non-horizontally-extending portions of the first electrically conductive layers;
forming a trench extending to a top surface of the substrate through the remaining portions of the first insulating layers and the first sacrificial material layers and through the mesa structure after the planarization process;
depositing a first material layer including at least one dielectric material and additional material portions in the trench to form the support panel structure in the trench;
forming an additional mesa structure over the mesa structure, the support panel structure, and non-horizontally-extending portions of the first electrically conductive layers, wherein the contact structures extend through the additional mesa structure;
forming a second alternating stack of second insulating layers and second electrically conductive layers over horizontally-extending portions of the first remaining portions of the first insulating layers and horizontally-extending portions of the first electrically conductive layers, wherein each of the second insulating layers and the second electrically conductive layers includes a respective horizontally-extending portion and a respective non-horizontally-extending portion; and
forming additional contact structures on a respective one of the non-horizontally-extending portions of the second electrically conductive layers;
wherein:
the additional mesa structure has a greater lateral dimension than the mesa structure;
the second alternating stack is formed on a sidewall of the additional mesa structure;
the support panel structure is formed through the additional mesa structure;
the trench is a moat trench including inner sidewalls and outer sidewalls;
the outer sidewalls include surfaces of the remaining portion of the mesa structure and the remaining portions of the non-horizontally-extending portions of the first sacrificial material layers; and
the inner sidewalls include surfaces of second remaining portions of the first insulating layers and second remaining portions of the first sacrificial material layers.

10. The method of claim 9, further comprising:
forming a backside trench through the first remaining portions of the first insulating layers and the first remaining portions of the first sacrificial material layers;
introducing an isotropic etchant the removes a material of the first sacrificial material layers selective to a material of the first insulating layers into the backside trench, whereby the first remaining portions of the first sacrificial material layers are removed to form backside recesses; and
filling the backside recesses with the first electrically conductive layers.

11. The method of claim 10, wherein:
the backside trench is laterally spaced from the second remaining portions of the first insulating layers and the second remaining portions of the first sacrificial material layers by the support panel structure; and
the second remaining portions of the first sacrificial material layers are not removed through processing steps that form the backside recesses and the first electrically conductive layers.

12. The method of claim 9, wherein:
the first material layer has a same composition as the memory films;
the additional material portions comprise a second material layer having a same composition as the vertical semiconductor channel; and
the contact structures comprise metal lines having a respective first end portion contacting, or electrically shorted to, a top surface of a respective one of the non-horizontally-extending portions of the first electrically conductive layers and having a respective second end portion that contacts a respective contact pad structure.

\* \* \* \* \*